(12) United States Patent
Jang et al.

(10) Patent No.: US 8,878,293 B2
(45) Date of Patent: Nov. 4, 2014

(54) SEMICONDUCTOR DEVICE HAVING DC STRUCTURE

(71) Applicant: Samsung Electronics Co., Ltd., Suwon-si (KR)

(72) Inventors: Hyeon-Woo Jang, Incheon (KR); Won-Chul Lee, Seongnam-si (KR); Jin-Won Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/767,992

(22) Filed: Feb. 15, 2013

(65) Prior Publication Data

US 2013/0264638 A1    Oct. 10, 2013

(30) Foreign Application Priority Data

Apr. 10, 2012 (KR) .................. 10-2012-0037481

(51) Int. Cl.
*H01L 29/66* (2006.01)
*H01L 23/538* (2006.01)
*H01L 27/088* (2006.01)

(52) U.S. Cl.
CPC .......... *H01L 23/5384* (2013.01); *H01L 27/088* (2013.01)
USPC ........... 257/334; 257/288; 257/308; 438/221; 438/239; 438/253; 438/257

(58) Field of Classification Search
CPC .................. H01L 21/76805; H01L 21/76877; H01L 21/02063
See application file for complete search history.

(56) References Cited

U.S. PATENT DOCUMENTS

| | | | |
|---|---|---|---|
| 6,563,162 B2 | 5/2003 | Han et al. | |
| 6,913,987 B2 | 7/2005 | Haufe et al. | |
| 7,081,389 B2 | 7/2006 | Lee et al. | |
| 7,339,223 B2 | 3/2008 | Lee et al. | |
| 2002/0123219 A1* | 9/2002 | Laverty et al. | 438/637 |
| 2002/0190295 A1* | 12/2002 | Suzuki et al. | 257/296 |
| 2005/0003307 A1 | 1/2005 | Kuan et al. | |
| 2005/0186732 A1 | 8/2005 | Yun | |

FOREIGN PATENT DOCUMENTS

| | | |
|---|---|---|
| KR | 10-2002-0096381 A | 12/2002 |
| KR | 10-2004-0063578 A | 7/2004 |
| KR | 10-2004-0078413 A | 9/2004 |
| KR | 10-2005-0033692 A | 4/2005 |
| KR | 10-2006-0001098 A | 1/2006 |
| KR | 10-2006-0077493 A | 7/2006 |

\* cited by examiner

*Primary Examiner* — Kyoung Lee

(74) *Attorney, Agent, or Firm* — Lee & Morse, P.C.

(57) ABSTRACT

A semiconductor device includes an interlayer insulating layer on a substrate, and a direct contact (DC) structure vertically penetrating the interlayer insulating layer and contacting the substrate, the DC structure including a DC hole exposing the substrate, an insulating DC spacer on an inner wall of the DC hole, and a conductive DC plug on the DC spacer and filling the DC hole, the DC plug including a lower DC plug and an upper DC plug on the lower DC plug, the lower DC plug having a smaller horizontal width than that of the upper DC plug.

20 Claims, 64 Drawing Sheets (A)

(B)

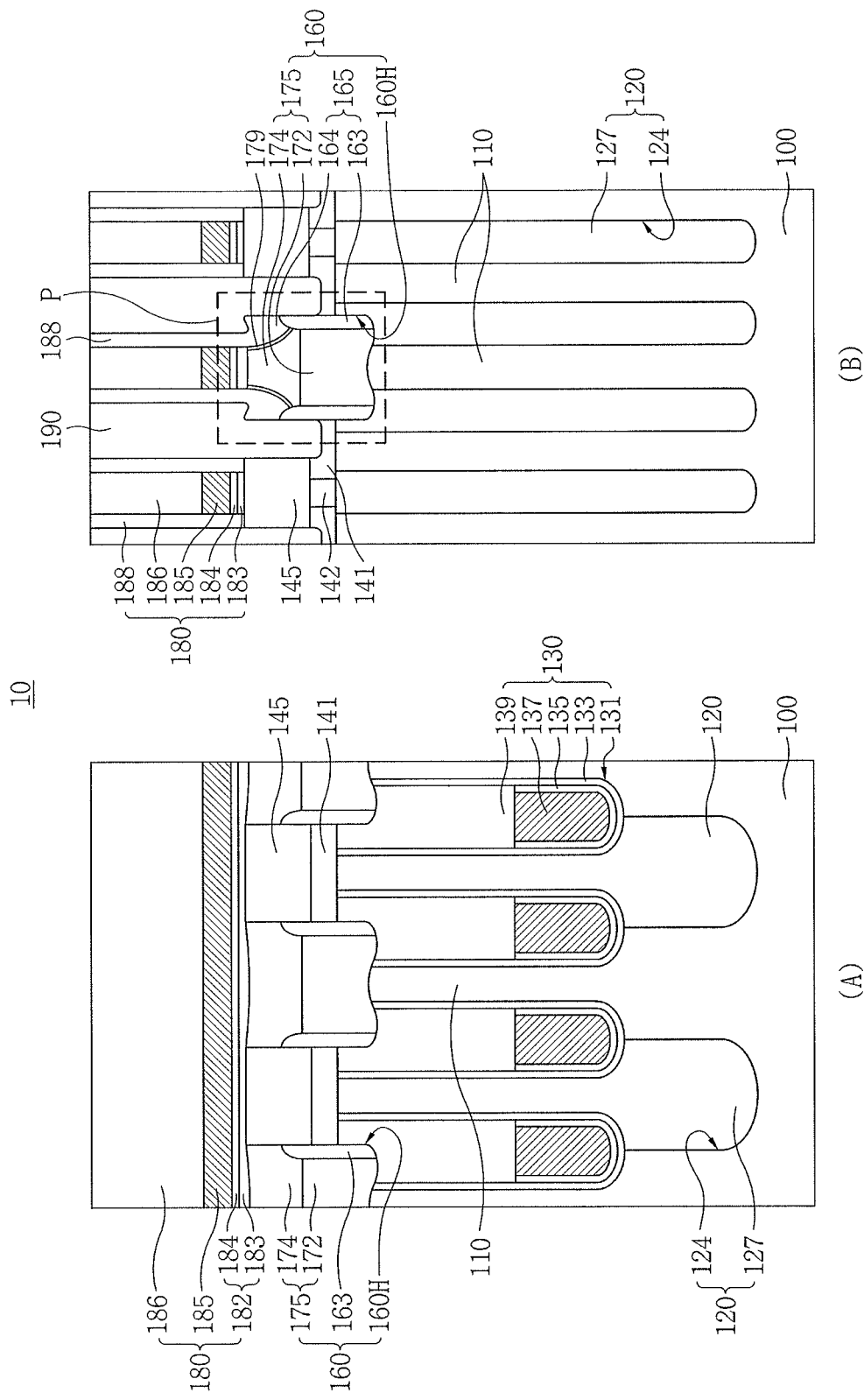

FIG. 4B

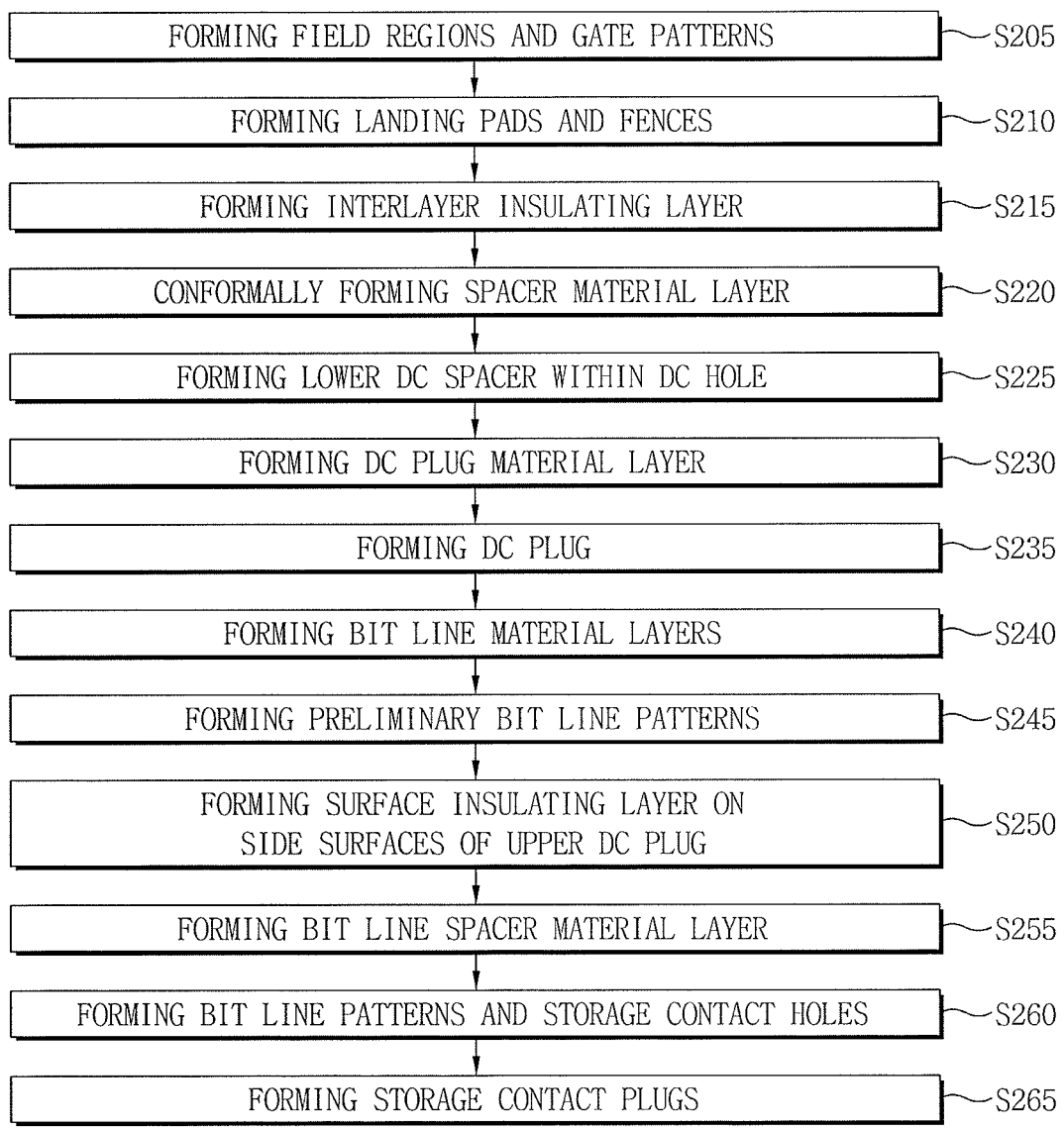

- FORMING FIELD REGIONS AND GATE PATTERNS — S205
- FORMING LANDING PADS AND FENCES — S210
- FORMING INTERLAYER INSULATING LAYER — S215
- CONFORMALLY FORMING SPACER MATERIAL LAYER — S220
- FORMING LOWER DC SPACER WITHIN DC HOLE — S225
- FORMING DC PLUG MATERIAL LAYER — S230
- FORMING DC PLUG — S235
- FORMING BIT LINE MATERIAL LAYERS — S240
- FORMING PRELIMINARY BIT LINE PATTERNS — S245
- FORMING SURFACE INSULATING LAYER ON SIDE SURFACES OF UPPER DC PLUG — S250
- FORMING BIT LINE SPACER MATERIAL LAYER — S255
- FORMING BIT LINE PATTERNS AND STORAGE CONTACT HOLES — S260
- FORMING STORAGE CONTACT PLUGS — S265

FIG. 4D

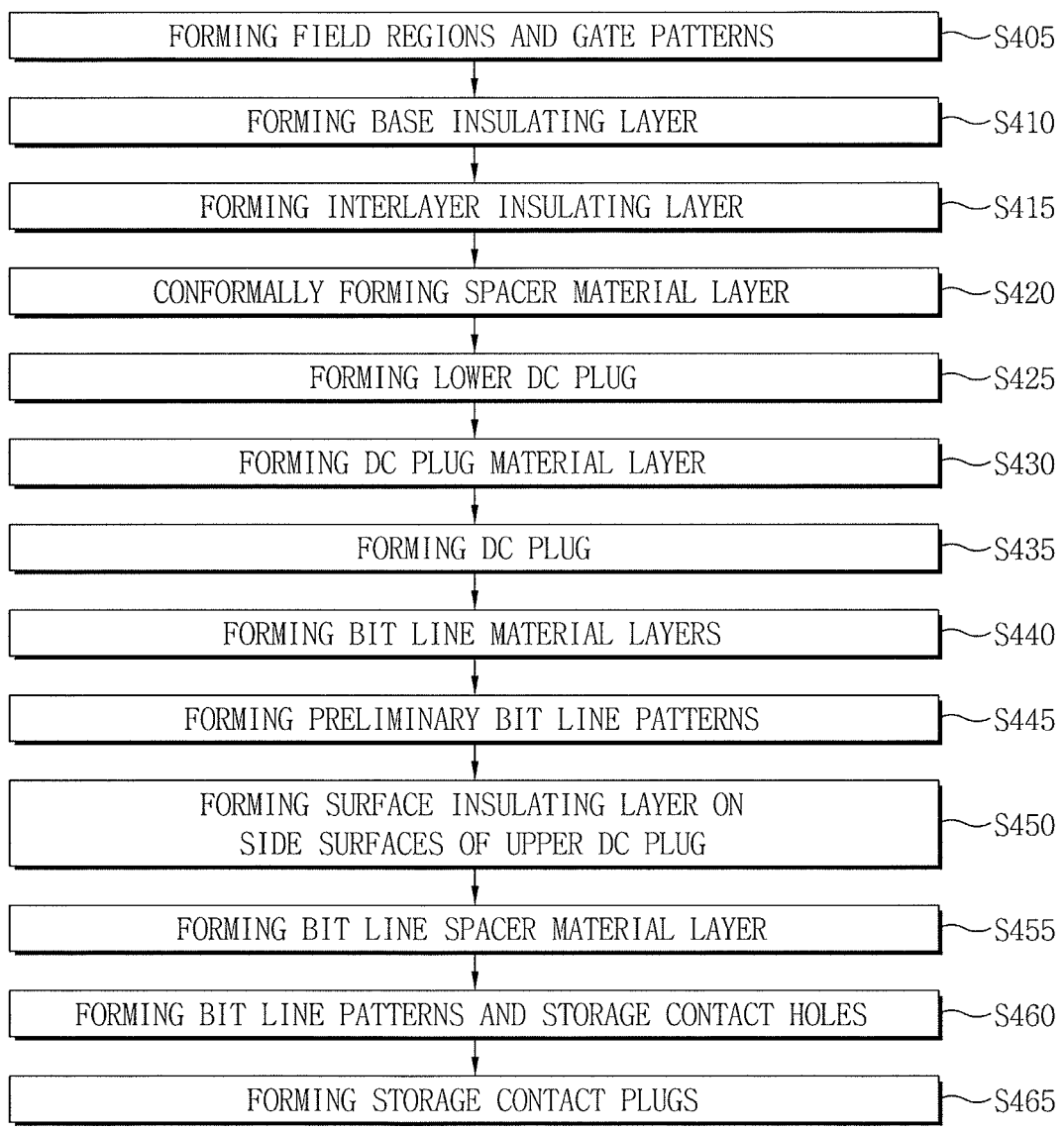

- FORMING FIELD REGIONS AND GATE PATTERNS — S405
- FORMING BASE INSULATING LAYER — S410
- FORMING INTERLAYER INSULATING LAYER — S415
- CONFORMALLY FORMING SPACER MATERIAL LAYER — S420
- FORMING LOWER DC PLUG — S425
- FORMING DC PLUG MATERIAL LAYER — S430
- FORMING DC PLUG — S435
- FORMING BIT LINE MATERIAL LAYERS — S440
- FORMING PRELIMINARY BIT LINE PATTERNS — S445
- FORMING SURFACE INSULATING LAYER ON SIDE SURFACES OF UPPER DC PLUG — S450
- FORMING BIT LINE SPACER MATERIAL LAYER — S455
- FORMING BIT LINE PATTERNS AND STORAGE CONTACT HOLES — S460
- FORMING STORAGE CONTACT PLUGS — S465

FIG. 4F

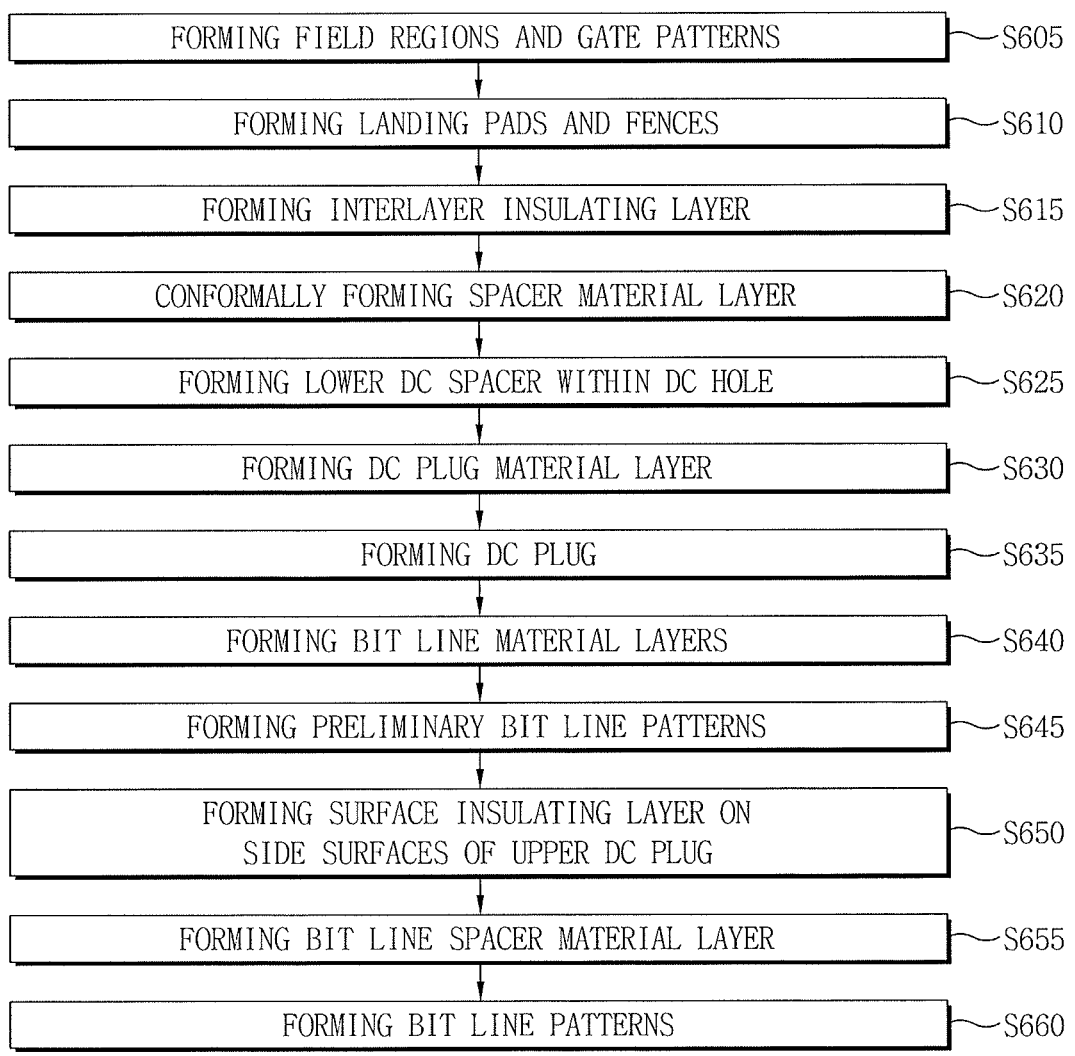

- FORMING FIELD REGIONS AND GATE PATTERNS — S605
- FORMING LANDING PADS AND FENCES — S610
- FORMING INTERLAYER INSULATING LAYER — S615
- CONFORMALLY FORMING SPACER MATERIAL LAYER — S620
- FORMING LOWER DC SPACER WITHIN DC HOLE — S625
- FORMING DC PLUG MATERIAL LAYER — S630
- FORMING DC PLUG — S635
- FORMING BIT LINE MATERIAL LAYERS — S640
- FORMING PRELIMINARY BIT LINE PATTERNS — S645
- FORMING SURFACE INSULATING LAYER ON SIDE SURFACES OF UPPER DC PLUG — S650
- FORMING BIT LINE SPACER MATERIAL LAYER — S655
- FORMING BIT LINE PATTERNS — S660

FIG. 5A
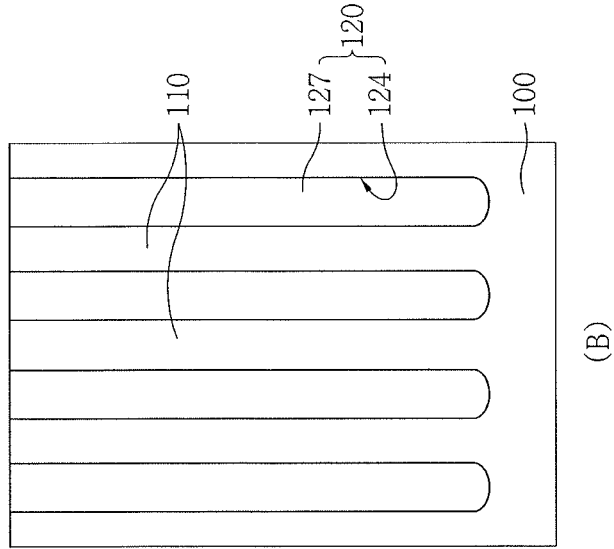
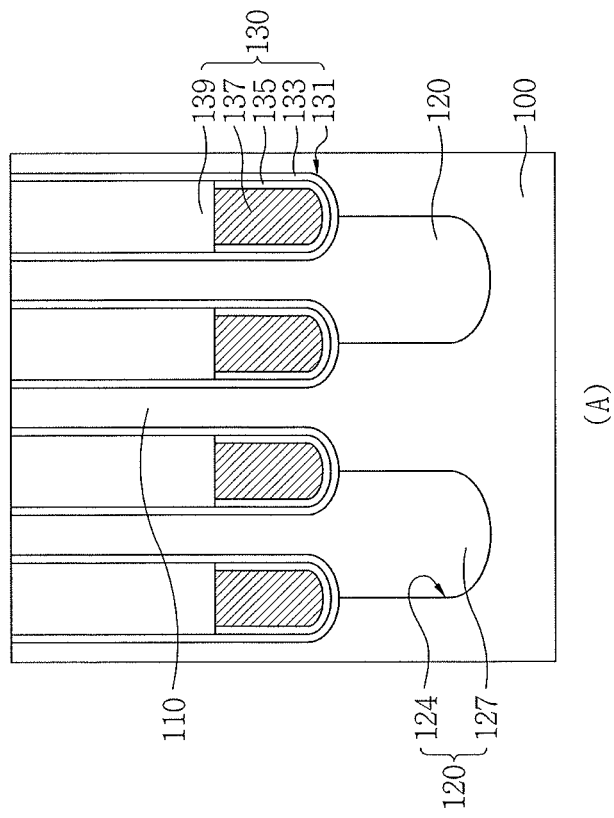

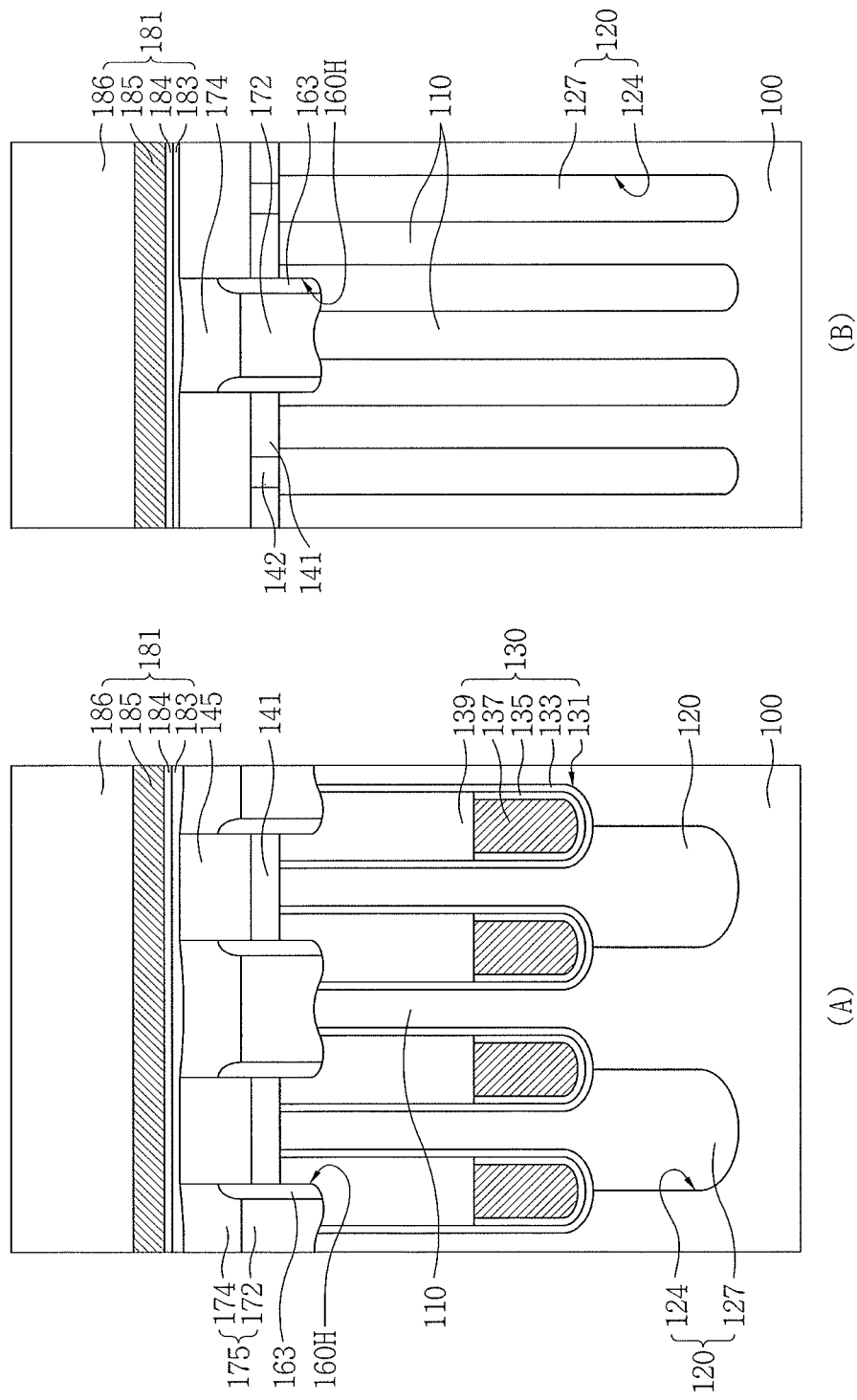

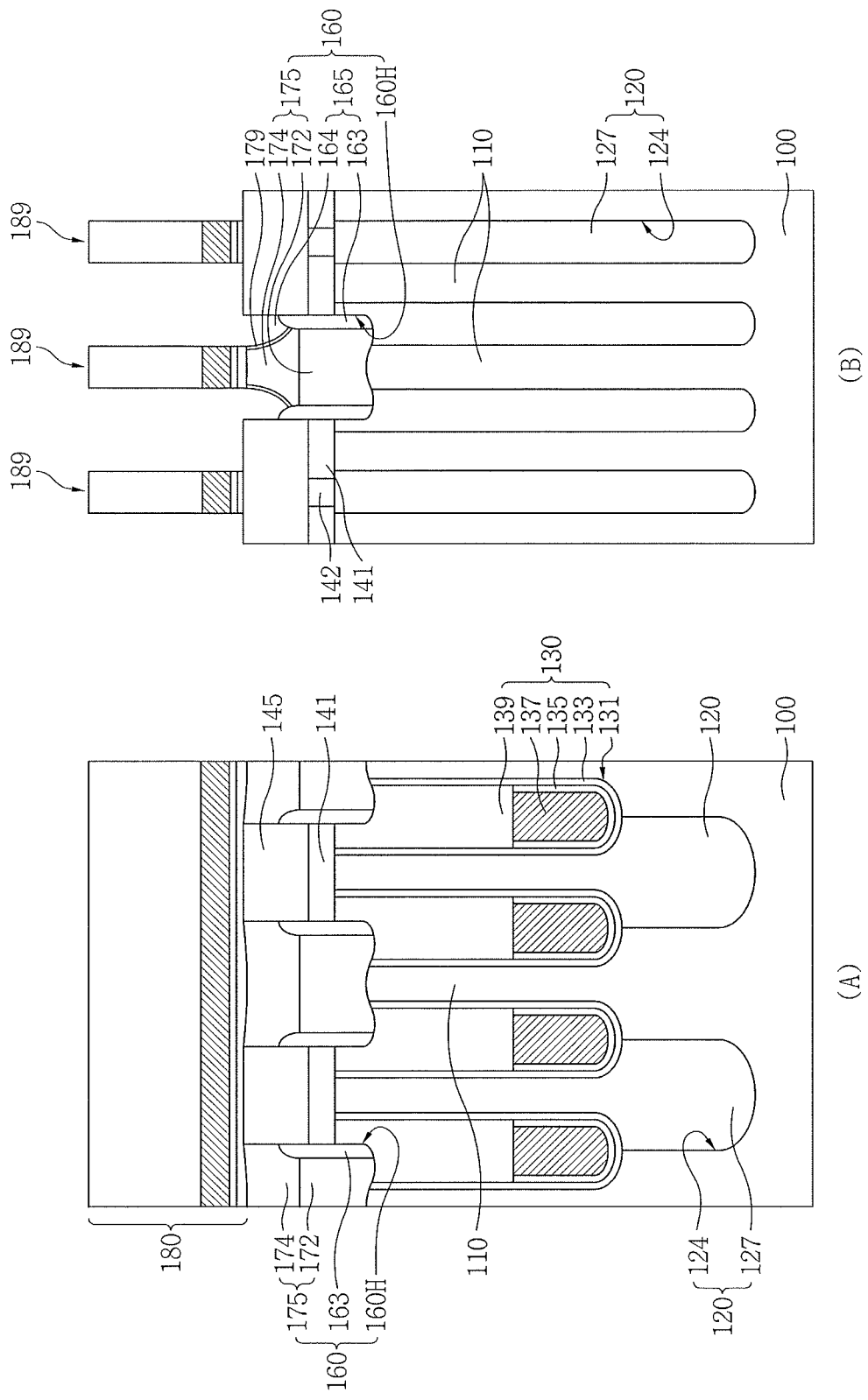

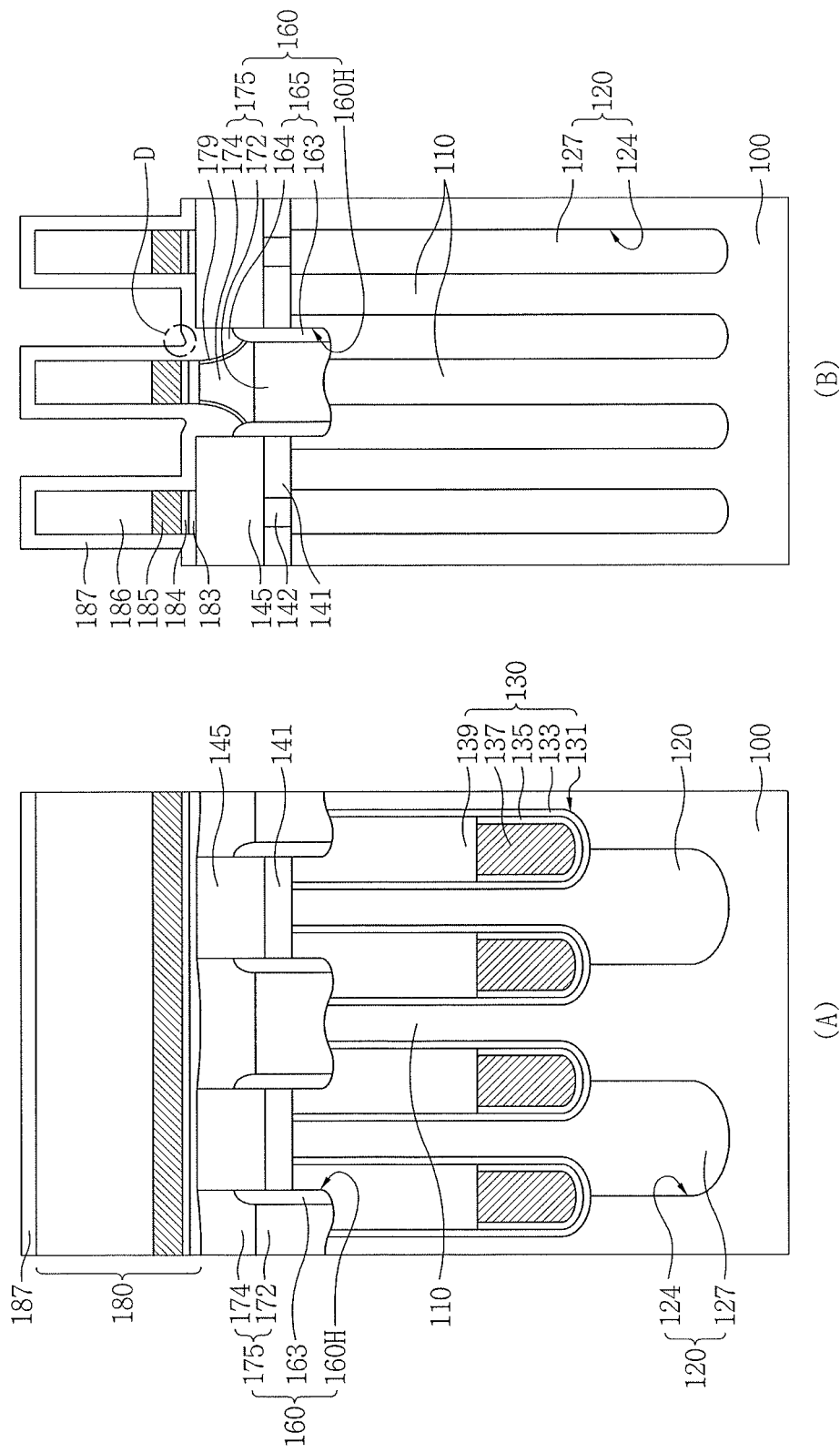

FIG. 7A
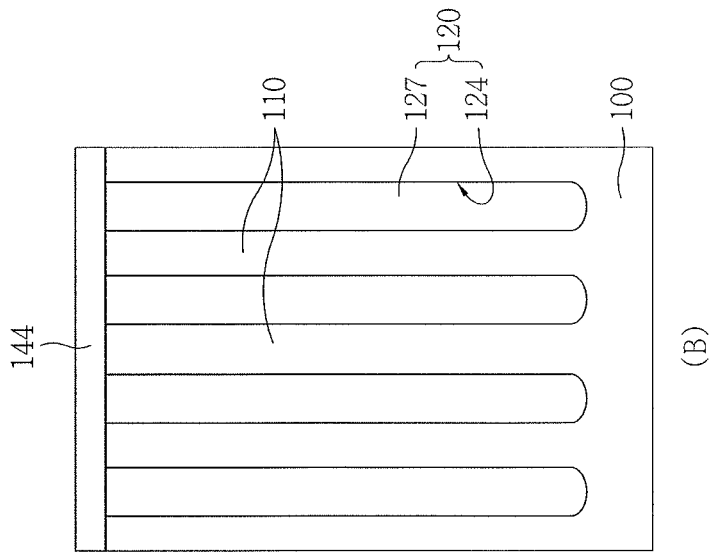
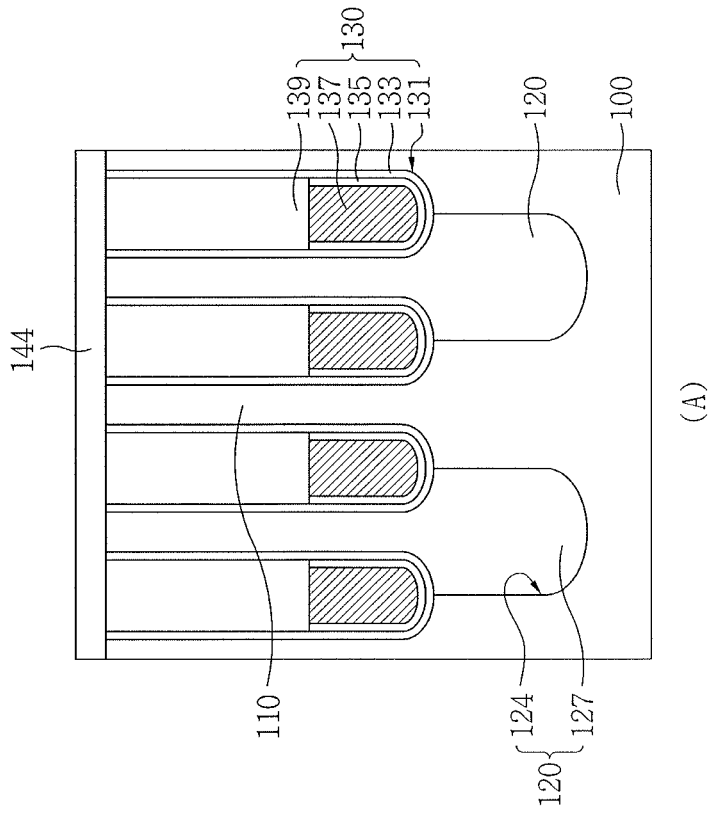

FIG. 9A
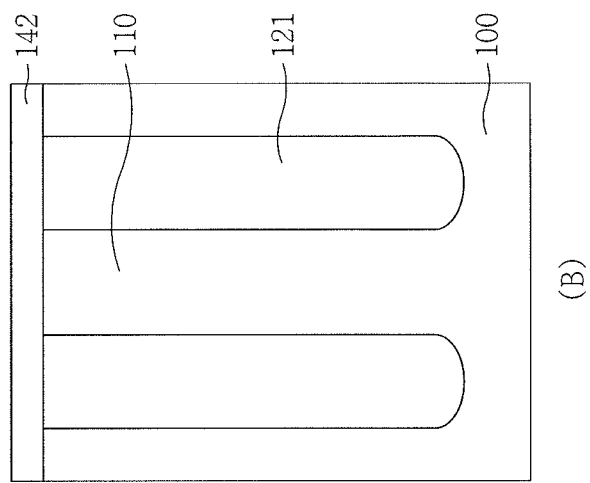
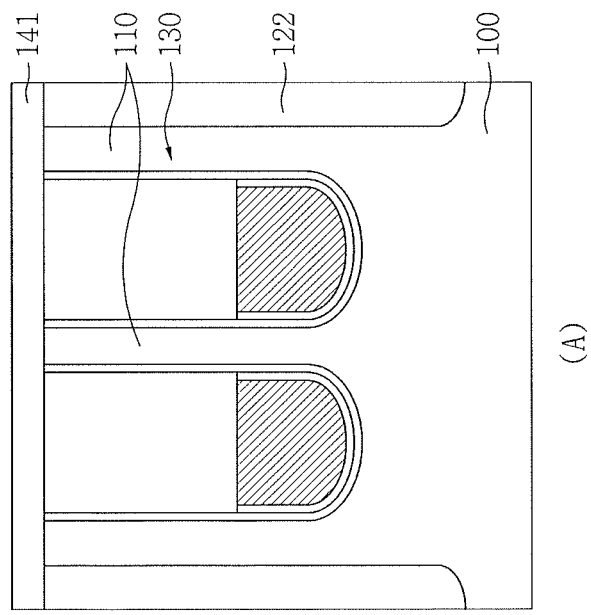

FIG. 10A
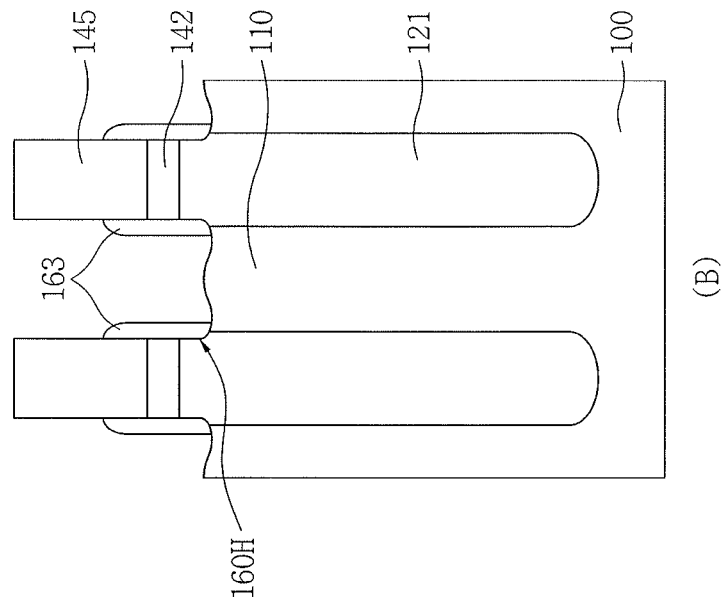
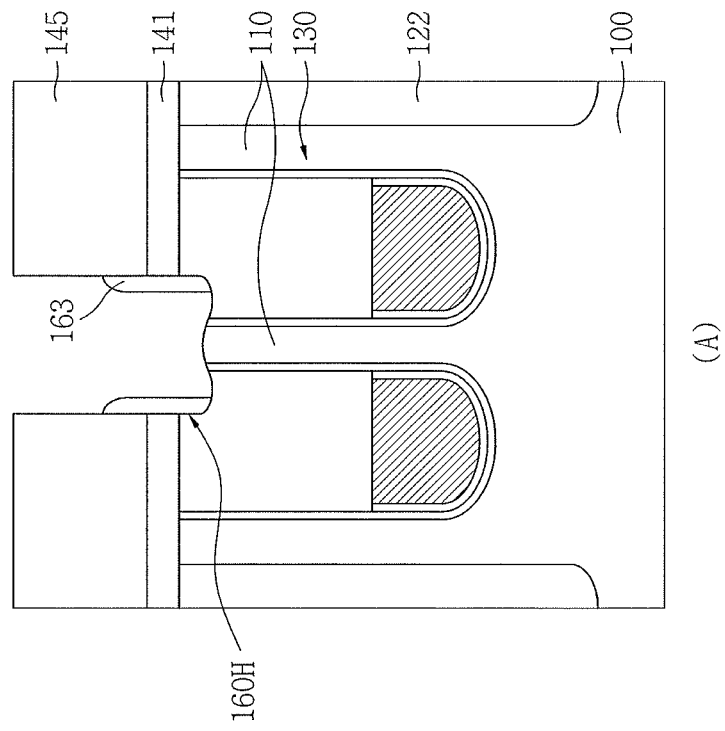

FIG. 11A
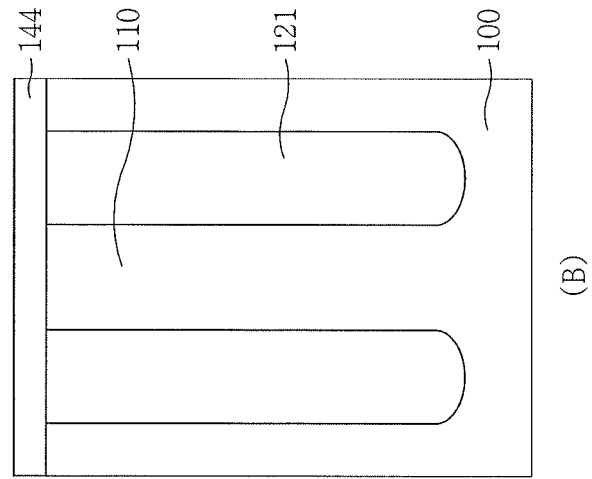
(B)
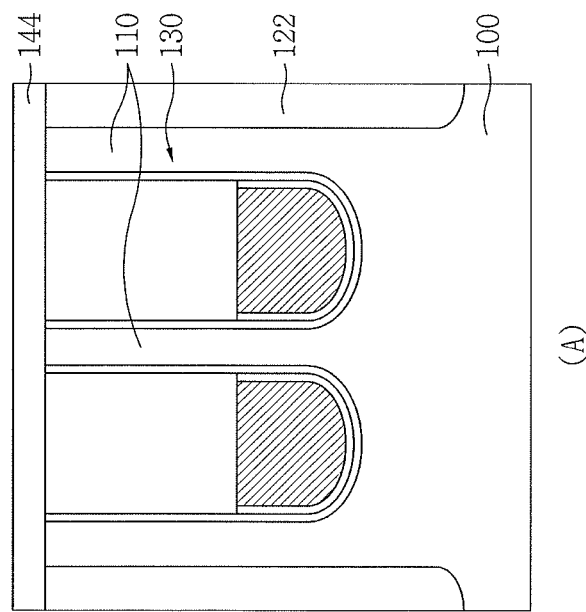
(A)

(A)  (B)

(A)  (B)

(A)　　　　　(B)

(A)　　　　　(B)

SEMICONDUCTOR DEVICE HAVING DC STRUCTURE

CROSS-REFERENCE TO RELATED APPLICATION

This application claims priority under 35 U.S.C. §119 to Korean Patent Application No. 10-2012-0037481 filed on Apr. 10, 2012, in the Korean Intellectual Property Office, and entitled: "Semiconductor Device Having DC Structure," which is incorporated by reference herein in its entirety.

BACKGROUND

1. Field

Embodiments of the inventive concept relate to a semiconductor device having a direct contact (DC) plug.

2. Description of Related Art

With miniaturization of patterns of semiconductor devices, research into techniques for reducing resistance of direct contact (DC) plugs and electrically insulating the DC plugs from other adjacent contact plugs has been conducted.

SUMMARY

Embodiments of the inventive concept provide a direct contact (DC) plug and a semiconductor device having the DC plug.

Other embodiments of the inventive concept provide a DC plug having an upper portion wider than a lower portion, and a semiconductor device having the DC plug.

Other embodiments of the inventive concept provide a DC structure having an upper spacer and a lower spacer, and a semiconductor device having the DC structure.

Other embodiments of the inventive concept provide a DC plug having a tapered side surface, and a semiconductor device having the DC plug.

Other embodiments of the inventive concept provide a DC spacer having a tapered side surface, and a semiconductor device having the DC spacer.

Other embodiments of the inventive concept provide a DC plug having the same width in a first direction and having upper and lower portions with different widths in a second direction different from the first direction, and a semiconductor device having the DC plug.

Other embodiments of the inventive concept provide a DC structure having a partially removed DC spacer, and a semiconductor device having the DC structure.

Other embodiments of the inventive concept provide a DC structure having a DC spacer disposed at a relatively low level in a first direction and disposed at a relatively high level in a second direction, and a semiconductor device having the DC structure.

Other embodiments of the inventive concept provide a semiconductor module, an electronic system, and a mobile device having the semiconductor device.

The technical objectives of the inventive disclosure are not limited to the above disclosure; other objectives may become apparent to those of ordinary skill in the art based on the following descriptions.

In accordance with an aspect of the inventive concept, a semiconductor device includes an interlayer insulating layer on a substrate, and a direct contact (DC) structure vertically penetrating the interlayer insulating layer and contacting the substrate, the DC structure including a DC hole exposing the substrate, an insulating DC spacer on an inner wall of the DC hole, and a conductive DC plug on the DC spacer and filling the DC hole, the DC plug including a lower DC plug and an upper DC plug on the lower DC plug, the lower DC plug having a smaller horizontal width than that of the upper DC plug.

The lower DC plug may have a same horizontal width as the upper DC plug in a first direction, and the lower DC plug may have a smaller horizontal width than the upper DC plug in a second direction different from the first direction.

The upper DC plug may have a lower portion wider than an upper portion.

The lower and upper portions of the upper DC plug may have a same horizontal width in a first direction.

A side surface of the upper DC plug may taper in a forward direction.

The DC spacer may include a lower DC spacer on a lower inner wall of the DC hole, and an upper DC spacer on an upper inner wall of the DC hole, the upper DC spacer having a smaller lower horizontal thickness than an upper horizontal thickness.

An inner side surface of an upper portion of the DC spacer may taper in a reverse direction.

The DC plug may be confined within the DC hole.

The device may further include an active region and a field region in the substrate, the field region defining the active region, and two gate patterns in the substrate across the active region and the field region, the DC plug being in contact with the active region between the two gate patterns.

The device may further include a conductive landing pad and an insulating fence interposed between the substrate and the interlayer insulating layer, the landing pad being on the active region, and the fence being on the field region.

The device may further include a storage contact plug configured to contact the landing pad, the storage contact plug being in direct contact with the DC spacer.

A top surface of the landing pad in contact with the storage contact plug may be recessed.

The device may further include a bit line pattern on the DC structure, the bit line pattern having a bit line barrier layer directly contacting the upper DC plug, a bit line electrode on the bit line barrier layer, and a bit line capping layer on the bit line electrode, one side surface of the bit line barrier layer and one side surface of the bit line electrode being vertically aligned with one side surface of an uppermost portion of the upper DC plug.

The bit line pattern may further include a bit line spacer configured to surround side surfaces of the bit line barrier layer, the bit line electrode, and the bit line capping layer, the device further comprising a dent in the direction of the DC hole at a position where the bit line spacer meets the DC spacer.

In accordance with another aspect of the inventive concept, a semiconductor device includes an active region and a field region in a substrate, the field region defining the active region, two gate patterns in the substrate across the active region and the field region, an interlayer insulating layer on the substrate, and a direct contact (DC) structure vertically penetrating the interlayer insulating layer and contacting the active region between the gate patterns, the DC structure including a DC hole configured to recess top surfaces of the active region and the field region disposed in the substrate, an upper portion of the field region exposed by a lower inner wall of the DC hole, a DC spacer formed on the inner wall of the DC hole and configured to contact an upper portion of the field region exposed by the inner wall of the DC hole; and a conductive DC plug confined within the DC hole and formed on the DC spacer, the DC plug having a lower horizontal width smaller than an upper horizontal width.

In accordance with another aspect of the inventive concept, a semiconductor device includes an interlayer insulating layer on a substrate, and a direct contact (DC) structure vertically penetrating the interlayer insulating layer and contacting the substrate, the DC structure having a DC hole exposing the substrate, an insulating DC spacer only on a first portion of an inner wall of the DC hole, and a conductive DC plug filling the DC hole, the insulating DC spacer being between the conductive DC plug and the first portion of the inner wall, and the conductive DC plug directly contacting a second portion of the inner wall different from the first portion of the inner wall.

A lower portion of the conductive DC plug may have a smaller horizontal width than an upper portion of the conductive DC plug.

The insulating DC spacer may separate the entire lower portion of the conductive DC plug from the inner wall of the DC hole, and separates only a portion of the upper lower portion of the conductive DC plug from the inner wall of the DC hole.

The lower portion of the conductive DC plug may have a same horizontal width as the upper portion of the conductive DC plug in a first direction, and the lower portion of the conductive DC plug may have a smaller horizontal width than the upper portion of the conductive DC plug in a second direction different from the first direction.

The insulating DC spacer may surround the entire perimeter of a lower portion of the DC hole, and only a portion of the perimeter of an upper portion of the DC hole.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 2A illustrates a longitudinal sectional view of a semiconductor device according to an embodiment of the inventive concept;

FIGS. 4A through 4H illustrate flowcharts of methods of fabricating semiconductor devices according to various embodiments of the inventive concept;

FIGS. 5A through 5O, 6A through 6C, 7A through 7C, 8, 9A through 9H, 10A and 10B, 11A and 11B, and 12 illustrate longitudinal sectional views of methods of fabricating semiconductor devices according to embodiments of the inventive concept;

DETAILED DESCRIPTION

Figure 1A:
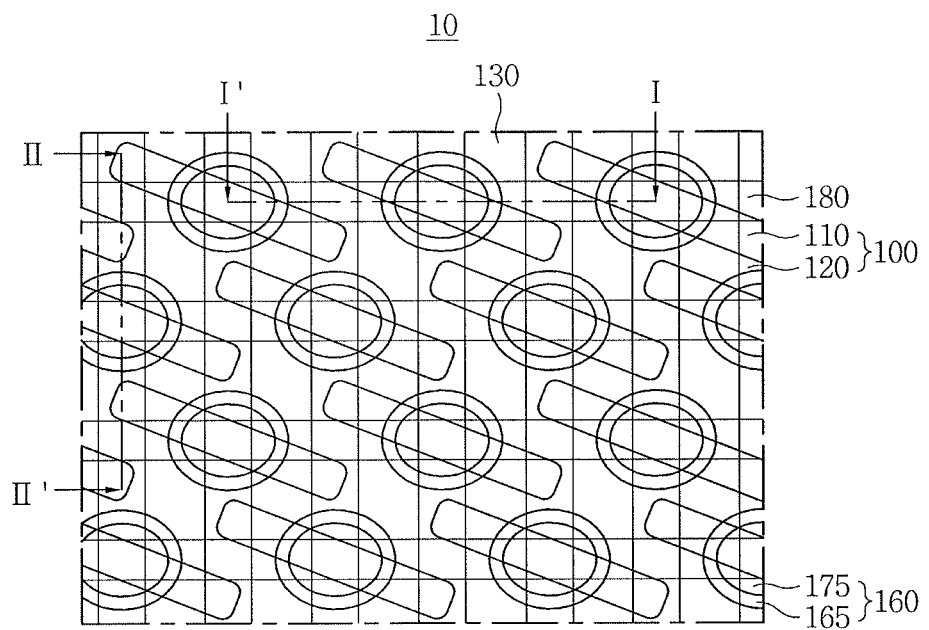
FIGS. 1A and 1B illustrate schematic layouts of semiconductor devices according to embodiments of the inventive concept.

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.). Elements of the embodiments are consistently denoted by the same reference numerals throughout the drawings and detailed description. Herein, the term "and/or" includes any and all combinations of one or more referents.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" relative to other elements or features would then be oriented "above" relative to the other elements or features. Thus, the exemplary term "below" or "beneath" can encompass both an orientation of below and above. The device may be otherwise oriented (rotated 90 degrees or at other orientations) and the spatially relative descriptors used herein interpreted accordingly.

Embodiments of the inventive concept are described herein with reference to cross-section, plan, and block illustrations that are schematic illustrations of idealized embodiments of the inventive concept. As such, variations from the shapes of the illustrations as a result, e.g., of manufacturing techniques and/or tolerances, are to be expected. Thus, embodiments of the inventive concept should not be construed as limited to the particular shapes of regions illustrated herein but are to include deviations in shapes that result, e.g., from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

Figure 1B:
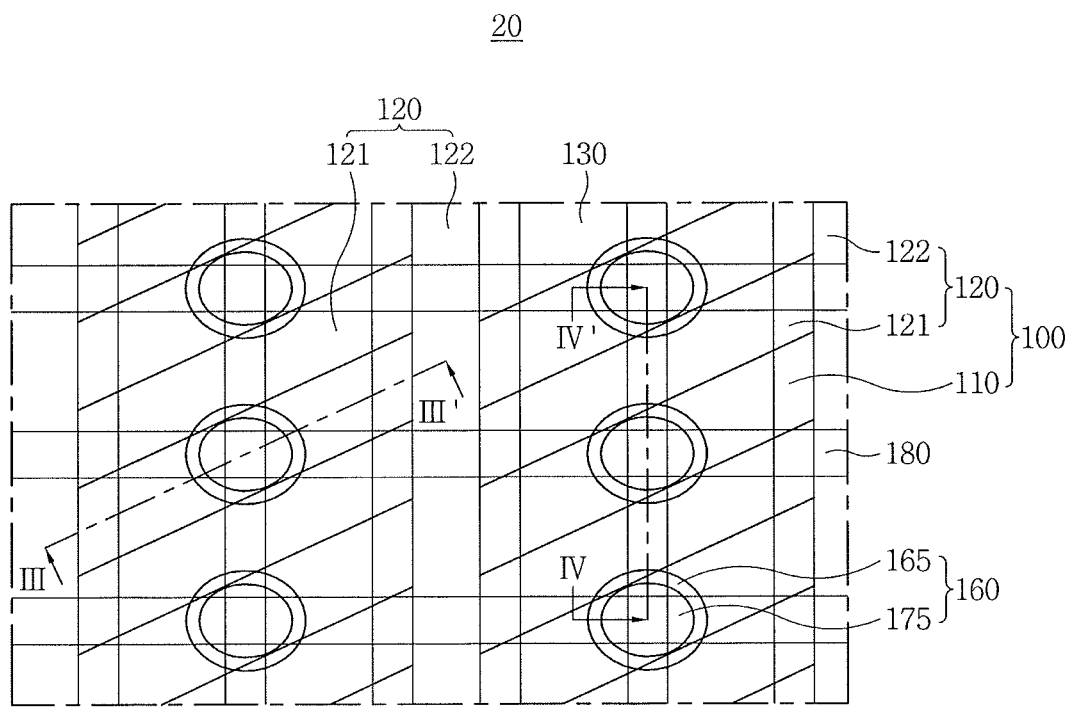

FIGS. 1A and 1B illustrate schematic layouts of semiconductor devices according to embodiments of the inventive concept.

Referring to FIG. 1A, a semiconductor device 10 according to an embodiment of the inventive concept may include active regions 110 and field regions 120 formed in a substrate 100. The semiconductor device 10 according to the embodiment of the inventive concept may include word lines 130 and bit lines 180 configured to intersect on the active regions 110 and the field regions 120. The semiconductor device 10 according to the embodiment of the inventive concept may include direct contact (DC) structures 160 disposed at intersections between the active regions 110 and the bit lines 180. The DC structures 160 may include DC spacers 165 and DC plugs 175, respectively.

For example, the DC spacers 165 may directly surround the outsides of the DC plugs 175. The DC structures 160 may have elliptical shapes, e.g., elliptical cross-sections as viewed from a top view, with the long diameters extending in a same direction as the bit lines 180. For instance, the DC structures 160 may have relatively small diameters in a direction in which the word lines 130 extend, and have relatively large diameters in the direction in which the bit lines 180 extend.

The active regions 110 may have diagonally elongated bar shapes, e.g., so the active regions 110 may extend in a direction other than the directions of the word lines 130 and bit lines 180. The field regions 120 may be defined to surround four sides of the active regions 110. At least two word lines 130 may be arranged to cross one active region 110 in a diagonal direction. One bit line 180 may be arranged to cross a central region of one active region 110 in a diagonal direction. The word lines 130 may be arranged at right angles to the bit lines 180.

Referring to FIG. 1B, a semiconductor device 20 according to an embodiment of the inventive concept may include the active regions 110 and field regions 120 formed in the substrate 100. The semiconductor device 20 according to the embodiment of the inventive concept may include the word lines 130 and bit lines 180 configured to intersect the active regions 110 and the field regions 120. The semiconductor device 20 according to the embodiment of the inventive concept may include DC structures 160 disposed at intersections between the active regions 110 and the bit lines 180. The DC structures 160 may include DC spacers 165 and DC plugs 175, respectively. For example, the DC spacers 165 may directly surround the outsides of the DC plugs 175. The DC structures 160 may have elliptical shapes with a diameter expanded in a direction in which the bit lines 180 extend. For instance, the DC structures 160 may have a relatively small diameter in a direction in which the word lines 130 extend, and have a relatively large diameter in the direction in which the bit lines 180 extend. The active regions 110 may be elongated in diagonally elongated bar shapes. For instance, the active regions 110 may have periodically cut line shapes. The field regions 120 may include first field regions 121 extending in parallel with longer sides of the active regions 110, and second field regions 122 extending in parallel with shorter sides of the active regions 110. The first field regions 121 may intersect the second field regions 122. The first field regions 121 may define long sides of the active regions 110, while the second field regions 122 may define short sides of the active regions 110. At least two word lines 130 may be arranged across one active region 110. The word lines 130 may diagonally intersect the field regions 121 and run parallel to the second field regions 122. The bit lines 180 may be arranged to cross central regions of the active regions 110. The bit lines 180 may vertically intersect the word lines 130 and the second field regions 122.

In other drawings of the present specification, the word lines 130 FIGS. 1A and 1B will be referred to as gate patterns 130, and the bit lines 180 of FIGS. 1A and 1B will be referred to as bit line patterns 180. That is, the word lines 130 refer to the same elements as the gate patterns 130, and the bit lines 180 refer to the same elements as the bit line patterns 180.

Figure 2B:
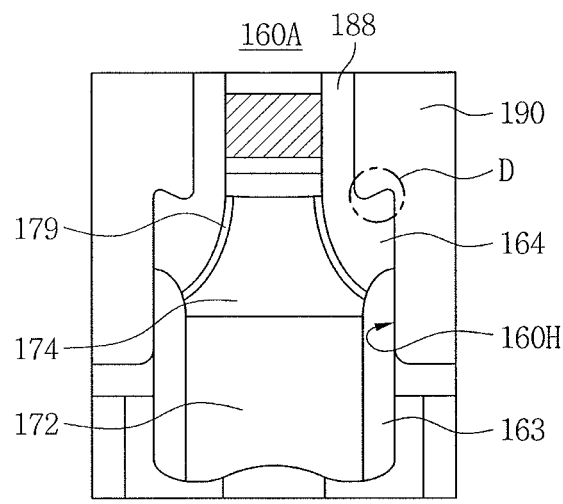
FIGS. 2B and 2C illustrate enlarged views of region P of FIG. 2A.
Figure 2C:
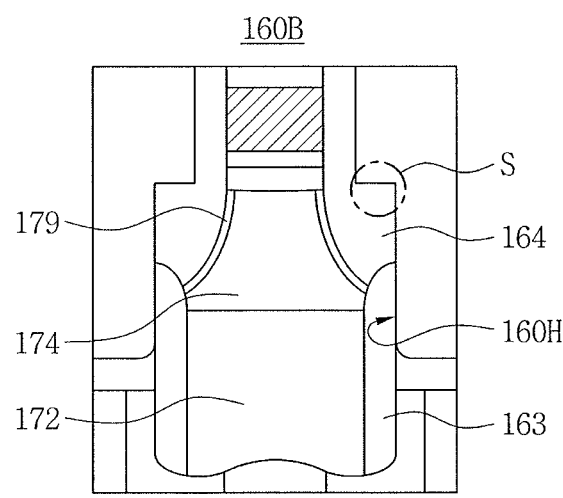

FIG. 2A illustrates a longitudinal sectional view of a semiconductor device according to an embodiment of the inventive concept. (A) of FIG. 2A is a longitudinal sectional view taken along line I-I' of FIG. 1A, and (B) of FIG. 2A is a longitudinal sectional view taken along line II-II' of FIG. 1A. FIGS. 2B and 2C are enlarged views of region P of FIG. 2A.

Referring to FIGS. 2A through 2C, the semiconductor device 10 according to an embodiment of the inventive concept may include the active regions 110, field regions 120, and gate patterns 130, which may be formed in the substrate 100, and the DC structure 160 and bit line patterns 180, which may be formed on the substrate 100. The semiconductor device 10 according to the embodiment of the inventive concept may include storage contact plugs 190 formed between the bit line patterns 180.

The substrate 100 may include a semiconductor wafer. For example, the substrate 100 may include a single crystalline silicon wafer, a silicon-on-insulator (SOI) wafer, or a silicon germanium (SiGe) wafer. In the present embodiment, it is assumed that the substrate 100 is a single crystalline silicon wafer.

The active regions 110, which may be a portion of the substrate 100, may contain impurity atoms or impurity ions, such as phosphorous (P), arsenic (As), or boron (B). Accordingly, the active regions 110 may have conductivity.

The field regions 120 may include field trenches 124 and a field insulating material 127 filling the field trenches 124. The field insulating material 127 may include, e.g., silicon oxide. In some embodiments, a thin field lining layer may be formed along profiles of inner walls of the field trenches 124. The field lining layer may include an insulating material denser than silicon oxide, e.g., silicon nitride. The active regions 110 may form substantially planar surfaces with the field regions 120. In some embodiments, the surfaces of the active regions 110 may be disposed at a different level from the surfaces of the field regions 120. In the present embodiment, it is assumed for brevity that the active regions 110 form planar surfaces with the field regions 120.

Each of the gate patterns 130 may include a gate trench 131, a gate insulating layer 133, a gate electrode 137, and a gate capping layer 139. The gate trench 131 may intersect the active regions 110 and the field regions 120 in the substrate 100. The gate trench 131 may be shallower than the field trenches 124. The gate insulating layer 133 may be conformally formed along a profile of an inner wall of the gate trench 131. The gate insulating layer 133 may include oxidized silicon. For instance, the gate insulating layer 133 may be formed by oxidizing the surface of the inner wall of the gate trench 131. The gate insulating layer 133 may include silicon oxide or a metal oxide. The gate electrode 137 may partially fill the gate trench 131. For example, a top surface of the gate electrode 137 may be lower than half the gate trench 131. The gate electrode 137 may include a conductive material, e.g., a metal, a metal silicide, or doped polycrystalline silicon (doped poly-Si). The gate capping layer 139 may be formed on the gate electrode 137 to completely fill the gate trench 131. The gate capping layer 139 may include an insulating material, e.g., silicon nitride. A gate barrier layer 135 may be interposed between the gate insulating layer 133 and the gate electrode 137. The gate barrier layer 135 may include, e.g., titanium (Ti), titanium nitride (TiN), tantalum (Ta), tantalum nitride (TaN), tungsten nitride (WN), or other refractory metals or metal compounds.

Landing pads 141 and fences 142 may be disposed on the substrate 100. The landing pads 141 may have conductivity. For instance, the landing pads 141 may include doped silicon, a metal, or a metal compound. Portions of top surfaces of the landing pads 141 may be recessed. The landing pads 141 may be physically and electrically connected to the active regions 110. In some embodiments, the landing pads 141 may include the same material as the substrate 100. For example, the landing pads 141 may include selectively epitaxial-grown (SEG) single crystalline silicon. The fences 142 may be interposed between the landing pads 141 and electrically insulate the landing pads 141 from one another. For example, the fences 142 may be selectively formed on the field regions 120, while the landing pads 141 may be selectively formed on the active regions 110. The fences 142 may include, e.g., silicon nitride. The landing pads 141 and the fences 142 may be disposed in various shapes. In the present embodiment, it is assumed that the fences 142 are disposed to have the same layouts as the bit line patterns 180. However, this is only an example. Since the fences 142 are provided to electrically insulate the landing pads 141 from one another, the fences 142 may be variously applied according to the shapes, disposition, and relationships of other elements. The landing pads 141 may form planar top surfaces with the fences 142. Referring further to (B) of FIG. 2A, the fences 142 may have a smaller horizontal width than the field regions 120. In other longitudinal sectional views, the fences 142 may be formed in shapes horizontally crossing the field regions 120.

An interlayer insulating layer 145 may be formed on the landing pads 141 and the fences 142. The interlayer insulating layer 145 may include silicon oxide or silicon nitride. For example, the interlayer insulating layer 145 may include a middle-temperature oxide (MTO), SiCHO, plasma-enhanced tetra ethyl ortho silicate (PE-TEOS), silicon nitride (SiN), or various other insulating materials.

The DC structure 160 may include the DC spacer 165 and the DC plug 175 inside a DC hole 160H. The DC spacer 165 may include a lower DC spacer 163 and an upper DC spacer 164. The DC plug 175 may include a lower DC plug 172 and an upper DC plug 174.

The DC hole 160H may vertically penetrate the interlayer insulating layer 145 and the landing pads 141, and may partially expose the surface of the substrate 100 and the surface of the field region 120. The DC hole 160H may partially recess the surface of the active region 110 and an upper portion of the field region 120.

The lower DC spacer 163 may be formed on a lower inner wall of the DC hole 160H. Inner walls of the lower DC spacer 163 may be substantially vertical. For example, the inner walls of the lower DC spacer 163 may have a generally uniform thickness to be substantially parallel to an inner wall of the DC hole 160H. The lower DC spacer 163 may include an insulating material denser than the interlayer insulating layer 145. For instance, if the interlayer insulating layer 145 includes silicon oxide, the lower DC spacer 163 may include silicon nitride.

The lower DC plug 172 may be formed on the lower DC spacer 163 to fill a portion of the DC hole 160H. For example, the lower DC plug 172 may partially fill a space confined by the lower DC spacer 163. A top surface of the lower DC plug 172 may be lower than a top end of the lower DC spacer 163. The lower DC plug 172 may be in direct contact with the substrate 100. The lower DC plug 172 may be in direct contact with an upper region of the field region 120. Since the surface of the substrate 100 in contact with the lower DC plug 172 is recessed, a bottom end of the lower DC plug 172 may be lower than an unrecessed top surface of the substrate 100. The lower DC plug 172 may include a conductive material. For instance, the lower DC plug 172 may include doped poly-Si, single crystalline silicon grown using an epitaxial method, a metal silicide, or a metal.

The upper DC spacer 164 may be formed on an upper inner wall of the DC hole 160H. The upper DC spacer 164 may partially contact an upper portion of the lower DC spacer 163 and may not contact the lower DC plug 172. The upper DC spacer 164 may include an insulating material denser than the interlayer insulating layer 145. For example, the upper DC spacer 164 may include an insulating material, such as silicon nitride. When the upper DC spacer 164 includes the same material as the lower DC spacer 163, a boundary between the upper and lower DC spacers 164 and 163 may not be seen. Accordingly, the upper DC spacer 164 may be referred to as an upper portion of the DC spacer 165, while the lower DC spacer 163 may be referred to as a lower portion thereof.

The upper DC plug 174 may be formed within the DC hole 160H defined by the lower DC plug 172, the lower DC spacer 163, and the upper DC spacer 164. A central portion of a top surface of the upper DC plug 174 may be slightly recessed. For example, the top surface of the upper DC plug 174 may have a dished shape. The upper DC plug 174 may include a conductive material. For instance, the upper DC plug 174 may include doped poly-Si, single crystalline silicon grown using an epitaxial growth process, a metal silicide, or a metal. When the upper DC plug 174 includes the same material as the lower DC plug 172, a boundary between the upper and lower DC plugs 174 and 172 may not be seen.

A thin surface insulating layer 179 may be formed at a boundary between the upper DC plug 174 and the upper DC spacer 164. The surface insulating layer 179 may include an oxide. For example, the surface insulating layer 179 may be formed by oxidizing the surface of the upper DC plug 174. A top surface of the interlayer insulating layer 145 may form a substantially planar surface with a top surface of the DC structure 160.

Referring to FIG. 2A, the upper DC plug 174 may be in direct contact only with a portion of the inner wall of the DC hole 160H, so a first portion of the upper DC plug 174 directly contacts the inner wall of the DC hole 160H and a second portion of the upper DC plug 174 contacts the inner wall of the DC hole 160H through the upper DC spacer 164. For example, as illustrated in (A) of FIG. 2A, the upper DC plug 174 may be in direct contact with the inner wall of the DC hole 160H from a sectional view taken in a first direction, i.e., so the upper DC spacer 164 may not be seen. As the first portion of the upper DC plug 174 contacts directly the inner wall of the DC hole 160H, the first portion of the upper DC plug 174 may have a greater horizontal width in the first direction than the lower DC plug 172.

Referring to (B) of FIG. 2A, the upper DC plug 174 may not be in direct contact with the inner wall of the DC hole 160H from a sectional view taken in a second direction. For example, the lower DC spacer 163 and/or the upper DC spacer 164 may be interposed between the upper DC plug 174 and the inner wall of the DC hole 160H. Further, a portion of a side surface of the upper DC plug 174 may taper in a forward (+) direction, so the upper DC plug 174 may have a narrow upper portion and a wide lower portion in the second direction. An inner side surface of the upper DC spacer 164 may taper in a reverse (−) direction, so the upper DC spacer 164 may have a lower portion with a small horizontal thickness and an upper portion with a large horizontal thickness in the second direction.

A top end of the DC spacer 165 according to an embodiment of the inventive concept may be disposed at a relatively low level in the first direction and disposed at a relatively high level in the second direction. For example, in the DC structure 160 according to the embodiment of the inventive concept, a top end of the lower DC spacer 163 may be disposed at an uppermost level in the first direction, while a top end of the upper DC spacer 164 may be disposed at the uppermost level in the second direction.

The bit line patterns 180 may be directly formed on the interlayer insulating layer 145 and the DC structure 160. The bit line patterns 180 may include a bit line barrier layer 182, a bit line electrode 185, a bit line capping layer 186, and a bit line spacer 188. The bit line barrier layer 182 may include a lower bit line barrier layer 183 and an upper bit line barrier layer 184. The bit line barrier layer 182 and the bit line electrode 185 may be elongated in the first direction, and may have smaller horizontal widths than the DC structure 160 in the second direction perpendicular to the first direction. In addition, the bit line barrier layer 182 and the bit line electrode 185 may have smaller horizontal widths than a maximum horizontal width of the upper DC plug 174 in the second direction. For example, the bit line patterns 180 may have smaller horizontal widths than the DC structure 160 in the second direction.

The bit line barrier layer 182 may be in direct contact with the upper DC plug 174. The bit line barrier layer 182 may have a smaller thickness than the bit line electrode 185. The lower bit line barrier layer 183 may include a metal silicide, such as tungsten silicide. The upper bit line barrier layer 184 may include a metal and/or a metal compound, such as Ti, TiN, Ta, TaN, or WN. The bit line electrode 185 may include a metal, such as tungsten. The lower bit line barrier layer 183 and the bit line electrode 185 may include the same metal. The bit line capping layer 186 may include an insulating material denser than the interlayer insulating layer 145. For example, the bit line capping layer 186 may include silicon nitride. Two side surfaces of the bit line barrier layer 182, the bit line electrode 185, and the bit line capping layer 186 may be vertically aligned with each other. The bit line spacer 188 may be conformally formed on side surfaces of the bit line barrier layer 182, the bit line electrode 185, and the bit line capping layer 186. A portion of the bit line spacer 188 may be formed also on the interlayer insulating layer 145. The bit line spacer 188 also may include an insulating material denser than the interlayer insulating layer 145. For example, the bit line spacer 188 may include silicon nitride.

Referring further to FIG. 2B, a DC structure 160A according to an embodiment of the inventive concept may include a dent D. The dent D may be formed at a portion where the bit line spacer 188 meets, e.g., abuts, the upper DC spacer 164. For example, when the bit line spacer 188 or the upper DC plug 174 does not have a sufficient thickness, the portion where the bit line spacer 188 meets, e.g., adjoins, the upper DC spacer 164 may be dented toward the inside of the DC hole 160H.

Referring further to FIG. 2C, a DC structure 160B according to an embodiment of the inventive concept may include a step S, which may be formed at a portion where the bit line spacer 188 meets the upper DC spacer 164. For example, when the bit line spacer 188 or the upper DC spacer 174 has a sufficient thickness, the portion where the bit line spacer 188 meets the upper DC spacer 164 may not be dented toward the inside of the DC hole 160H.

For brevity, the dent D and the step S are provided as examples to indicate that the horizontal thickness of the bit line spacer 188, i.e., as measured along the second direction, may differ from the horizontal thickness of the upper DC spacer 164.

Referring to the upper DC plug 174, the DC structure 160, and the bit line pattern 180 according to an embodiment of the inventive concept, may have a relatively small contact area in the sectional view taken in the second direction and have a relatively large contact area in the sectional view taken in the first direction.

A storage contact plug 190 may be formed between the bit line patterns 180. The storage contact plug 190 may vertically penetrate the interlayer insulating layer 145 and be in direct contact with the landing pads 141. The storage contact plug 190 may be directly formed on the recessed surfaces of the landing pads 141. The storage contact plug 190 may be in direct contact with a portion of the bit line spacer 188. The spacer contact plug 190 may be in direct contact with a portion of a side surface of the lower DC spacer 163 and a portion of a side surface of the upper DC spacer 164. A lower portion of the storage contact plug 190 adjacent to the DC structure 160 may have a relatively small horizontal width, while an upper portion of the storage contact plug 190 adjacent to the bit line spacer 188 may have a relatively large horizontal width. A top surface of the storage contact plug 190 may form a planar surface with top surfaces of the bit line patterns 180. The storage contact plug 190 may include a conductive material. For example, the storage contact plug 190 may include doped poly-Si, single crystalline silicon grown using an epitaxial growth process, a metal silicide, a metal, or a metal compound.

Figure 2D:
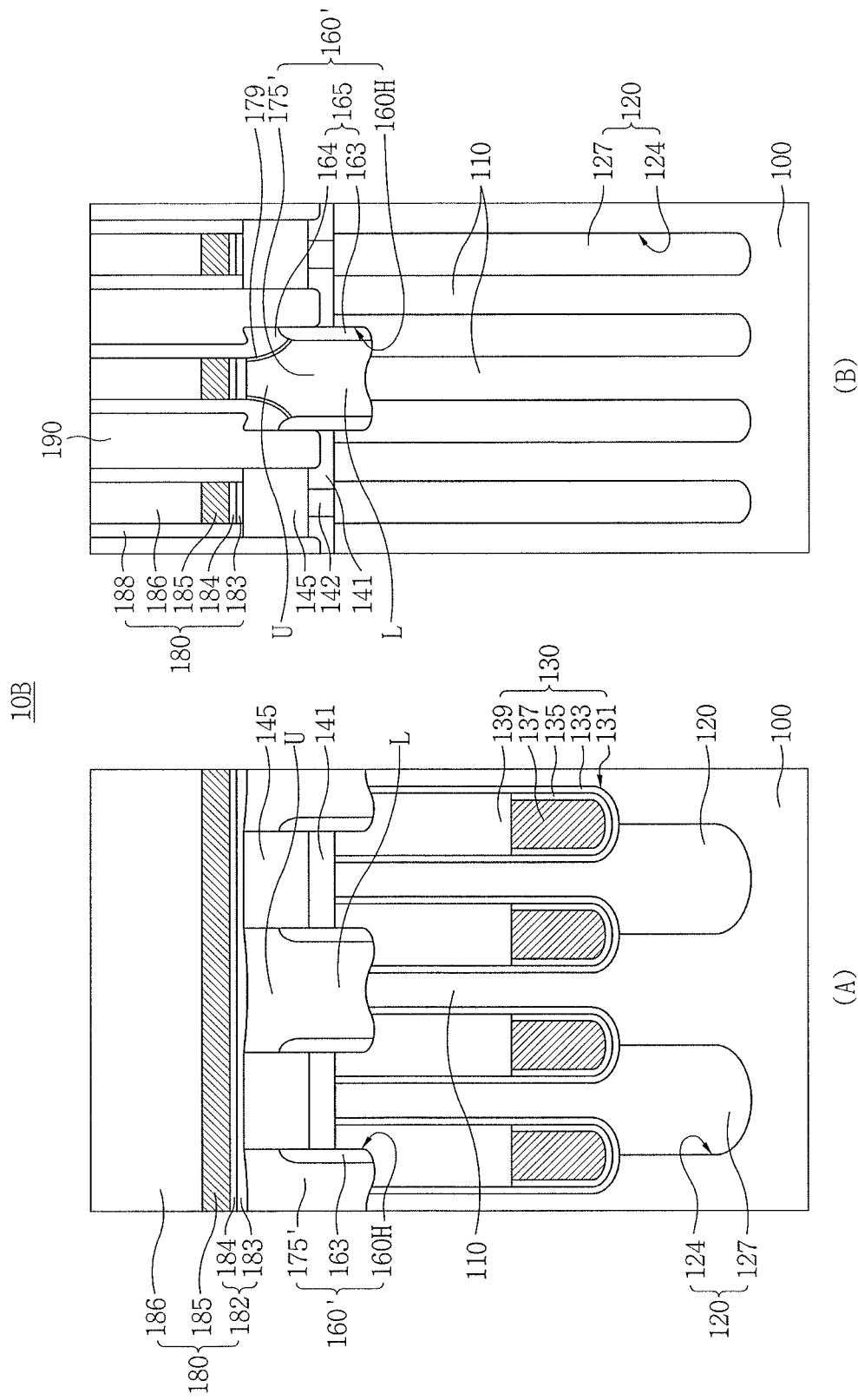
FIGS. 2D through 2F illustrate longitudinal sectional views of semiconductor devices according to various embodiments of the inventive concept.
Figure 2E:
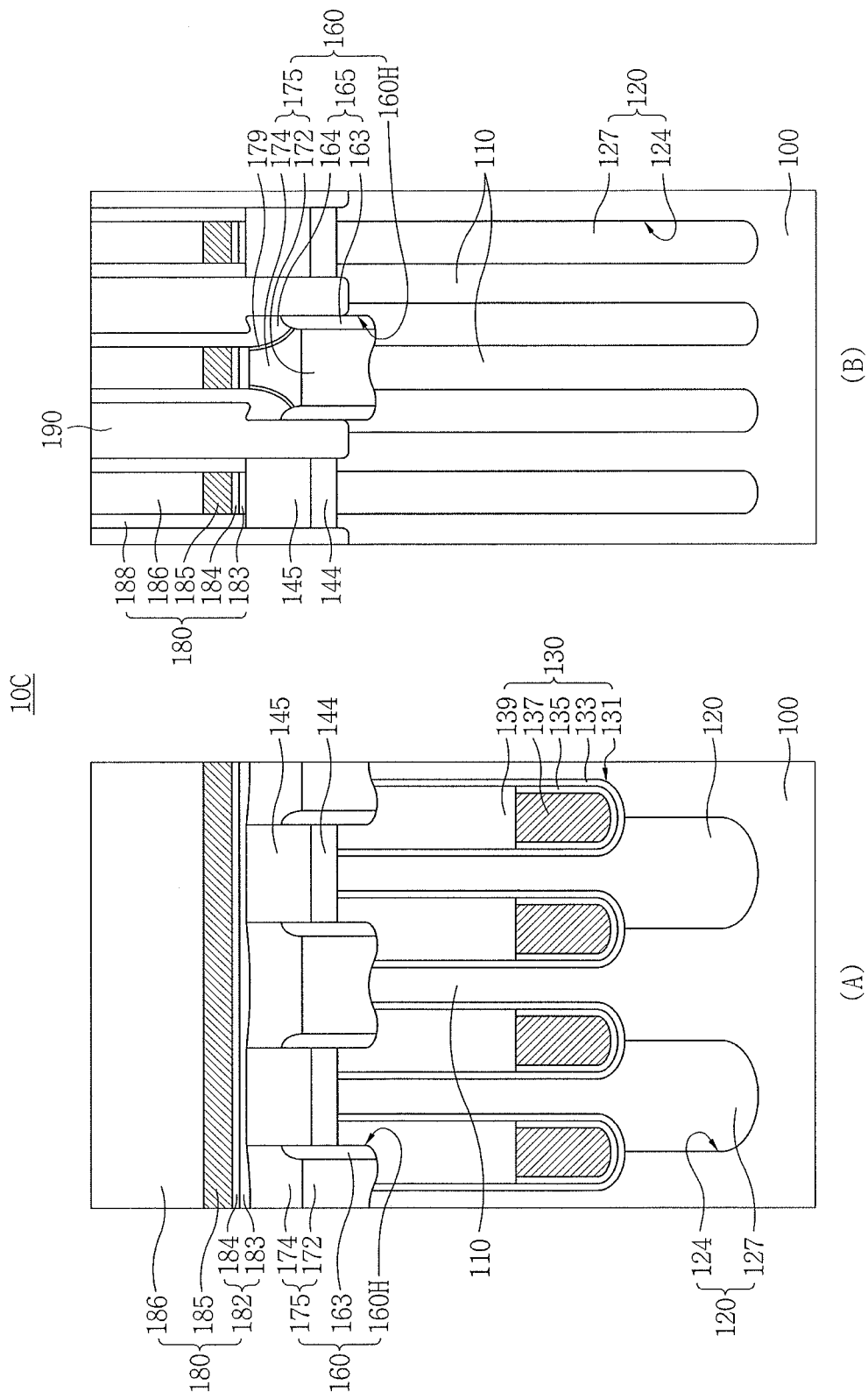
Figure 2F:
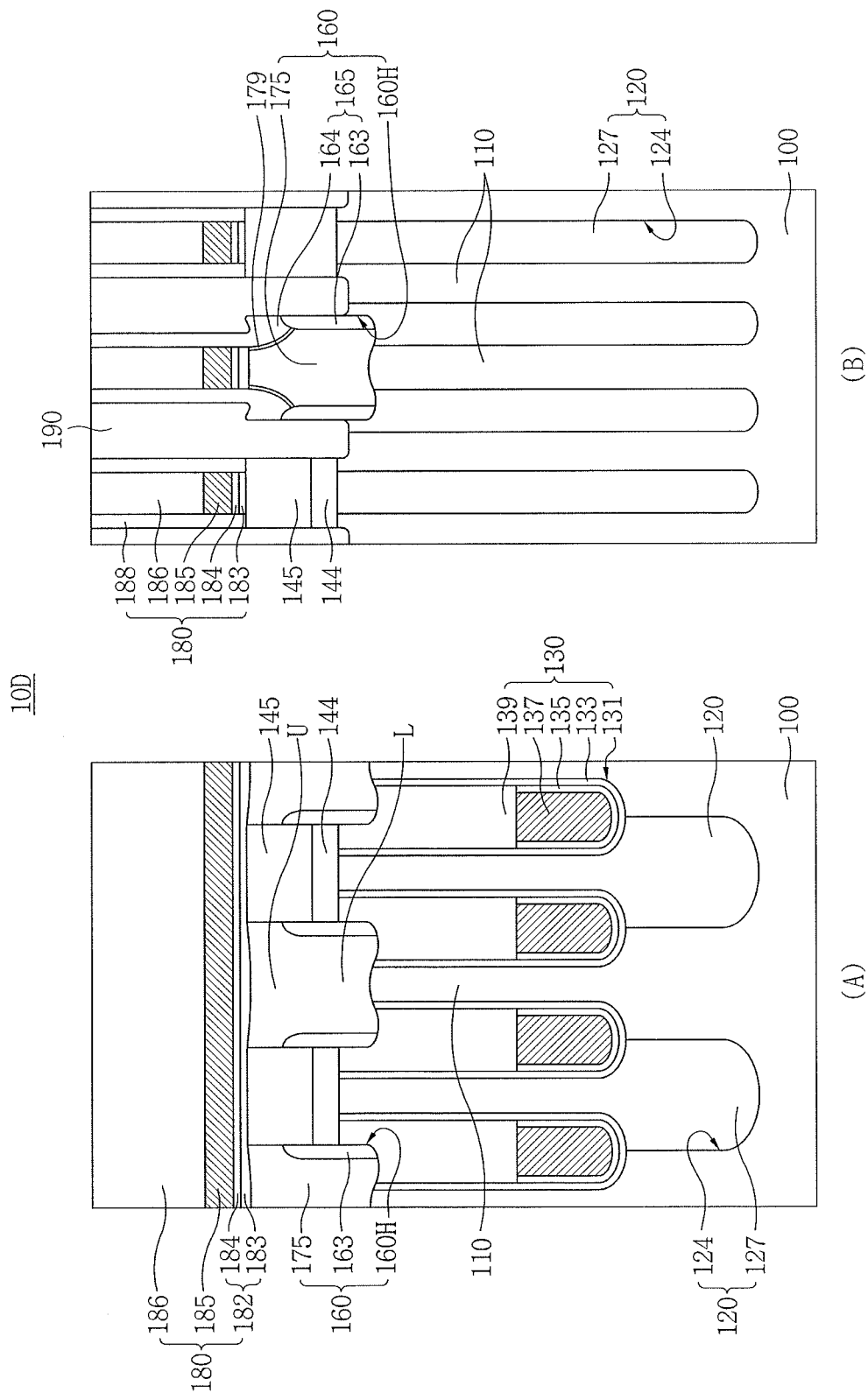

FIGS. 2D through 2F illustrate longitudinal sectional views illustrating semiconductor devices according to various embodiments of the inventive concept. (A) of FIGS. 2D through 2F are longitudinal sectional views taken along line I-I' of FIG. 1A, and (B) of FIGS. 2D through 2F are longitudinal sectional views taken along line II-II' of FIG. 1A.

Referring to FIG. 2D, a semiconductor device 10B according to an embodiment of the inventive concept may include the active regions 110, field regions 120, and gate patterns 130, which may be formed in the substrate 100, and a DC structure 160' and the bit line patterns 180, which may be formed on the substrate 100. The semiconductor device 10B according to the embodiment of the inventive concept may further include a storage contact plugs 175' formed between the bit line patterns 180. The DC structure 160' may include an integral DC plug 175'. The DC plug 175' may include a lower portion L and an upper portion U. For example, the lower and upper portions L and U of the DC plug 175 may be materially in continuity with each other. When the lower and upper DC plugs 172 and 174 of the semiconductor device 10A shown in FIGS. 2A through 2C include the same material, a boundary between the lower and upper DC plugs 172 and 174 may disappear to define the integral DC plug 175'.

Referring to FIG. 2E, a semiconductor device 10C according to an embodiment of the inventive concept may include the active regions 110, field regions 120, and gate patterns 130, which may be formed in the substrate 100, and the DC structure 160 and bit line patterns 180, which may be formed on the substrate 100. The semiconductor device 10C according to the embodiment of the inventive concept may include a base insulating layer 144 formed on the substrate 100. For example, landing pads 141 and fences 142 may be omitted, so the base insulating layer 144 may be formed to blanket, e.g., cover, the substrate 100. Accordingly, the storage contact plug 190 may vertically penetrate the interlayer insulating layer 145 and the base insulating layer 144, and may be in direct contact with the substrate 100. The storage contact plug 190 may be in direct contact with an upper portion of the field region 120. The surface of the substrate 100 and an upper portion of the field region 120 may be recessed. Accordingly, a bottom end of the storage contact plug 190 may extend to a lower level than an unrecessed surface of the substrate 100 and the surface of the field region 120. The base insulating layer 144 may include a silicon oxide layer or a silicon nitride layer. When the base insulating layer 144 includes the same material as the interlayer insulating layer 145, a boundary between the base insulating layer 144 and the interlayer insulating layer 145 may be unseen or may disappear to define one integral layer, i.e., the base insulating layer 144 and the interlayer insulating layer 145 may not be separate elements.

Referring to FIG. 2F, a semiconductor device 10D according to an embodiment of the inventive concept may include the active regions 110, field regions 120, and gate patterns 130, which may be formed in the substrate 100, and the DC structure 160' and bit line patterns 180, which may be formed on the substrate 100. The DC structure 160' may include the integral DC plug 175'. The DC plug 175' may include the lower portion L and the upper portion U. For example, the lower and upper portions L and U of the DC plug 175' may be materially in continuity with each other. The semiconductor device 10D according to an embodiment of the inventive concept may further include the base insulating layer 144 on the substrate 100.

The semiconductor devices 10B to 10D shown in FIGS. 2D through 2F, according to various embodiments of the inventive concept, may include technical features described with reference to FIGS. 2B and 2C.

Figure 3A:
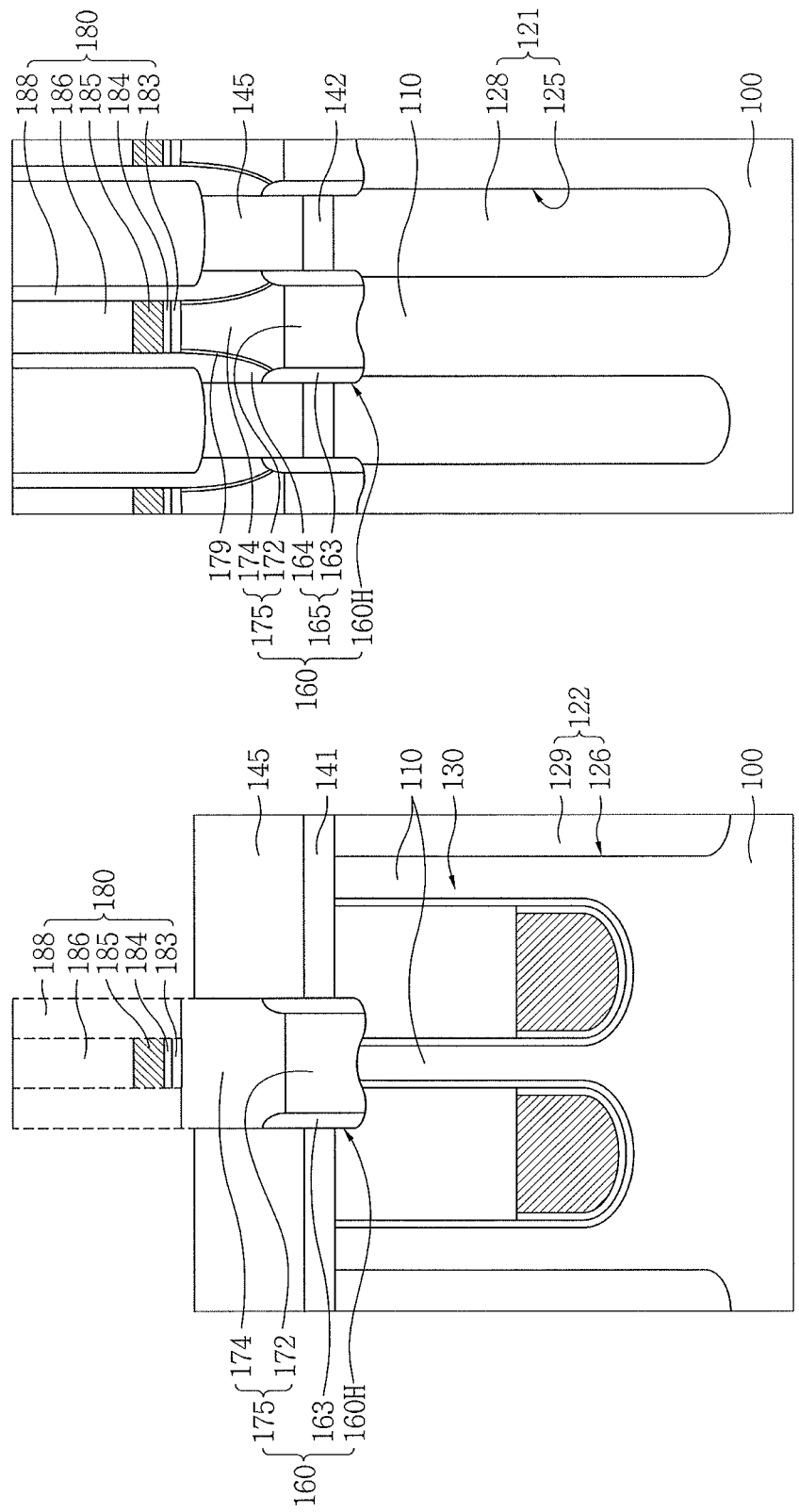
FIGS. 3A through 3D illustrate longitudinal sectional views of semiconductor devices according to various embodiments of the inventive concept.
Figure 3B:
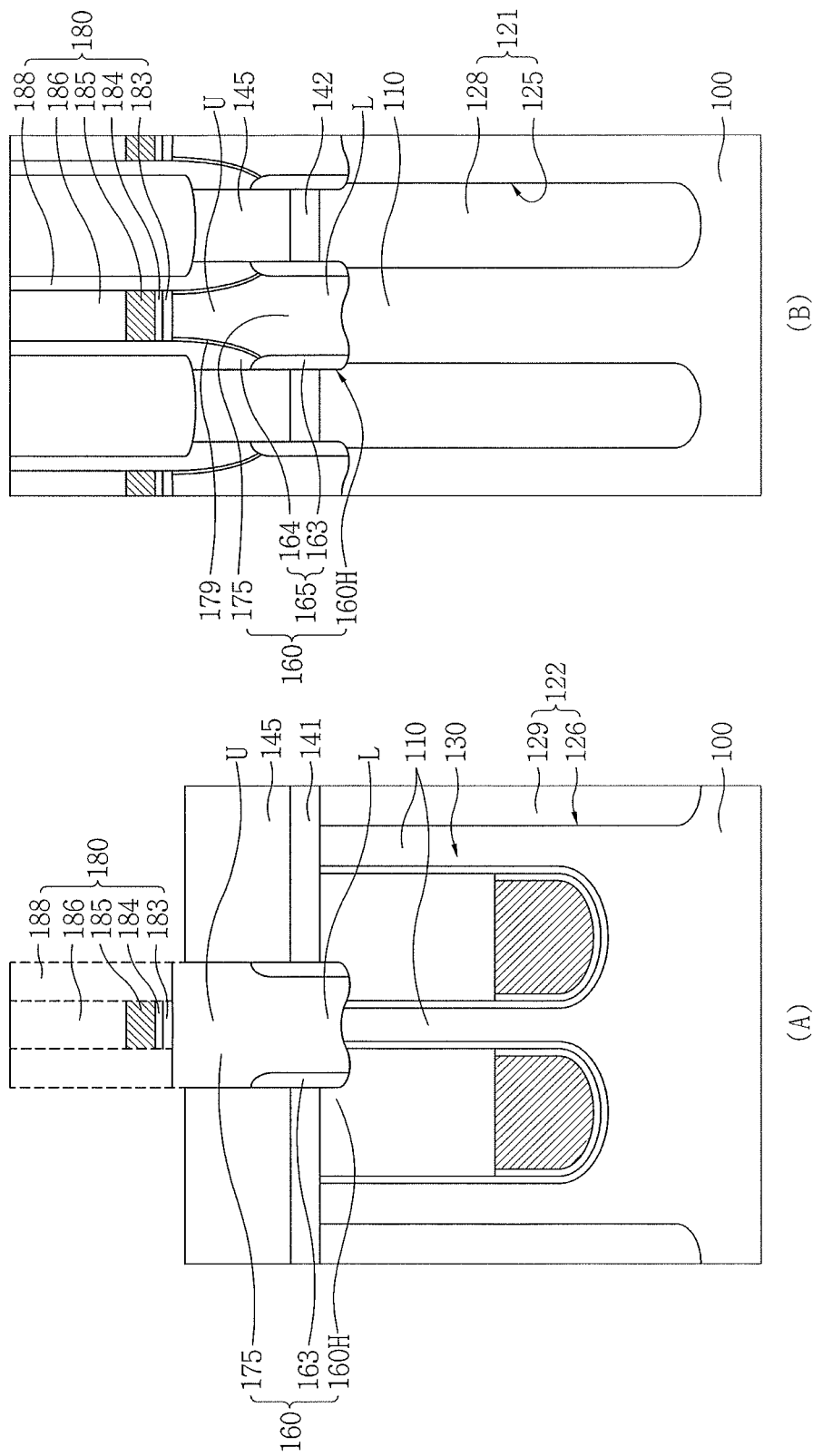

FIGS. 3A through 3D illustrate longitudinal sectional views of semiconductor devices according to other embodiments of the inventive concept. (A) of FIGS. 3A and 3B are longitudinal sectional views taken along line of FIG. 1B, and (B) of FIGS. 3A and 3B are longitudinal sectional views taken along line IV-IV' of FIG. 1B. In FIGS. 3A and 3B, dotted lines refer to diagonal longitudinal sections.

Referring to FIG. 3A, the semiconductor device 20 according to an embodiment of the inventive concept may include the active regions 110, field regions 120, and gate patterns 130, which may be formed in the substrate 100, and the DC structure 160 and bit line patterns 180, which may be formed on the substrate 100.

The field regions 120 may include the first field regions 121 and second field regions 122. The first field regions 121 may include first field trenches 125 and a first field insulating material 128 filling the first field trenches 125. The second field regions 122 may include second field trenches 126 and a second field insulating material 129 filling the second field trenches 126. The first field regions 121 may diagonally intersect the gate patterns 130. The second field regions 122 may be parallel to the gate patterns 130.

The landing pads 141 may be formed on portions of the substrate 100 corresponding to the respective active regions 110. Two DC structures 160 may be disposed on both sides of one fence 142. Lower DC spacers 163 of the respective DC structures 160 may be in direct contact with the fences 142. Two bit line patterns 180 may be parallel to each other across one fence 142. Two bit line patterns 180 may be disposed parallel to each other on both sides of an interlayer insulating layer 145 disposed on and vertically aligned with one fence 142. Bit line spacers 188 of the respective bit line patterns 180 may be in direct contact with the interlayer insulating layer 145 disposed on and vertically aligned with the fences 142. Undescribed elements may be understood in view of FIGS. 2A through 2F.

Referring to FIG. 3B, a semiconductor device 20B according to an embodiment of the inventive concept may include the active regions 110, field regions 120, and gate patterns 130, which may be formed in the substrate 100, and the DC structure 160' and bit line patterns 180, which may be formed on the substrate 100. The DC structure 160' may include the DC plug 175' having one materially continuous body. A detailed description of the semiconductor device of FIG. 3B may be understood with reference to FIG. 3A and the description thereof.

Figure 3C:
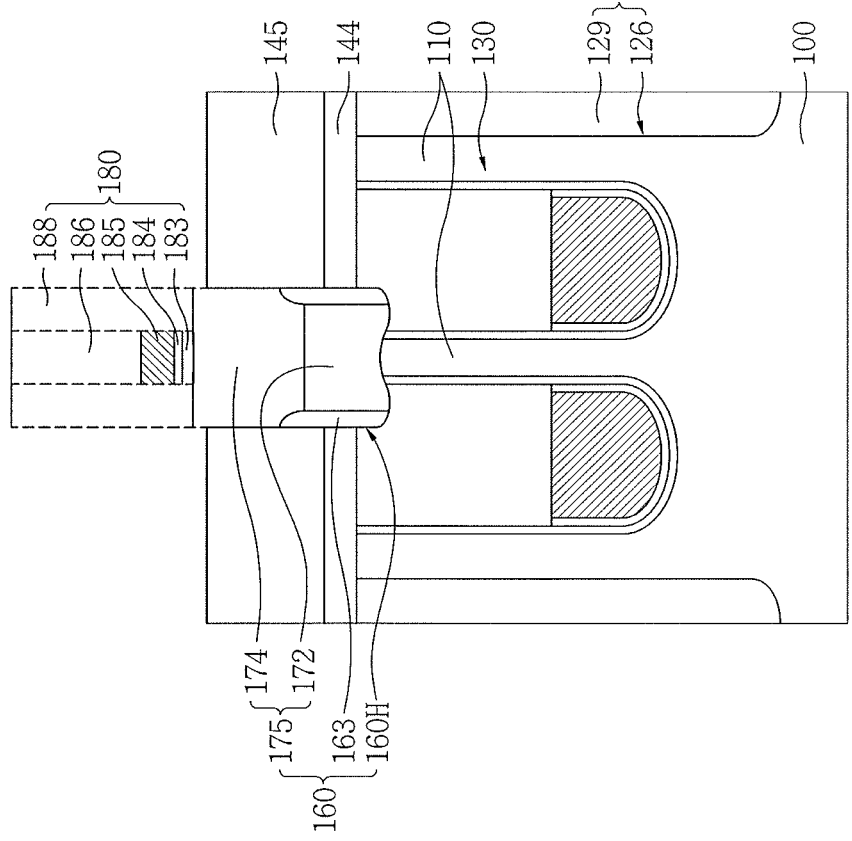

Referring to FIG. 3C, a semiconductor device 20A according to an embodiment of the inventive concept may include the active regions 110, field regions 120, and gate patterns 130, which may be formed in the substrate 100, the DC structure 160 and bit line patterns 180, which may be formed on the substrate 100, and the base insulating layer 144 formed on the substrate 100. For example, the landing pads 141 and fences 142 may be omitted. Two DC structures 160 may be disposed on both sides of one base insulating layer 144. Lower DC spacers 163 of respective DC structures 160 may be in direct contact with the base insulating layer 144. Two bit line patterns 180 may be disposed parallel to each other across one base insulating layer 144. Two bit line patterns 180 may be disposed parallel to each other on both sides of the interlayer insulating layer 145 disposed on and vertically aligned with the base insulating layer 144. Bit line spacers 188 of the bit line patterns 180 may be in direct contact with the interlayer insulating layer 145 disposed on and vertically aligned with the base insulating layer 144.

Figure 3D:
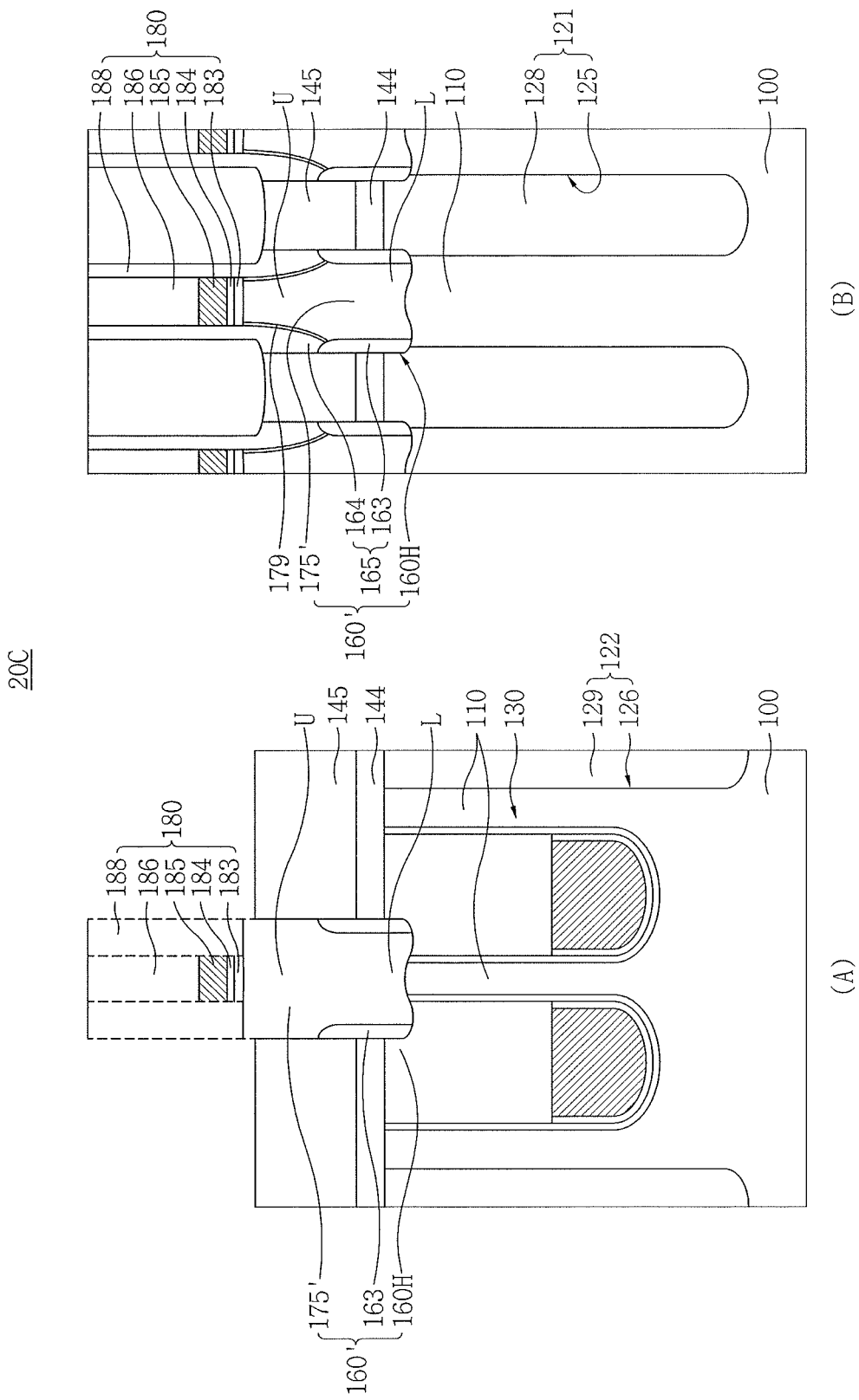

Referring to FIG. 3D, a semiconductor device 20C according to an embodiment of the inventive concept may include the active regions 110, field regions 120, and gate patterns 130, which may be formed in the substrate 100, the DC structure 160' and bit line patterns 180, which may be formed on the substrate 100, and the base insulating layer 144 formed on the substrate 100. The DC structure 160 may include the DC plug 175' having one materially continuous body.

FIGS. 4A through 4H illustrate flowcharts of methods of fabricating semiconductor devices according to embodiments of the inventive concept. FIGS. 5A through 5O illustrate longitudinal sectional views of a method of fabricating a semiconductor device according to an embodiment of the inventive concept.

Figure 4A:
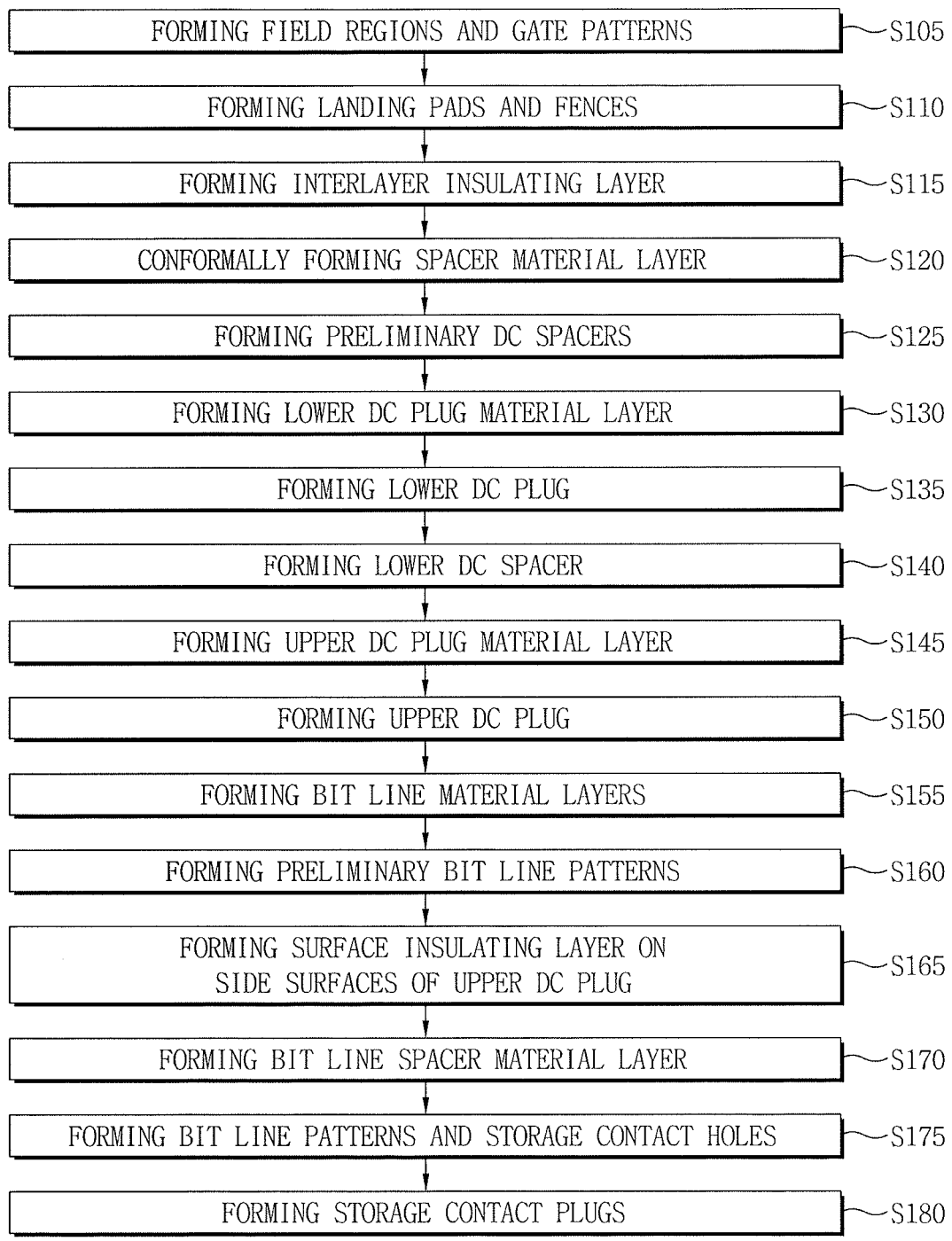

Referring to FIGS. 4A and 5A, a method of fabricating a semiconductor device according to an embodiment of the inventive concept may include forming the field regions 120 defining active regions in the substrate 100, and forming the gate patterns 130 in the substrate 100 (operation S105).

The formation of the field regions 120 may include forming field trenches 124 and filling the field trenches 124 with a field insulating material 127. For example, the field regions 120 may be formed using a shallow trench isolation (STI) technique. The field insulating material 127 may include undoped silicate glass (USG), tonensilazene (TOSZ), plasma-enhanced tetra ethyl ortho-silicate (PE-TEOS), a high-density-plasma (HDP) oxide, or various other silicon oxides. A thin silicon nitride liner may be formed on inner walls of the field regions 120.

The formation of the gate patterns 130 may include forming gate trenches 131 across the active regions 110, forming a gate insulating layer 133 by oxidizing inner walls of the gate trenches 131, forming gate barrier layers 135 and gate electrodes 137 in lower regions of the gate trenches 131, and forming a gate capping layer 139 in upper portions of the gate trenches 131. The gate barrier layers 135 may include Ti, TiN, Ta, TaN, WN, or other refractory metals or refractory metal compounds. The gate electrodes 137 may include a metal, such as tungsten (W). The gate capping layer 139 may include an insulating material, such as silicon nitride.

Figure 5B:
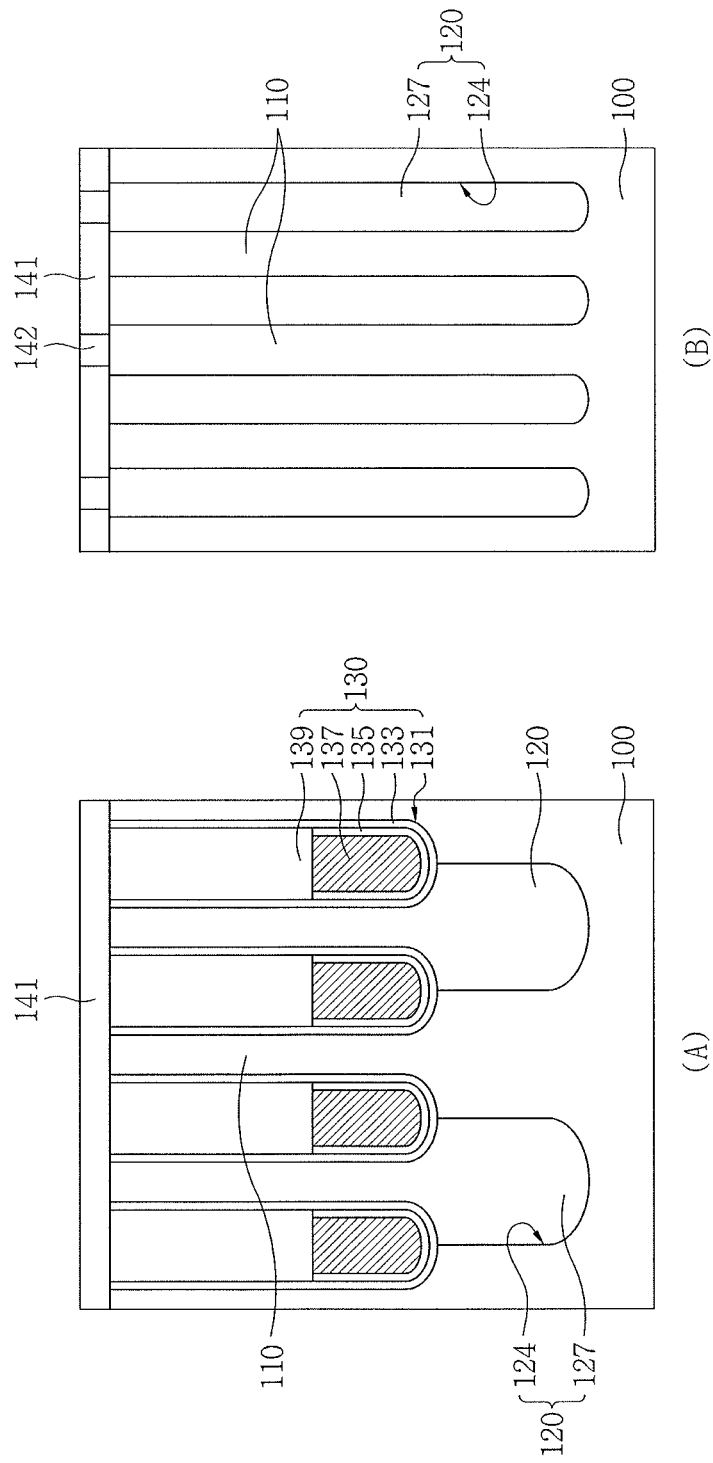

Referring to FIGS. 4A and 5B, the method of fabricating the semiconductor device according to the embodiment of the inventive concept may include forming landing pads 141 and fences 142 on the substrate 100 (operation S110). The landing pads 141 and the fences 142 may be formed in a plurality of lines disposed parallel to one another. The fences 142 may be formed between the landing pads 141. For instance, from a layout, the fences 142 may overlap bit line patterns 180 to be described later. Top surfaces of the landing pads 141 may form a planar surface with top surfaces of the fences 142. For example, the top surfaces of the landing pads 141 may be disposed at the same level as the top surfaces of the fences 142. The landing pads 141 may include a conductive material, e.g., poly-Si or single crystalline silicon. The fences 142 may include an insulating material, e.g., silicon nitride. Accordingly, the landing pads 141 may be materially separated and electrically insulated from one another by the fences 142.

Figure 5C:
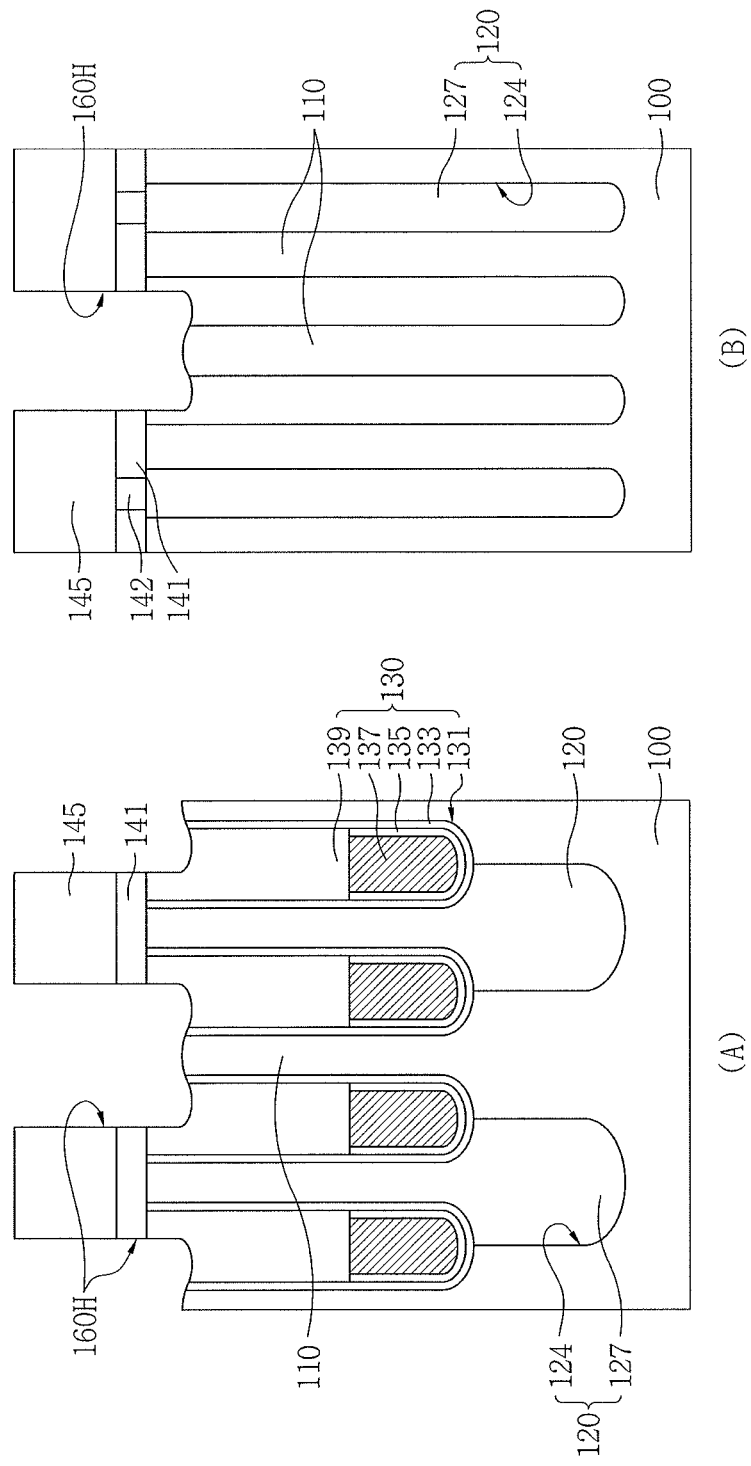

Referring to FIGS. 4A and 5C, the method of fabricating the semiconductor device according to the embodiment of the inventive concept may include forming the interlayer insulating layer 145 having DC holes 160H on the landing pads 141 and the fences 142 (operation S115). The DC holes 160H may vertically penetrate the interlayer insulating layer 145 and expose portions of the active region 110. Portions of the substrate 100 may be recessed in bottom surfaces of the DC holes 160H. The interlayer insulating layer 145, the landing pads 141, the fences 142, the active regions 110, the gate patterns 130 and/or portions of upper portions of the field regions 120 may be exposed by inner walls of the DC holes 160H. The active regions 110, the gate patterns 130, and/or portions of the upper portions of the field regions 120 may be exposed by the bottom surfaces of the DC holes 160H. Upper portions of the gate patterns 130 may include the gate insulating layer 133 and the gate capping layer 139. Accordingly, the gate insulating layer 133 and the gate capping layer 139 may be exposed by the inner walls and/or bottom surfaces of the DC holes 160H. The interlayer insulating layer 145 may include silicon oxide, e.g., an MTO.

Figure 5D:
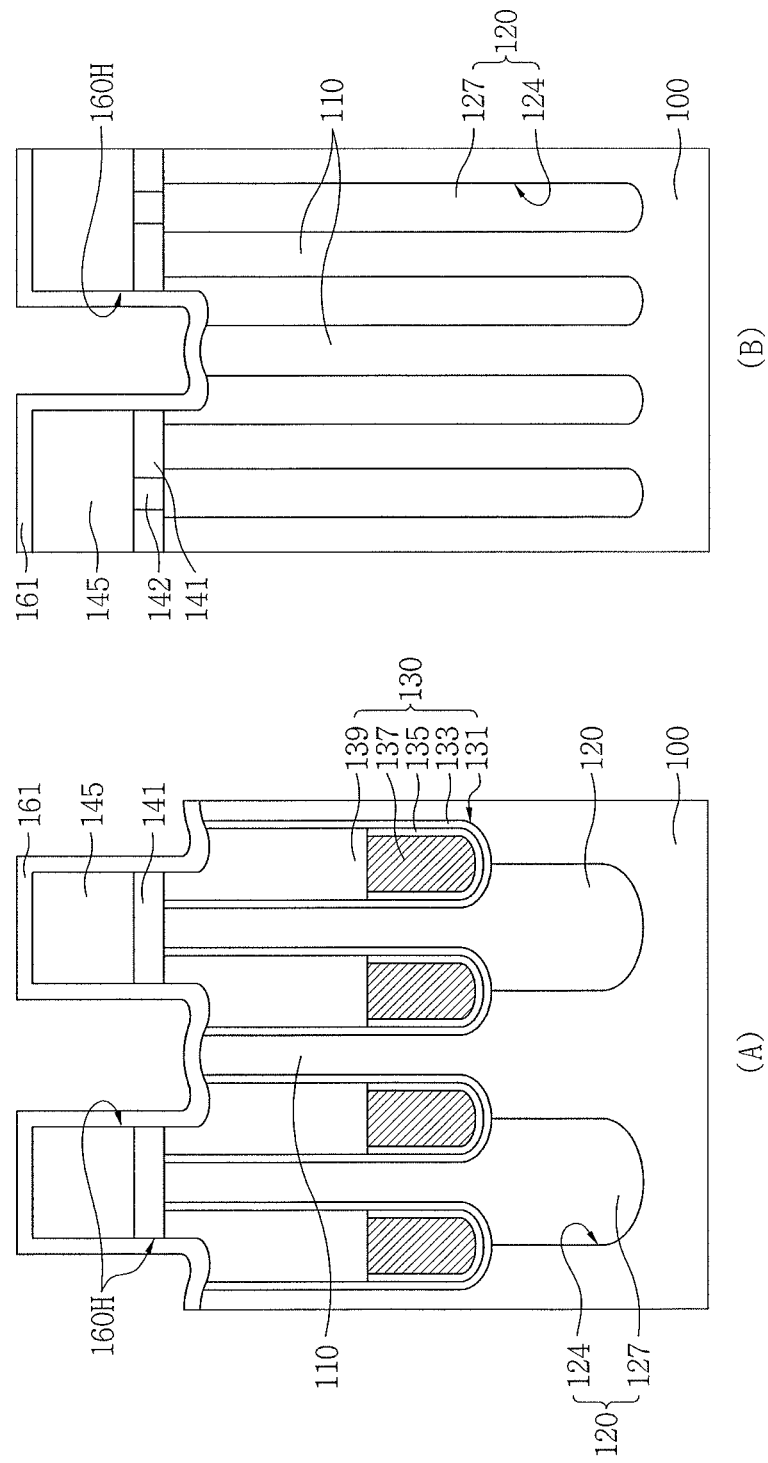

Referring to FIGS. 4A and 5D, the method of fabricating the semiconductor device according to the embodiment of the inventive concept may include conformally forming a DC spacer material layer 161 on a top surface of the interlayer insulating layer 145 and the inner walls and bottom surfaces of the DC holes 160H (operation S120). The DC spacer material layer 161 may include, e.g., silicon nitride.

Figure 5E:
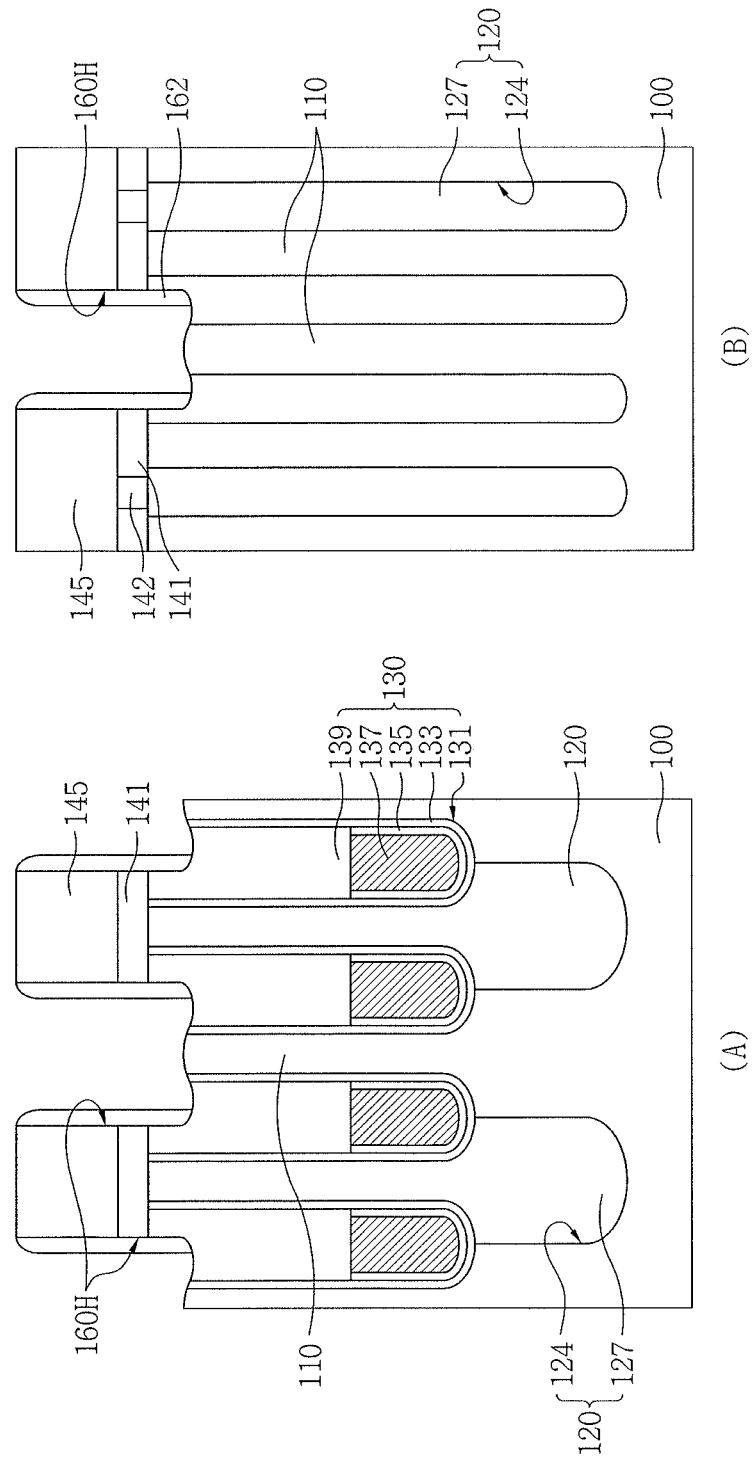

Referring to FIGS. 4A and 5E, the method of fabricating the semiconductor device according to the embodiment of the inventive concept may include forming preliminary DC spacers 162 on the inner walls of the DC holes 160H (operation S125). The formation of the preliminary DC spacers 162 may include partially removing an upper portion of the DC spacer material layer 161 using an etchback process, e.g., an anisotropic etching process, to partially leave the DC spacer material layer 161 only on the inner walls of the DC holes 160H. The DC spacer material layer 161 may be removed from the top surface of the interlayer insulating layer 145 and the bottom surfaces of the DC holes 160H. During this process, the top surface of the interlayer insulating layer 145 and the bottom surfaces of the DC holes 160H may be further recessed.

Figure 5F:
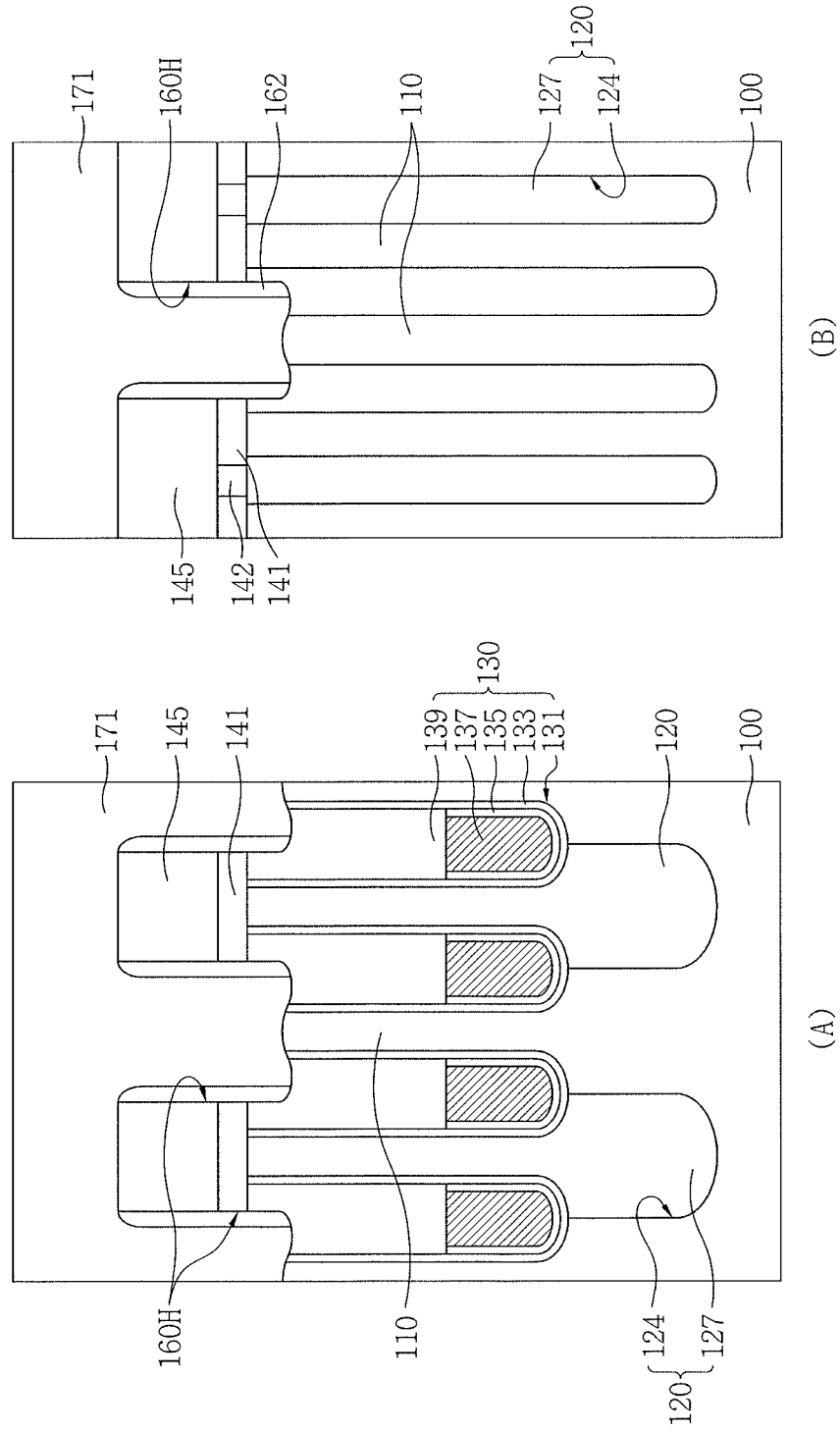

Referring to FIGS. 4A and 5F, the method of fabricating the semiconductor device according to the embodiment of the inventive concept may include forming a lower DC plug material layer 171 to completely fill the DC holes 160H (operation S130). The lower DC plug material layer 171 may include a metal silicide containing sufficiently heavily doped poly-Si, epitaxially grown single crystalline silicon, tungsten, titanium, nickel (Ni), or cobalt (Co), or a metal.

Figure 5G:
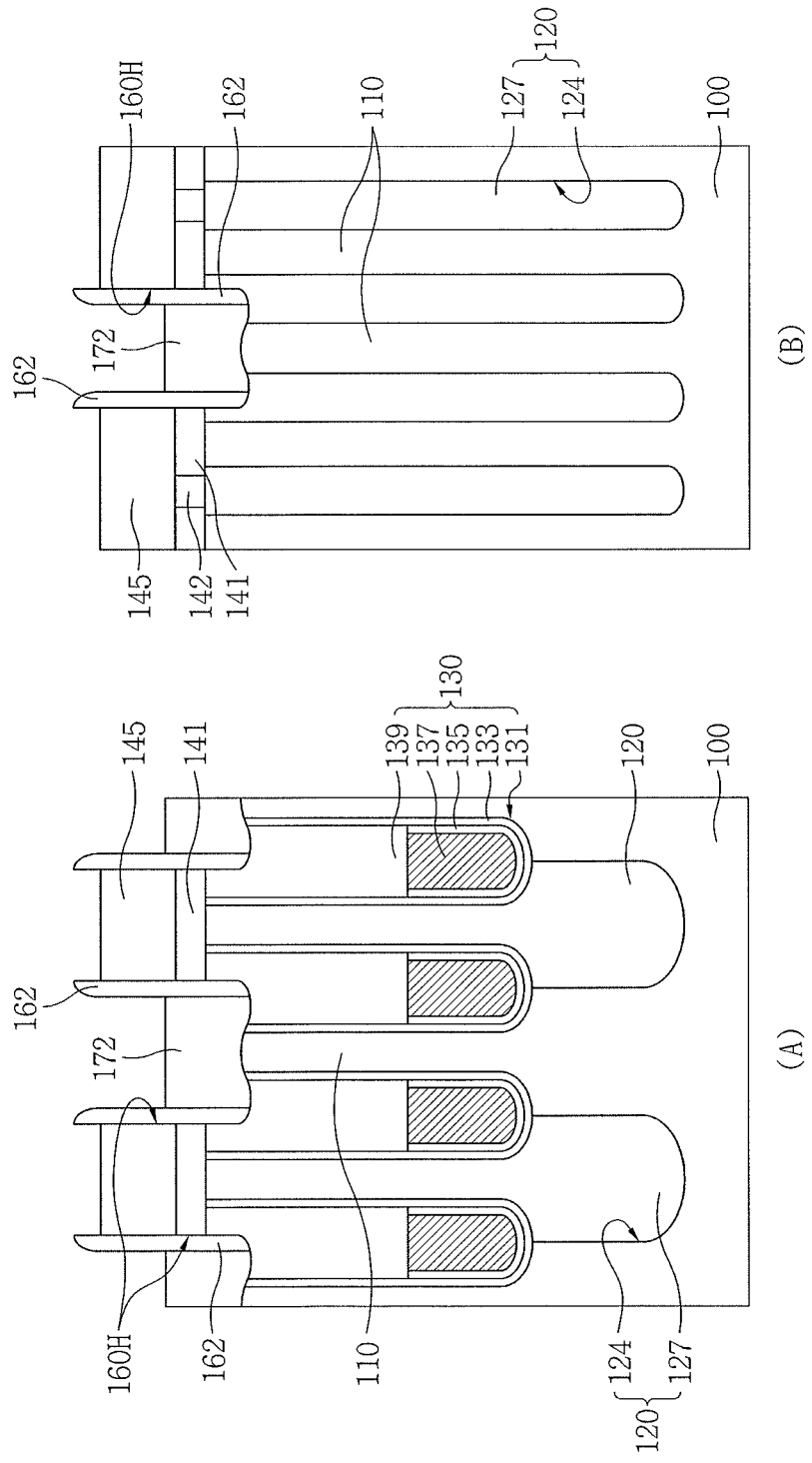

Referring to FIGS. 4A and 5G, the method of fabricating the semiconductor device according to the embodiment of the inventive concept may include removing an upper portion of the lower DC plug material layer 171 to form a lower DC plug 172 (operation S135). The removal of the upper portion of the lower DC plug material layer 171 may include performing an etchback process. The surface of the lower DC plug 172 may be recessed to a lower level than a top end of the DC hole 160H. For brevity, it is illustrated that the surface of the DC plug 172 is recessed to a lower level than half the DC hole 160H. During this process, the top surface of the interlayer insulating layer 145 may be slightly recessed. For example, top ends of the preliminary DC spacers 162 may protrude upward from, e.g., above, the top surface of the interlayer insulating layer 145.

Figure 5H:
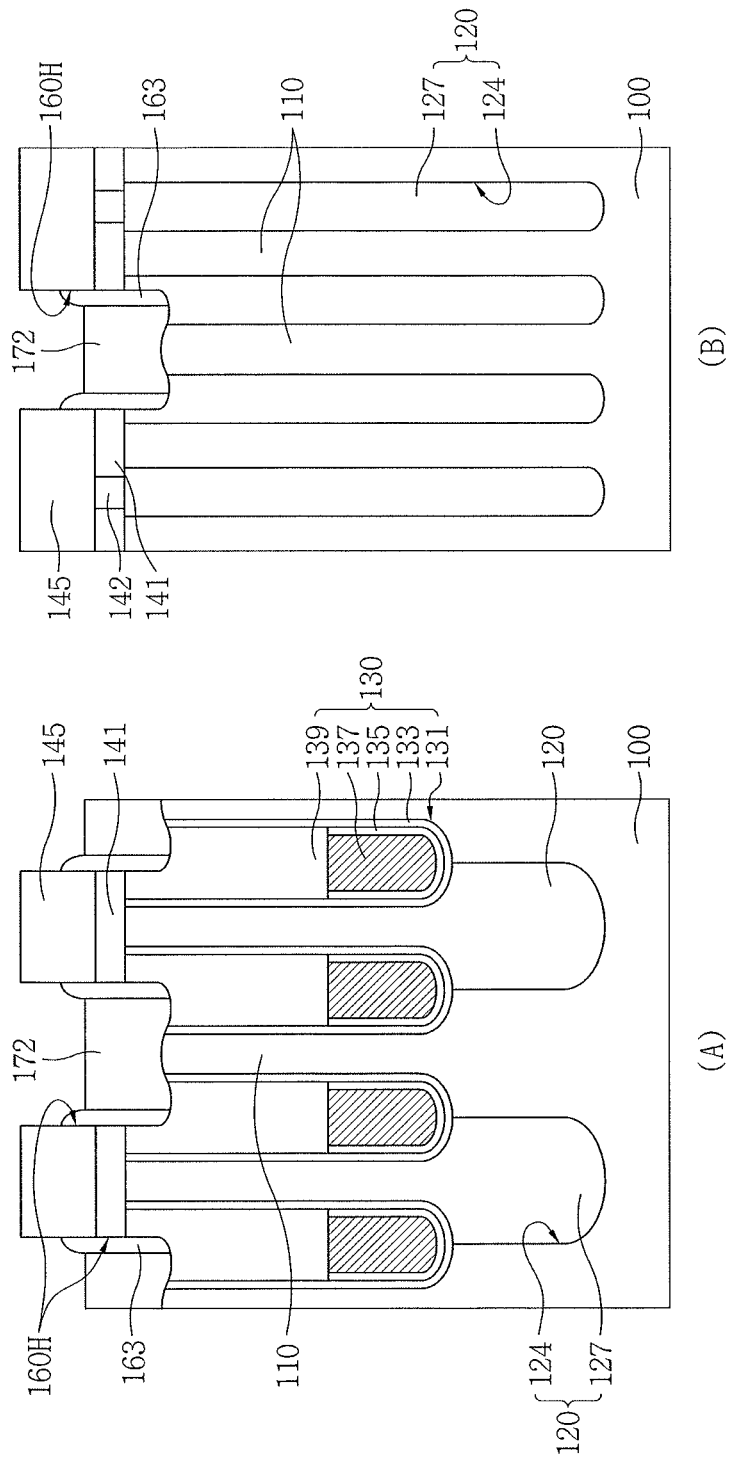

Referring to FIGS. 4A and 5H, the method of fabricating the semiconductor device according to the embodiment of the inventive concept may include forming a lower DC spacer 163 by removing an upper portion of the preliminary DC spacer 162 (operation S140). The removal of the upper portion of the preliminary DC spacer 162 may include a wet etching process using an etchant containing phosphoric acid ($H_3PO_4$), or a dry etching process using gas containing a halogen, such as fluorine (F—). A top end of the lower DC spacer 163 may protrude upward from, e.g., above, a top surface of the lower DC plug 172. Due to this process, an upper portion of the DC hole 160H may be wider than a lower region thereof.

Figure 5I:
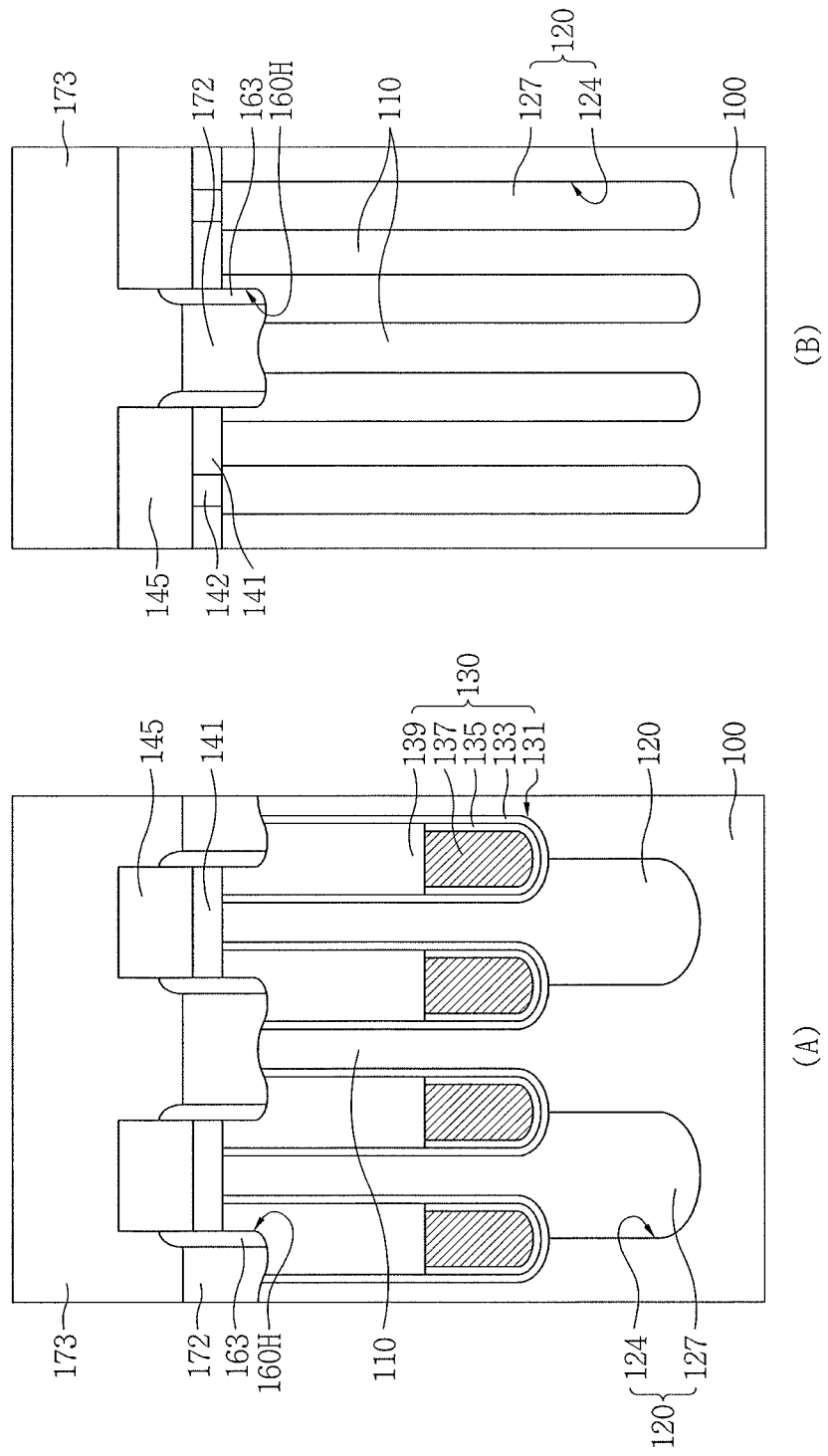

Referring to FIGS. 4A and 5I, the method of fabricating the semiconductor device according to the embodiment of the inventive concept may include forming an upper DC plug material layer 173 to completely fill the DC hole 160H and directly contact the lower DC plug 172 (operation S145). The lower DC plug material layer 171 my include a metal silicide containing sufficiently heavily doped poly-Si, epitaxially grown single crystalline silicon, tungsten, titanium nickel or cobalt or a metal. Before forming the upper DC plug material layer 173, a cleaning process may be performed. For example, before forming the upper DC plug material layer 173, a cleaning process for removing a native oxide that may potentially be formed on the top surface of the lower DC plug 172 may be performed. Due to the cleaning process, the surface of the interlayer insulating layer 145 may be slightly recessed. The cleaning process may include a wet cleaning process using diluted fluoric acid.

Figure 5J:
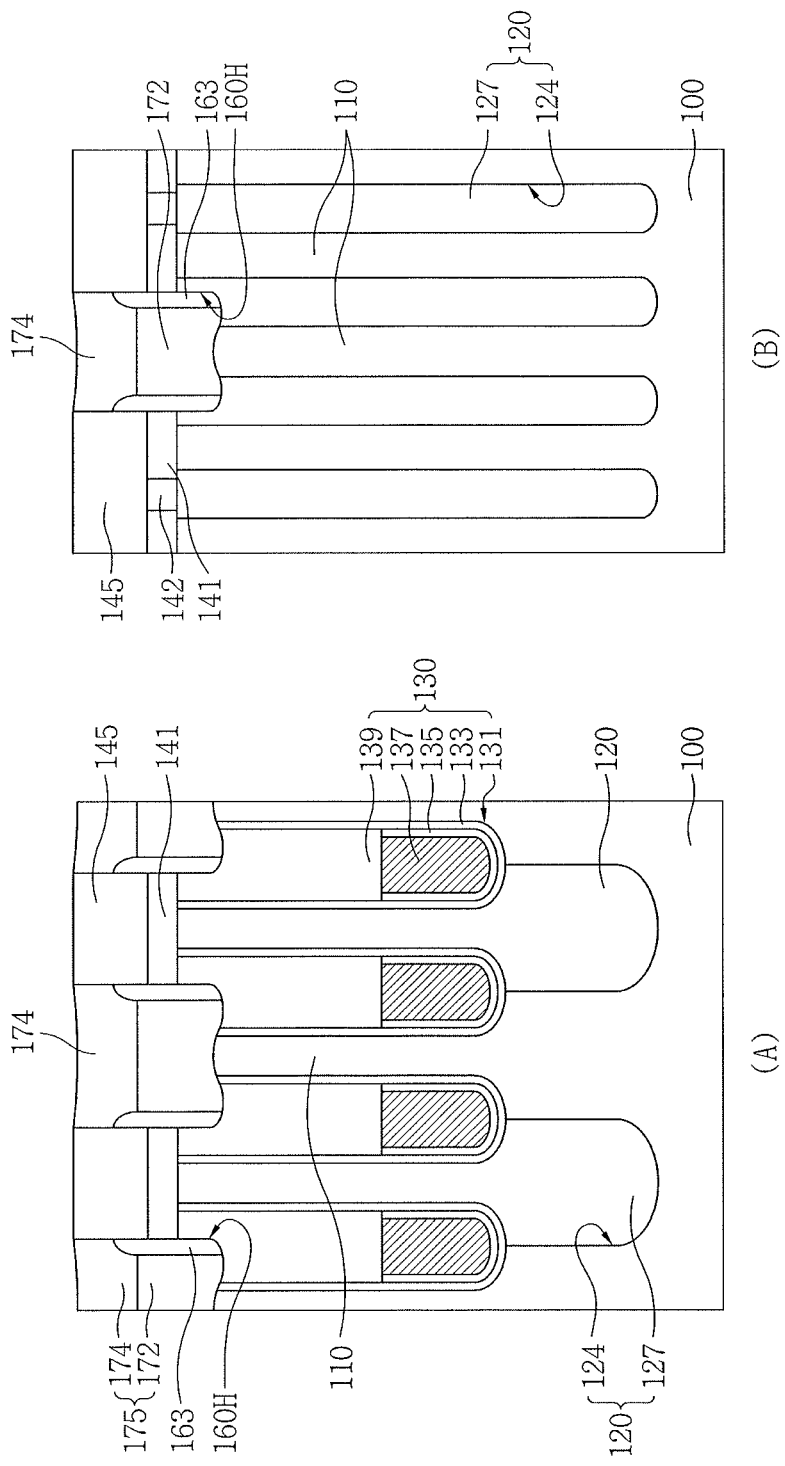

Referring to FIGS. 4A and 5J, the method of fabricating the semiconductor device according to the embodiment of the inventive concept may include forming an upper DC plug 174 by removing an upper portion of the upper DC plug material layer 173 (operation S150). The removal of the upper portion of the upper DC plug material layer 173 may include performing an etchback process or a chemical mechanical polishing (CMP) process. The upper DC plug 174 may be confined within the DC hole 160H. For example, a top surface of the upper DC plug 174 may be disposed at the same level as or at a slightly lower level than a top surface of the interlayer insulating layer 145.

Referring to FIGS. 4A and 5K, the method of fabricating the semiconductor device according to the embodiment of the inventive concept may include forming bit line material layers 181 (operation S155). The formation of the bit line material layers 181 may include forming the bit line barrier layer 182 in direct contact with the upper DC plug 174, forming the bit line electrode 185 on the bit line barrier layer 182, and forming the bit line capping layer 186 on the bit line electrode 185. The formation of the bit line barrier layer 182 may include forming the lower bit line barrier layer 184 in direct contact with the upper DC plug 174, and forming the upper bit line barrier layer 184 on the lower bit line barrier layer 183. The formation of the lower bit line barrier layer 183 may include forming a metal silicide layer, e.g., a tungsten silicide layer. The formation of the upper bit line barrier layer 184 may include forming Ti, TiN, Ta, TaN, WN, or other refractory metal or metal compound layers. The formation of the bit line electrode 185 may include forming a metal layer, e.g., a tungsten layer. The formation of the bit line capping layer 186 may include forming an insulating material, e.g., silicon nitride, denser than silicon oxide. Before forming the bit line material layers 181, a cleaning process may be performed. For example, before forming the lower bit line barrier layer 183, a cleaning process for removing a native oxide that may possibly be formed on the top surface of the upper DC plug 174 may be performed. Due to the cleaning process, the surface of the interlayer insulating layer 145 may be slightly recessed. The cleaning process may include a wet cleaning process using a diluted fluoric acid.

Figure 5L:
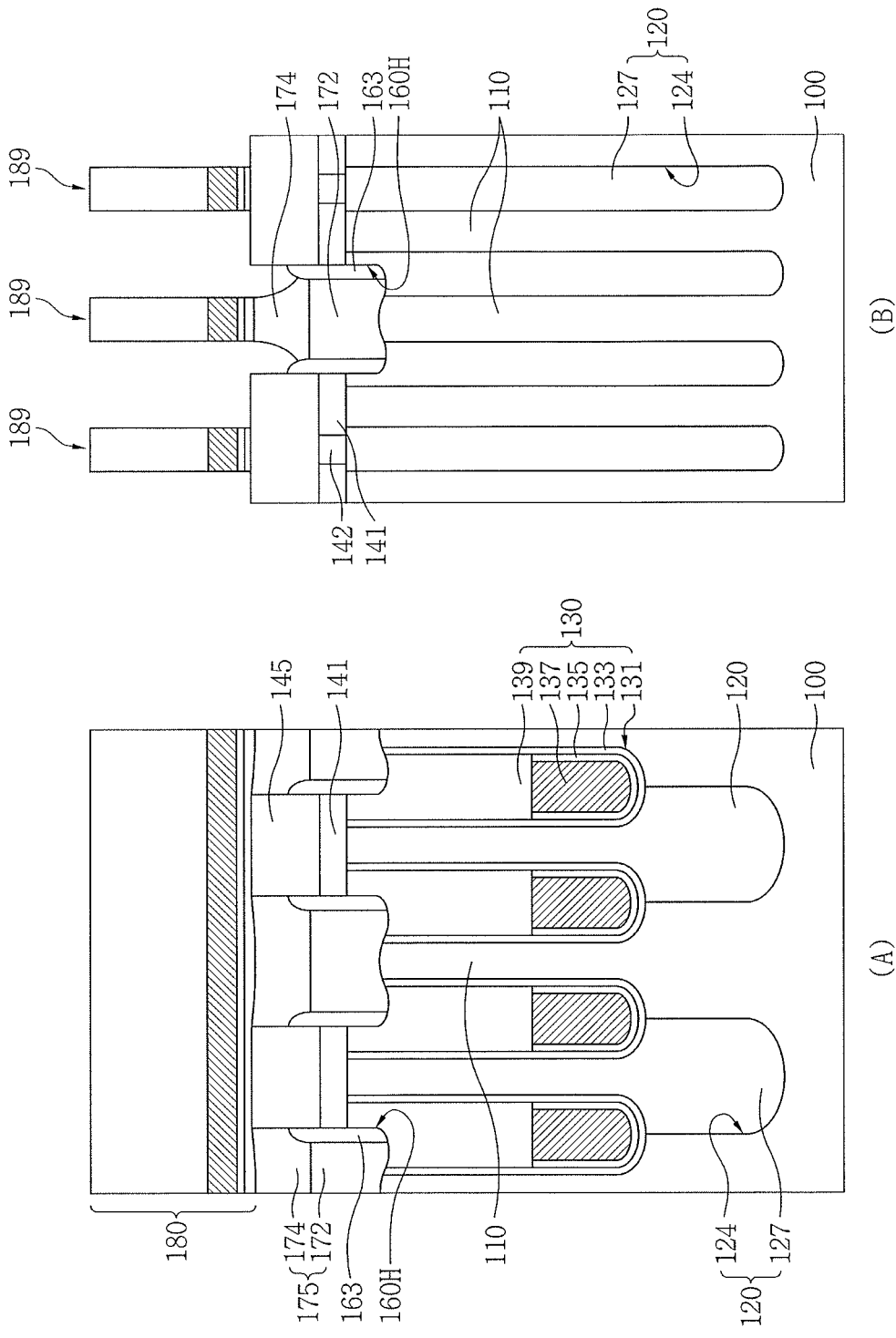
Figure 50:
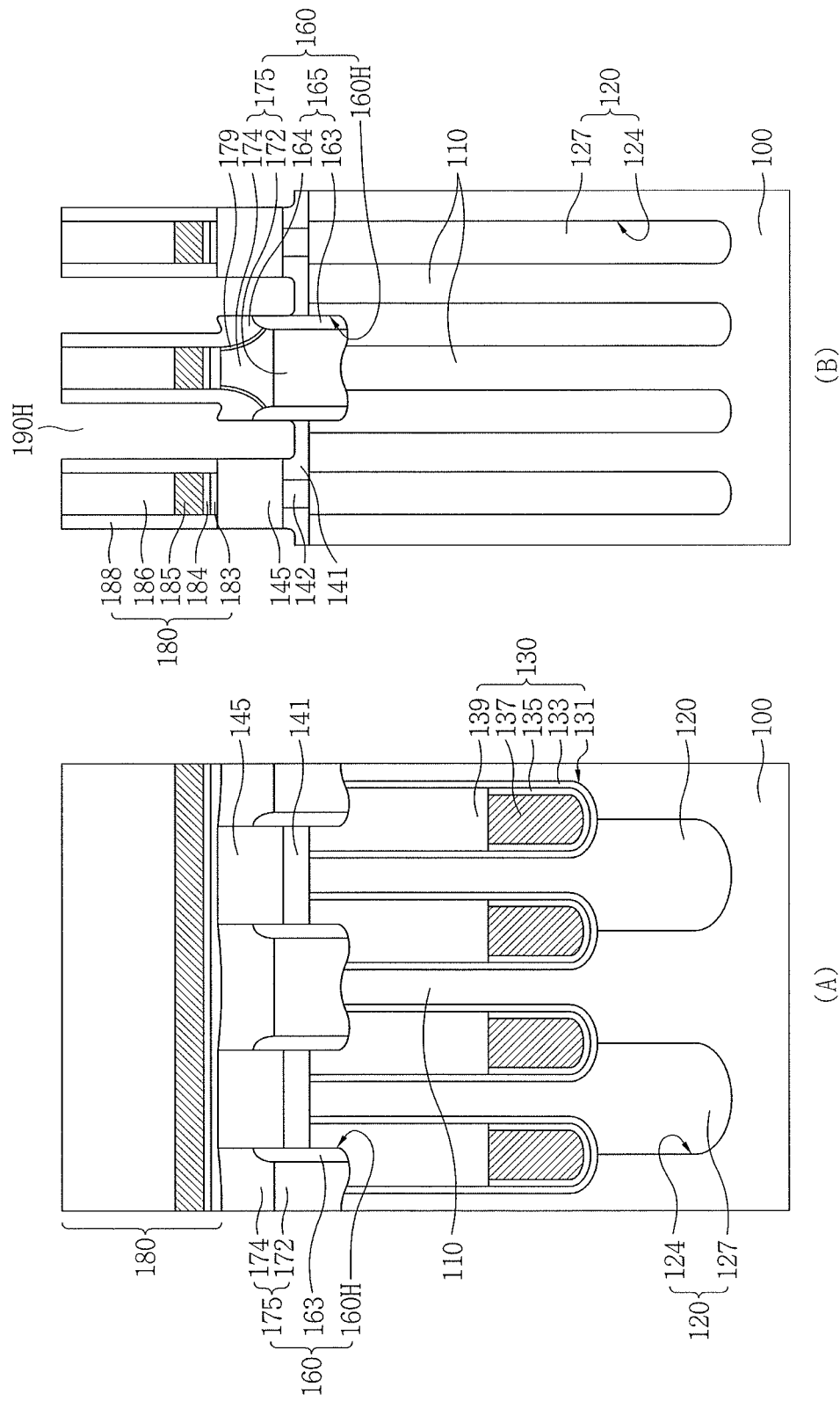

Referring to FIGS. 4A and (B) of FIG. 5L, the method of fabricating the semiconductor device according to the embodiment of the inventive concept may include forming a plurality of preliminary bit line patterns 189 parallel to one another by patterning the bit line material layers 181 (operation S160). During this process, the top surface of the interlayer insulating layer 145 may be exposed. During this process, a portion of the upper DC plug 174 filling the DC hole 160H may be removed. For instance, a portion of an upper portion of the inner wall of the DC hole 160H may be exposed. A portion of the upper portion of the lower DC spacer 163 may be exposed. Side surfaces of the upper DC plug 174 may be exposed. The upper DC plug 174 may be modified into a shape having a narrow upper portion and a wide lower portion. For example, portions of the side surfaces of the upper DC plug 174 may taper. Referring to (A) of FIG. 4L, the upper DC plug 174 may be maintained intact in a first direction parallel to the preliminary bit line patterns 189.

Referring to FIGS. 4A and (B) of FIG. 5M, the method of fabricating the semiconductor device according to the embodiment of the inventive concept may include forming a surface insulating layer 179 on exposed side surfaces of the upper DC plug 174 (operation S165). The formation of the surface insulating layer 179 may include thinly oxidizing the exposed side surfaces of the upper DC plug 174.

Referring to FIGS. 4A and (B) of FIG. 5N, the method of fabricating the semiconductor device according to the embodiment of the inventive concept may include forming a bit line spacer material layer 187 to surround the preliminary bit line patterns 189 (operation S170). The formation of the bit line spacer material layer 187 may include conformally forming a material (e.g., silicon nitride), which is denser than silicon oxide, using a chemical vapor deposition (CVD) process. The bit line spacer material layer 187 may fill an upper portion of the DC hole 160H. The bit line spacer material layer 187 may be directly formed on oxidized surfaces of the upper DC plug 174. A bottom end of the bit line spacer material layer 187 may be in direct contact with a top end of the lower DC spacer 163. A dent D may be formed near an entrance of the DC hole 160H according to the formed thickness of the bit line spacer material layer 187. In other embodiments, when the bit line spacer material layer 187 is formed to a sufficient large thickness, the dent D may not be formed.

Referring to FIGS. 4A and (B) of FIG. 5O, the method of fabricating the semiconductor device according to the embodiment of the inventive concept may include forming bit line patterns 180 and storage contact holes 190H (operation S175). The formation of the bit line patterns 180 and the storage contact holes 190H may include etching back the bit line spacer material layer 187 and/or the bit line capping layer 186. The bit line spacer material layer 187 may be modified into a bit line spacer 188 to form a bit line pattern 180. During this process, top surfaces of adjacent landing pads 141 may be exposed by side surfaces of the lower DC spacers 163. Also, top surfaces of the landing pads 141 may be partially recessed. The bit line spacer material layer 187 may remain on the upper portion of the inner wall of the DC hole 160H and may be modified into an upper DC spacer 164. Dents D may be formed at entrance regions of the DC hole 160H. In other embodiments, when the bit line spacer material layer 187 sufficiently covers the DC hole 160H, the dents D may not be formed.

Referring back to FIGS. 4A and 2A, the method of fabricating the semiconductor device according to the embodiment of the inventive concept may include forming storage contact plugs 190 to fill the storage contact holes 190H (operation S180). The formation of the storage contact plugs 190 may include forming a conductive material, such as doped poly-Si or a metal, within the storage contact holes 190H using a CVD process. Afterward, the method may include isolating the conductive material using an etchback process or a CMP process, such that adjacent storage contact plugs 190 are not materially and electrically connected to one another on the bit line patterns 180.

Figure 6A:
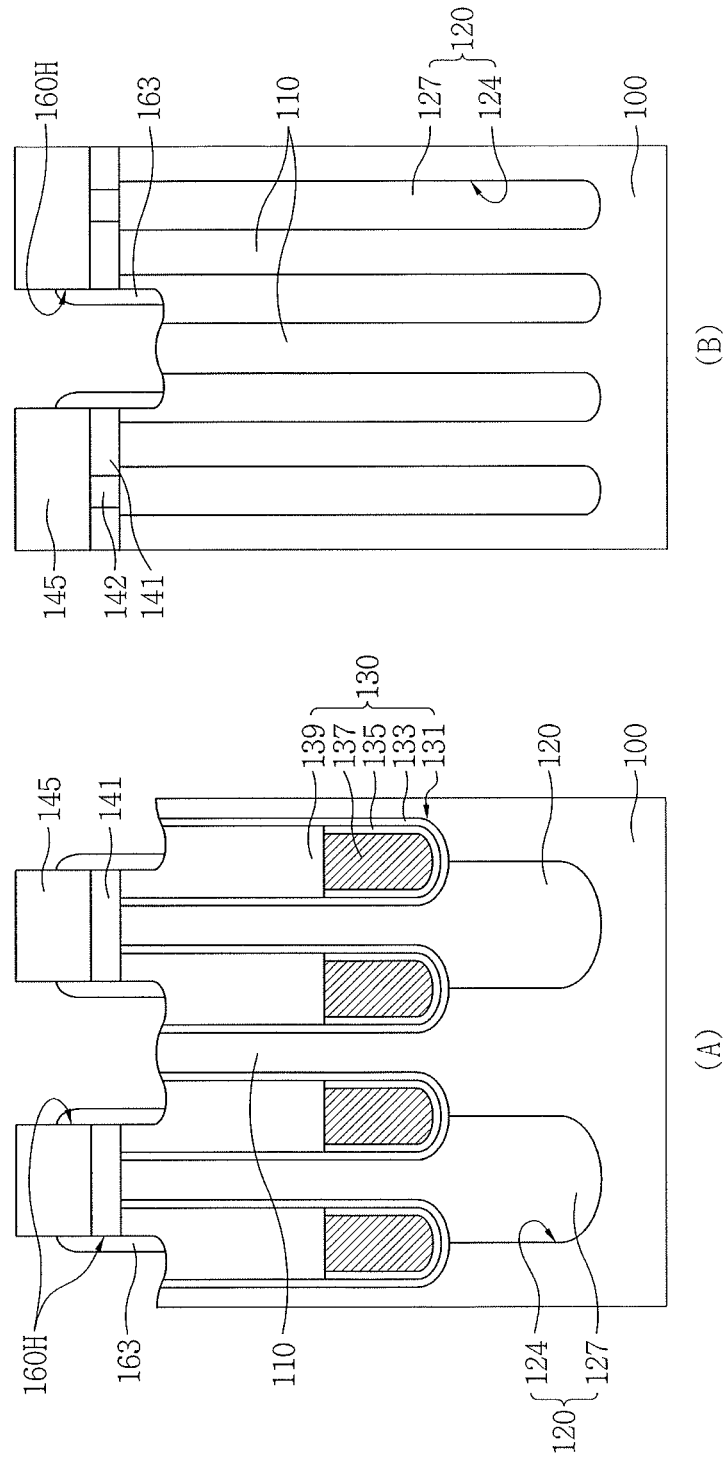
Figure 6B:
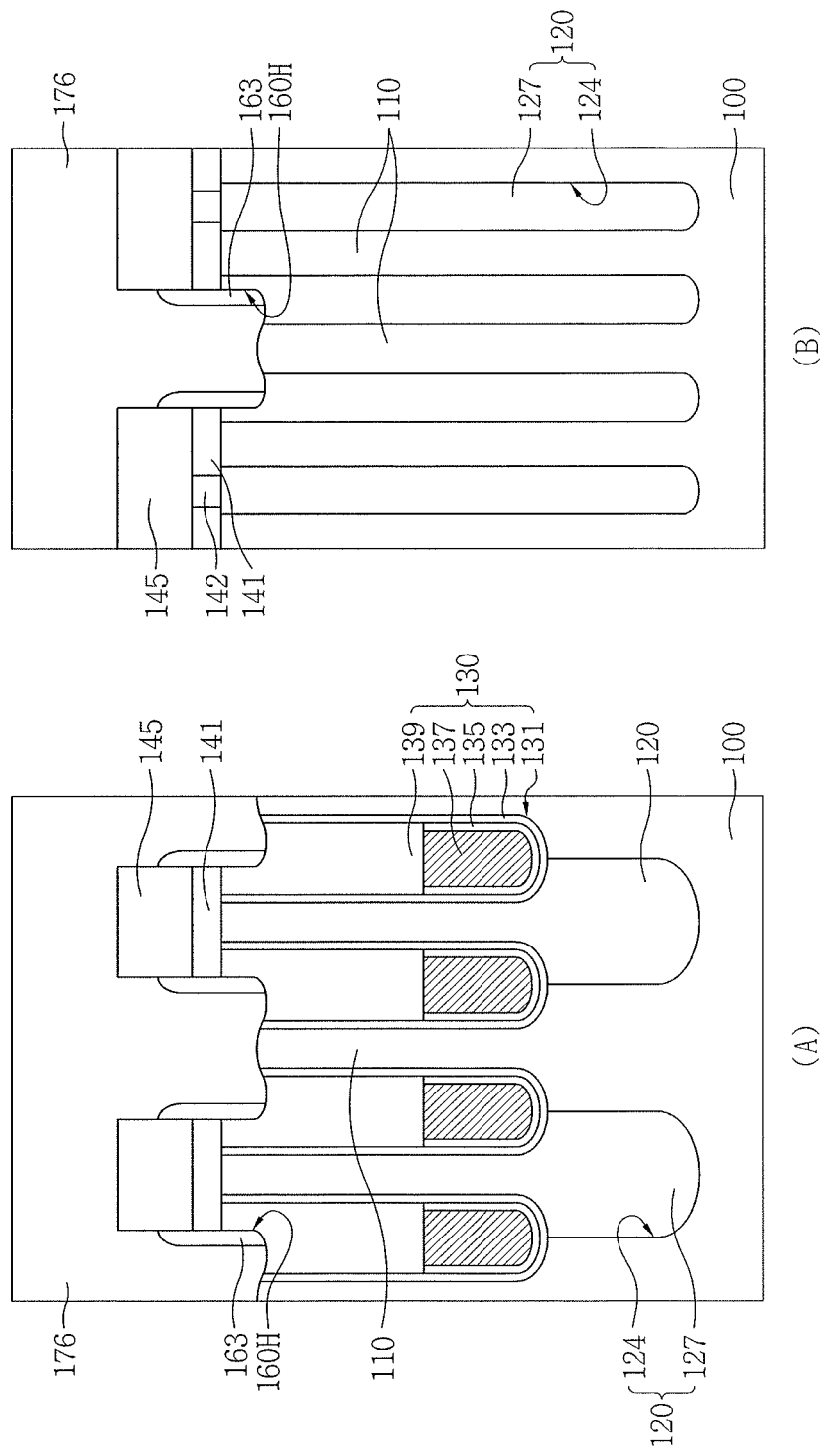
Figure 6C:
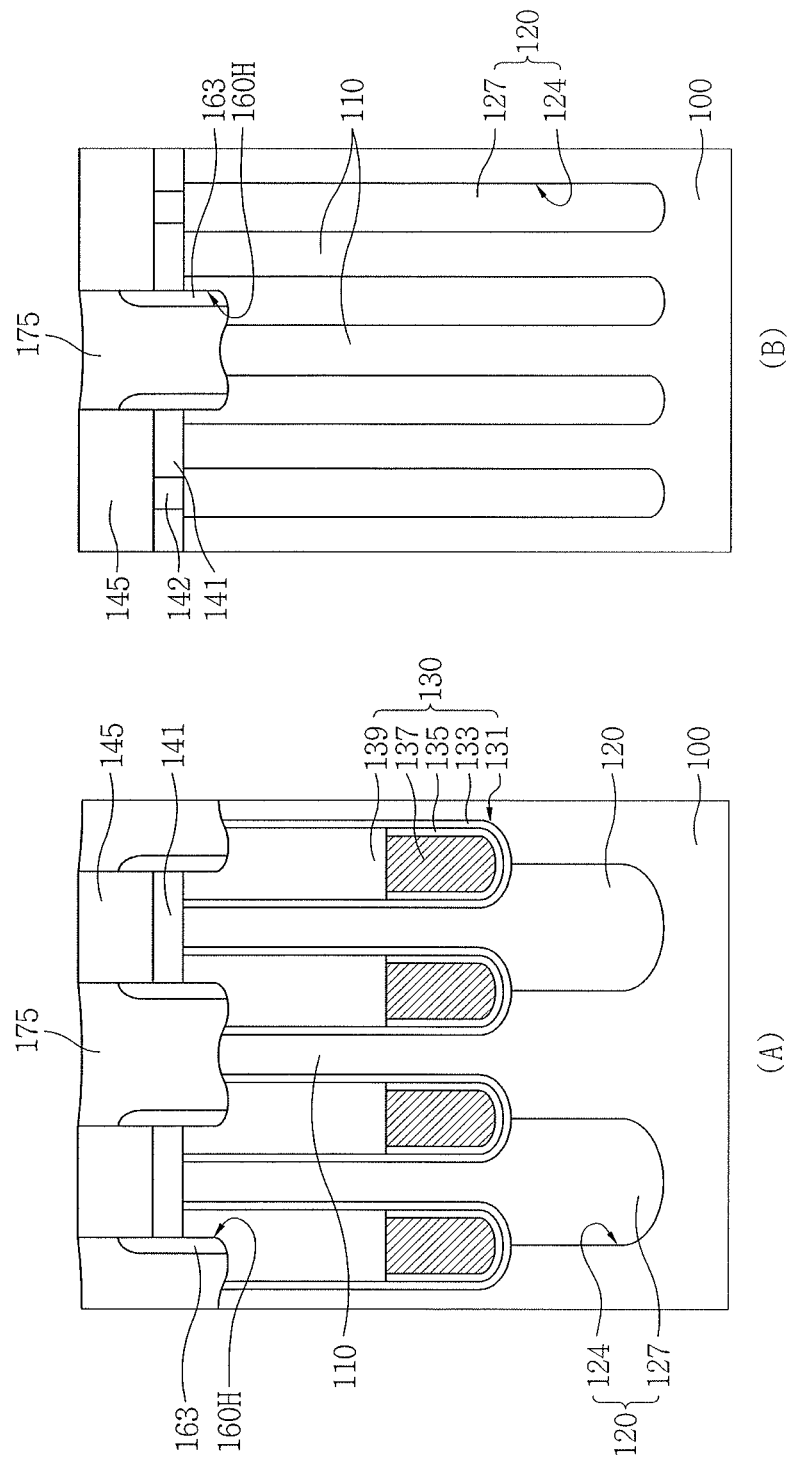

FIGS. 6A through 6C illustrate longitudinal sectional views of a method of fabricating a semiconductor device according to an embodiment of the inventive concept.

Referring to FIGS. 4B and 6A and referring back to FIGS. 5A through 5D and descriptions thereof, the method of fabricating the semiconductor device according to the embodiment of the inventive concept may include forming the field regions 120 defining active regions 110 in the substrate 100 and forming the gate patterns 130 in the substrate 100 (operation S205), forming the landing pads 141 and fences 142 on the substrate 100 (operation S210), forming the interlayer insulating layer 145 having the DC hole 160H on the landing pads 141 and the fences 142 (operation S215), conformally forming the DC spacer material layer 161 on the top surface of the interlayer insulating layer 145 and the inner wall and bottom surface of the DC hole 160H (operation S220), and forming the lower DC spacer 163 within the DC hole 160H by directly removing an upper portion of the DC spacer material layer 161 (operation S225). The formation of the lower DC spacer 163 may include etching back the DC spacer material layer 161 using an isotropic etching process.

Referring to FIGS. 4B and 6B and referring back to FIG. 5F and the description thereof, the method of fabricating the semiconductor device according to the embodiment of the inventive concept may include forming a DC plug material layer 175 to completely fill the DC hole 160H (operation S230).

Referring to FIGS. 4B and 6C and referring back to FIG. 5J and the description thereof, the method of fabricating the semiconductor device according to the embodiment of the inventive concept may include forming the DC plug 175 by removing an upper portion of the DC plug material layer 176 (operation S235). The DC plug 175 may be confined within the DC hole 160H.

Subsequently, referring to FIGS. 4B and 5K through 5O, the method of fabricating the semiconductor device according to the embodiment of the inventive concept may include forming the bit line material layers 181 (operation S240), forming the plurality of preliminary bit line patterns 189 parallel to one another by patterning the bit line material layers 181 (operation S245), forming the surface insulating layer 179 on exposed side surfaces of the upper DC plug 174 (operation S250), forming the bit line spacer material layer 187 to surround the preliminary bit line patterns 189 (operation S255), and forming the bit line patterns 180 and storage contact holes 190H (operation S260). Thereafter, referring back to FIGS. 4B and 2D, the method may include forming storage contact plugs 190 to fill the storage contact holes 190H (operation S265).

Figure 7B:
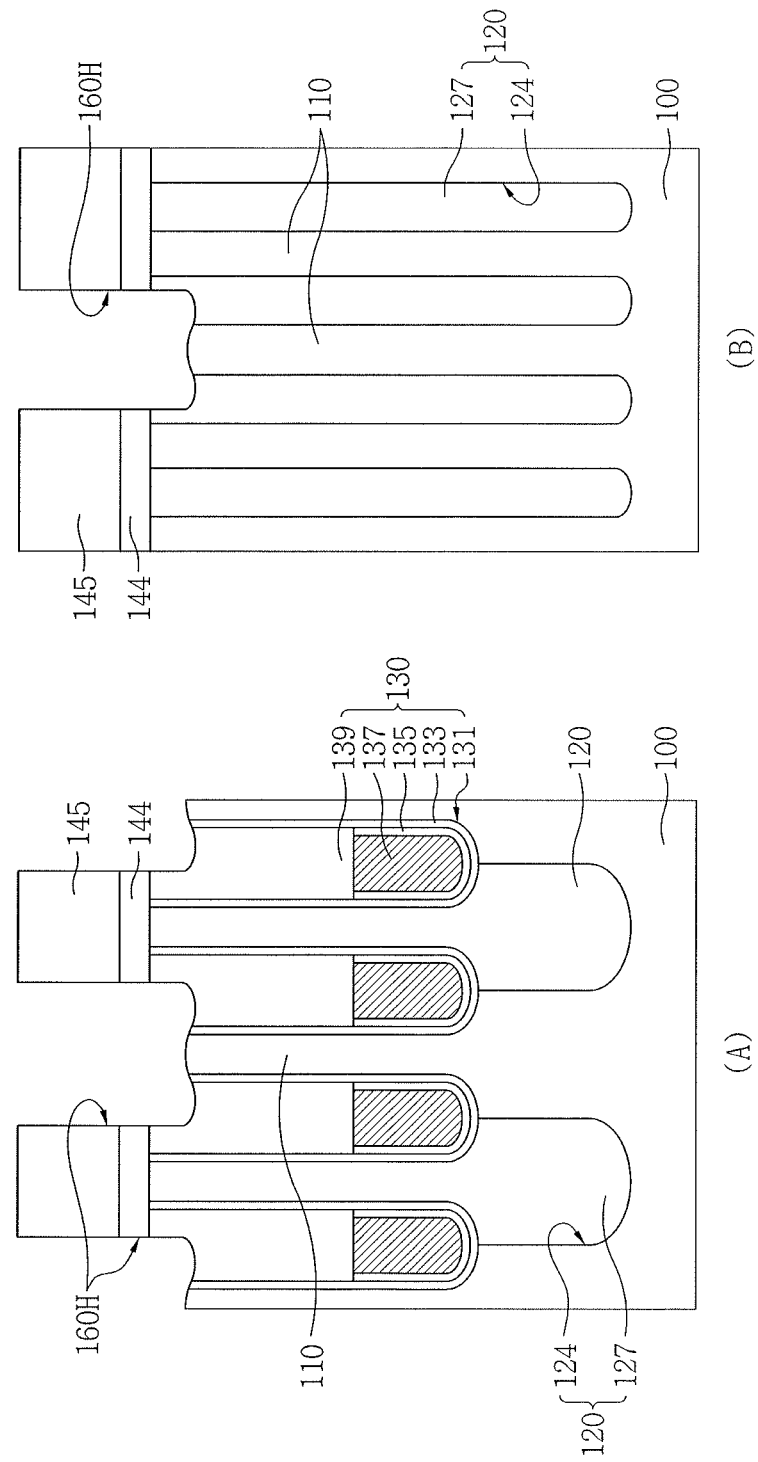
Figure 7C:
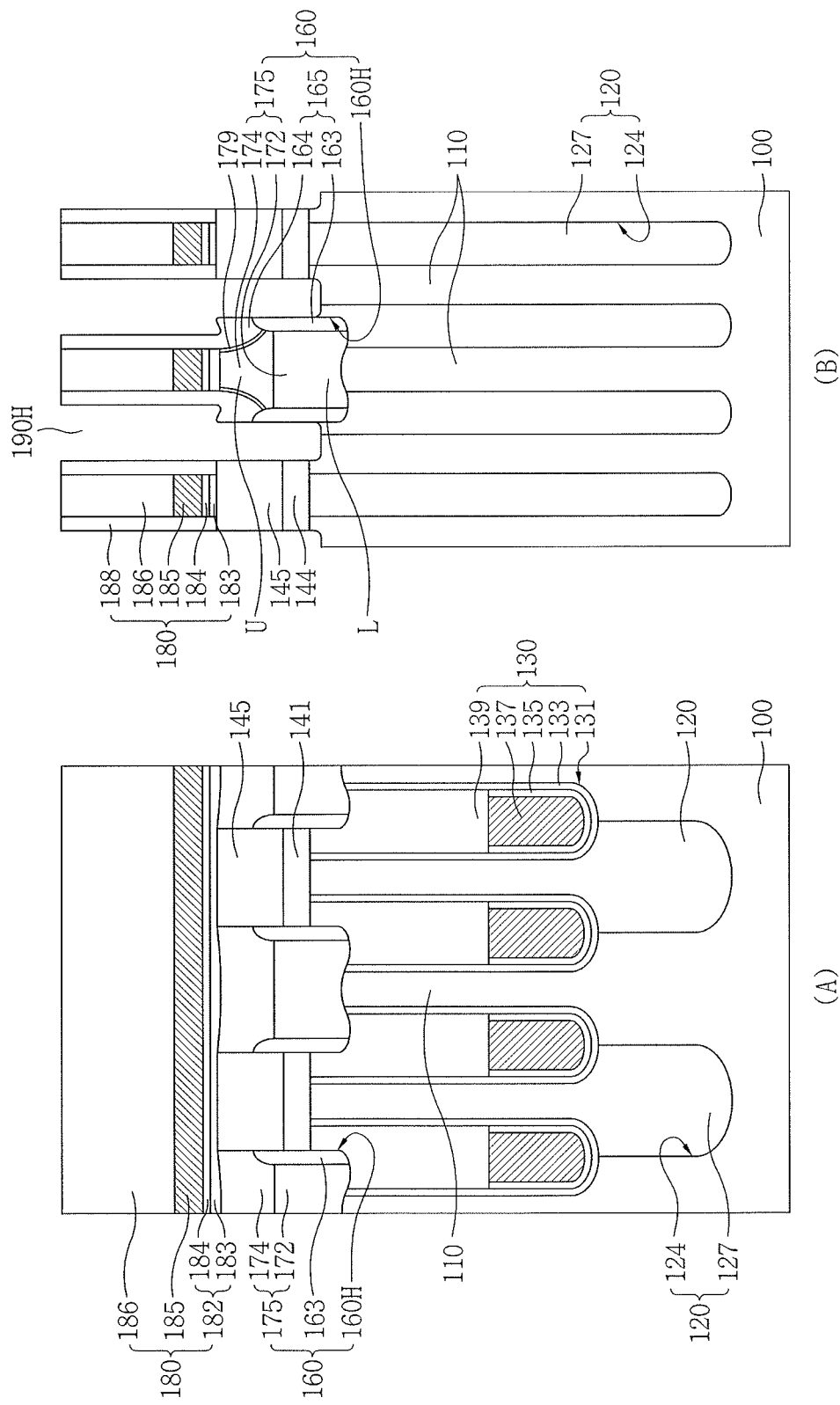

FIGS. 7A through 7C illustrate longitudinal sectional views of a method of fabricating a semiconductor device according to an embodiment of the inventive concept.

Figure 4C:
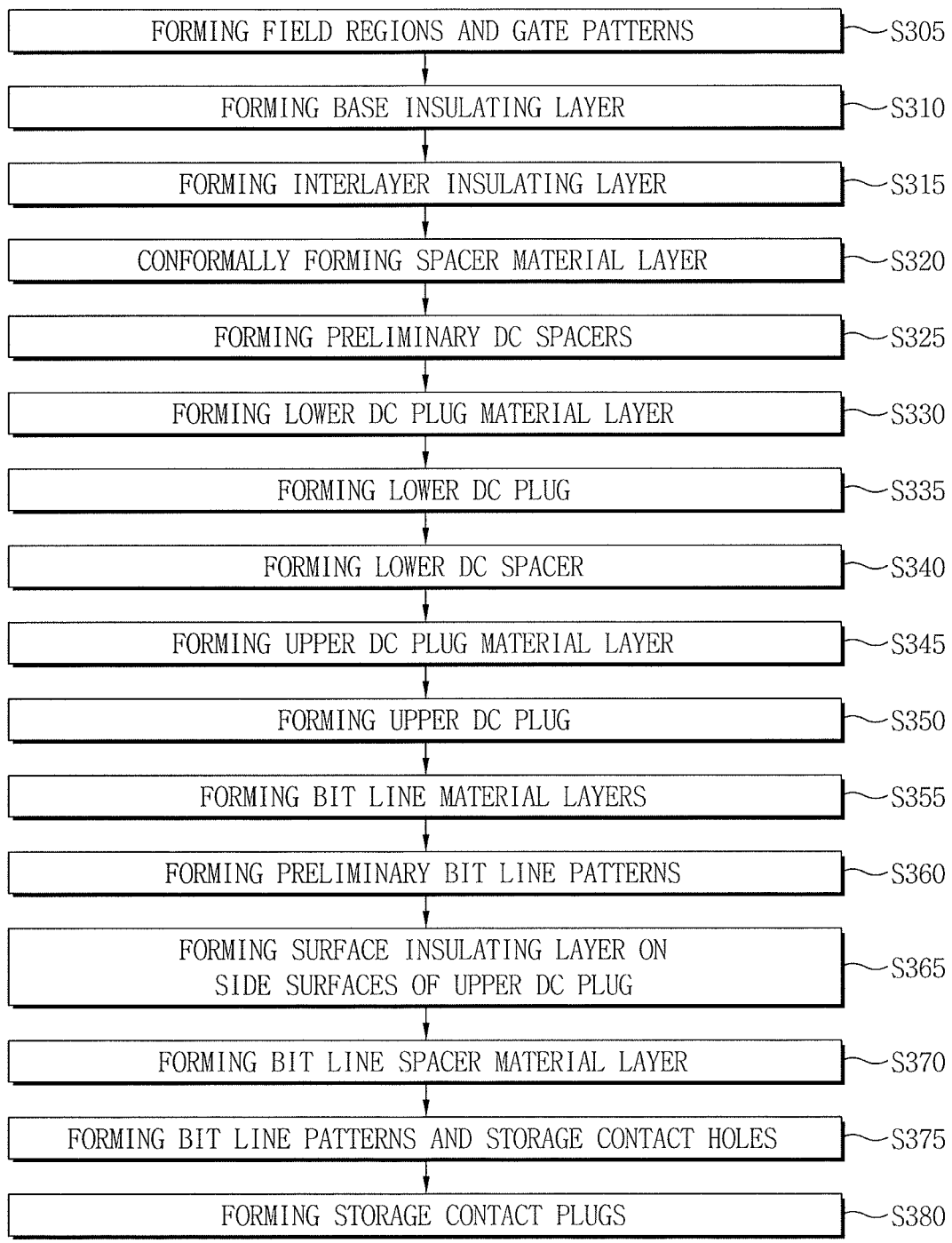

Referring to FIGS. 4C and 7A and referring back to FIG. 5A, the method of fabricating the semiconductor device according to the embodiment of the inventive concept may include forming thee field regions 120 defining the active regions 110 in the substrate 100 and forming the gate patterns 130 in the substrate 100 (operation S305), and forming the base insulating layer 144 on the substrate 100 (operation S310). For example, the process of forming the landing pads 141 and the fences 142 shown in FIG. 5B may be omitted. The base insulating layer 144 may include a silicon oxide (e.g., an MTO) or silicon nitride.

Referring to FIGS. 4C and 7B and referring to FIG. 5C and the description thereof, the method of fabricating the semiconductor device according to the embodiment of the inventive concept may include forming an interlayer insulating layer 145 having DC holes 160H on the base insulating layer 144 (operation S315). The DC holes 160H may vertically penetrate the base insulating layer 144 and expose portions of the active regions 110. The interlayer insulating layer 145, the base insulating layer 144, the active regions 110, the gate patterns 130, and/or the field regions 120 may be exposed by inner walls of the DC holes 160H. Portions of upper portions of the active regions 110, the gate patterns 130, and/or the field regions 120 may be exposed by bottom surfaces of the DC holes 160H. The base insulating layer 144 and the interlayer insulating layer 145 may form an integral element. For example, since the base insulating layer 144 is a portion of the interlayer insulating layer 145, a boundary between the base insulating layer 144 and the interlayer insulating layer 145 may be imaginary.

Referring to FIGS. 4C and 7C, the method of fabricating the semiconductor device according to the embodiment of the inventive concept may include performing the processes described with reference to FIGS. 5D through 5O. Thus, the method may include conformally forming a DC spacer material layer 161 on a top surface of the interlayer insulating layer 145 and inner walls and bottom surfaces of the DC holes 160H (operation S320), forming preliminary DC spacers 162 on the inner walls of the DC holes 160H (operation S325), forming a lower DC plug material layer 171 to completely fill the DC holes 160H (operation S330), forming a lower DC plug 172 by removing an upper portion of the lower DC plug material layer 171 (operation S335), forming lower DC spacers 163 by removing upper portions of the preliminary DC spacers 162 (operation S340), forming an upper DC plug material layer 173 to completely fill the DC holes 160H and directly contact the lower DC plug 172 (operation S345), forming an upper DC plug 174 by removing an upper portion of the upper DC plug material layer 173 (operation S350), forming bit line material layers 181 (operation S355), forming a plurality of preliminary bit line patterns 189 parallel to one another by patterning the bit line material layers 181 (operation S360), forming a surface insulating layer 179 on exposed side surfaces of the upper DC plug 174 (operation S365), forming a bit line spacer material layer 187 to surround the preliminary bit line patterns 189 (operation S370), and forming bit line patterns 180 and storage contact holes 190H (operation S375). Subsequently, referring back to FIGS. 4C and 2E, the method may include forming storage contact plugs 190 to fill the storage contact holes 190H (operation S380).

Figure 8:
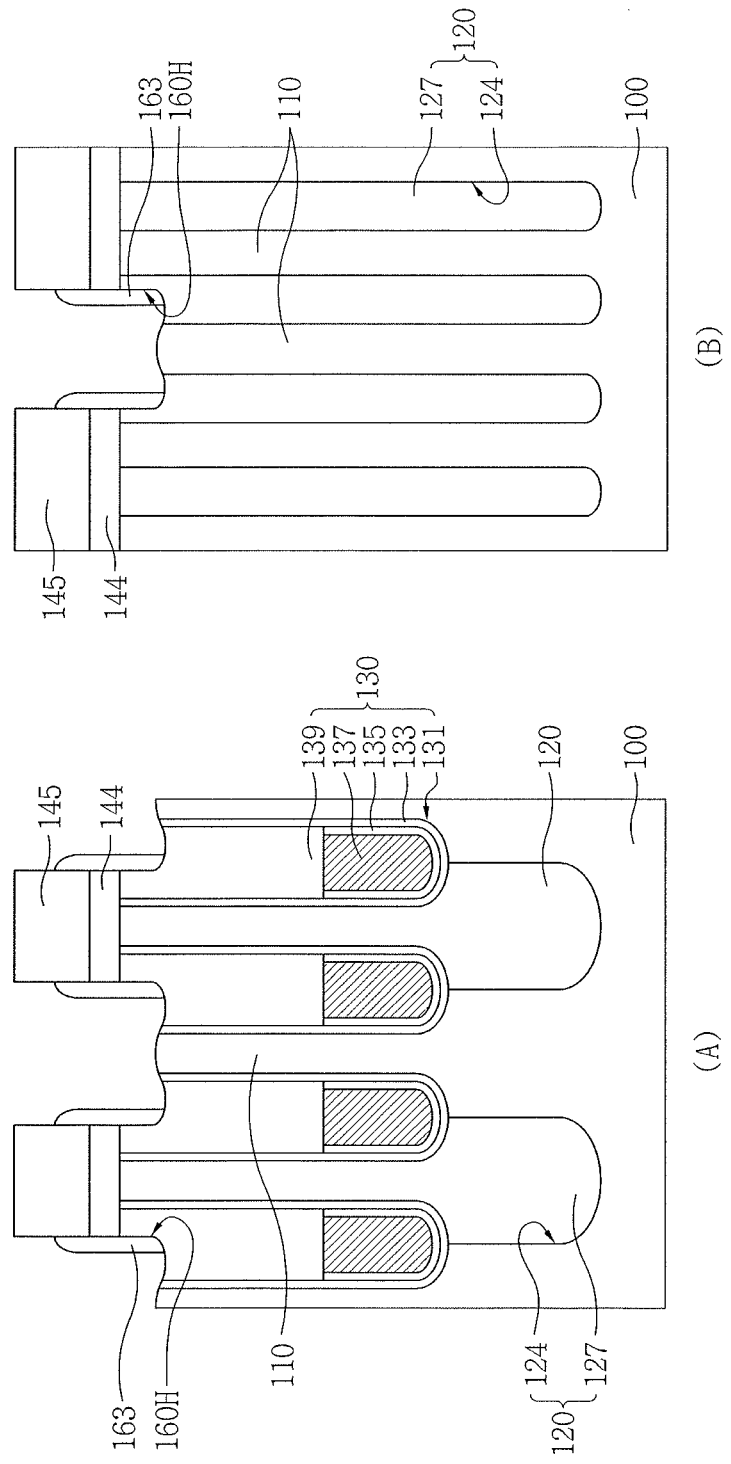

FIG. 8 is a longitudinal sectional view of a method of fabricating a semiconductor device according to an embodiment of the inventive concept.

Referring to FIGS. 4D and 8 and referring back to FIGS. 5A through 5D, 6A, 7A, and 7B, the method of fabricating the semiconductor device according to the embodiment of the inventive concept may include forming field regions 120 defining the active regions 110 in the substrate 100 and forming the gate patterns 130 in the substrate 100 (operation S405), forming the base insulating layer 144 on the substrate 100 (operation S410), forming the interlayer insulating layer 145 having the DC holes 160H on the base insulating layer 144 (operation S415), conformally forming the DC spacer material layer 161 on a top surface of the interlayer insulating layer 145 and inner walls and bottom surfaces of the DC holes 160H (operation S420), and forming the lower DC plug 172 on the inner walls of the DC holes 160H (operation S425).

Thereafter, referring to FIGS. 6B and 6C and 5K through 5O, the method may include forming a DC plug material layer to completely fill the DC holes 160H (operation S430), forming a DC plug by removing an upper portion of the DC plug material layer (operation S435), forming bit line material layers 181 (operation S440), forming a plurality of preliminary bit line patterns 189 parallel to one another by patterning the bit line material layers 181 (operation S445), forming a surface insulating layer 179 on exposed side surfaces of the upper DC plug 174 (operation S450), forming a bit line spacer material layer 187 to surround the preliminary bit line patterns 189 (operation S455), and forming bit line patterns 180 and storage contact holes 190H (operation S460). Referring back to FIGS. 4D and 2F, the method may include forming storage contact plugs 190 to fill the storage contact holes 190H (operation S465).

FIGS. 9A through 9H illustrate longitudinal sectional views of a method of fabricating a semiconductor device according to an embodiment of the inventive concept.

Figure 4E:
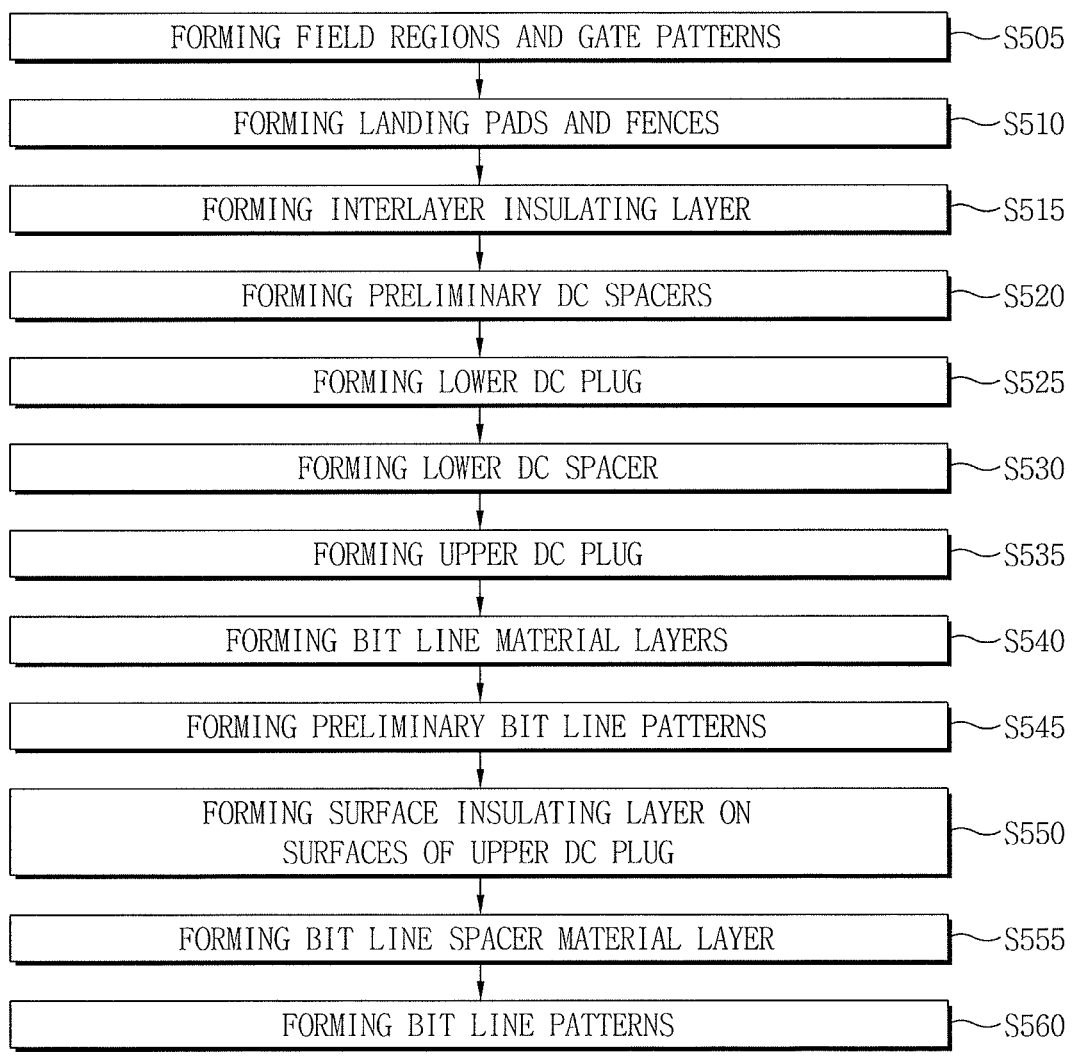

Referring to FIGS. 4E and 9A and referring back to FIGS. 3A, 5A, and 5B and the descriptions thereof, the method of fabricating the semiconductor device according to the embodiment of the inventive concept may include forming the first and second field regions 121 and 122 defining the active regions 110 in the substrate 100 and forming the gate patterns 130 in the substrate 100 (operation S505), and forming landing pads 141 and fences 142 on the substrate 100 (operation S510).

Figure 9B:
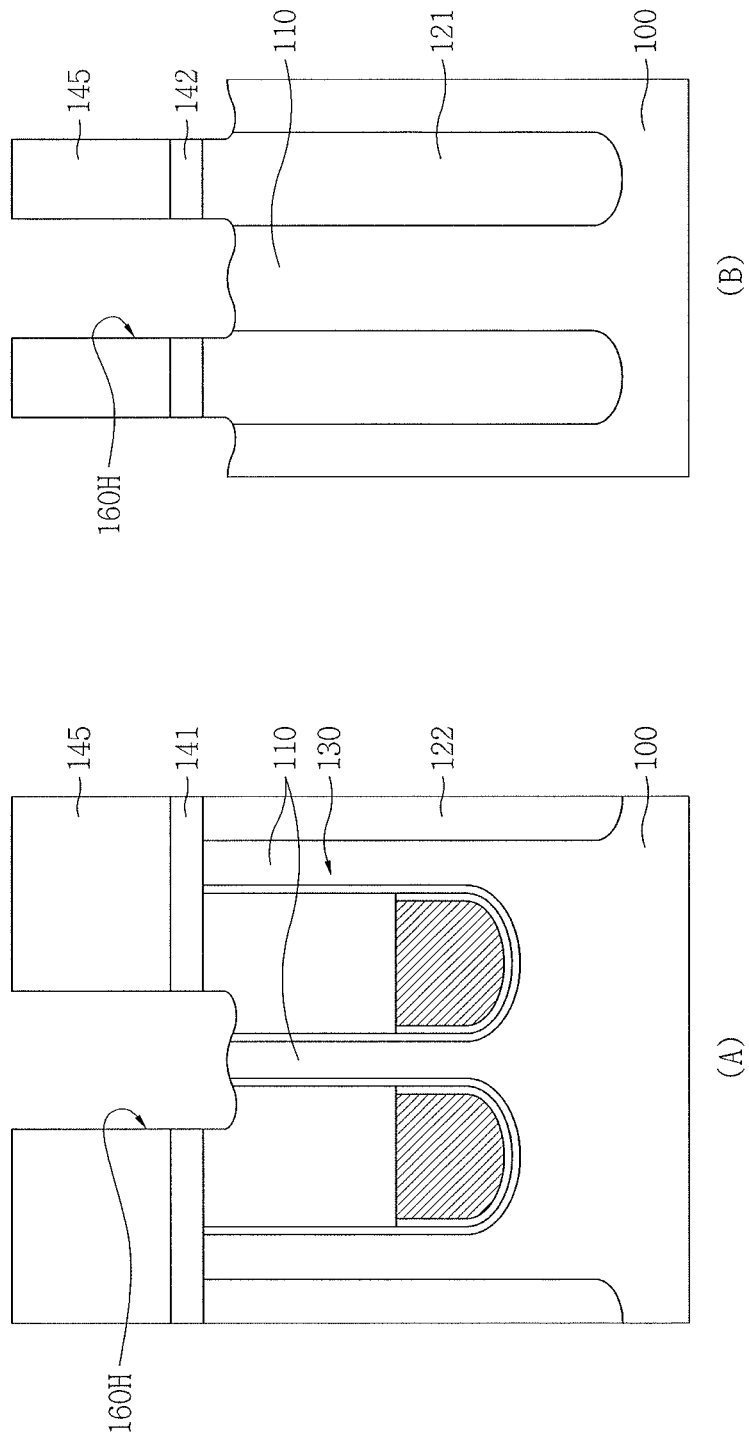

Referring to FIGS. 4E and 9B and referring back to FIGS. 3A, 5C, and the descriptions thereof, the method of fabricating the semiconductor device according to the embodiment of the inventive concept may include forming the interlayer insulating layer 145 having the DC holes 160H on the landing pads 141 and the fences 142 (operation S515).

Figure 9C:
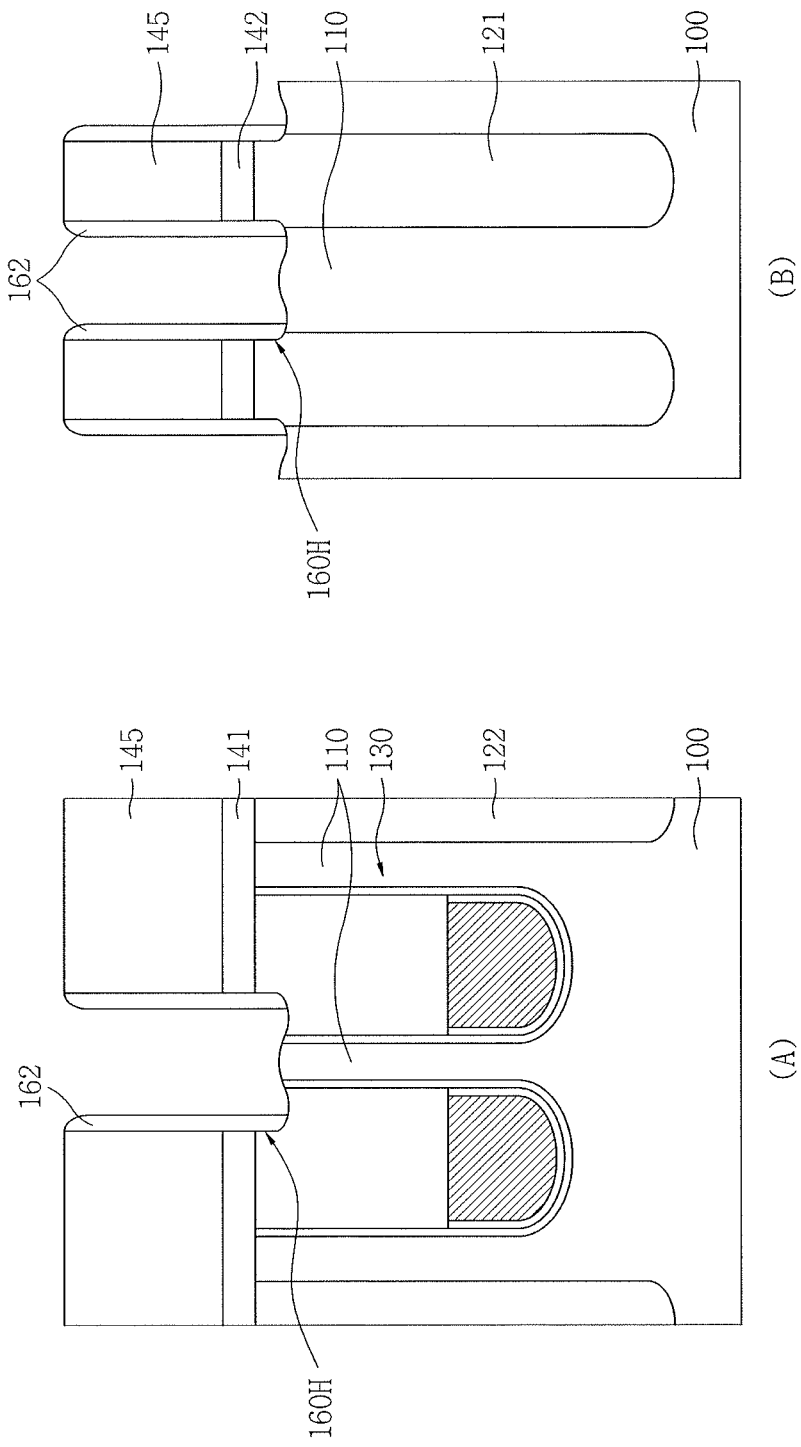

Referring to FIGS. 4E and 9C and referring back to FIGS. 3A, 5D, 5E, and the descriptions thereof, the method of fabricating the semiconductor device according to the embodiment of the inventive concept may include forming preliminary DC spacers 162 within the DC holes 160H (operation S520).

Figure 9D:
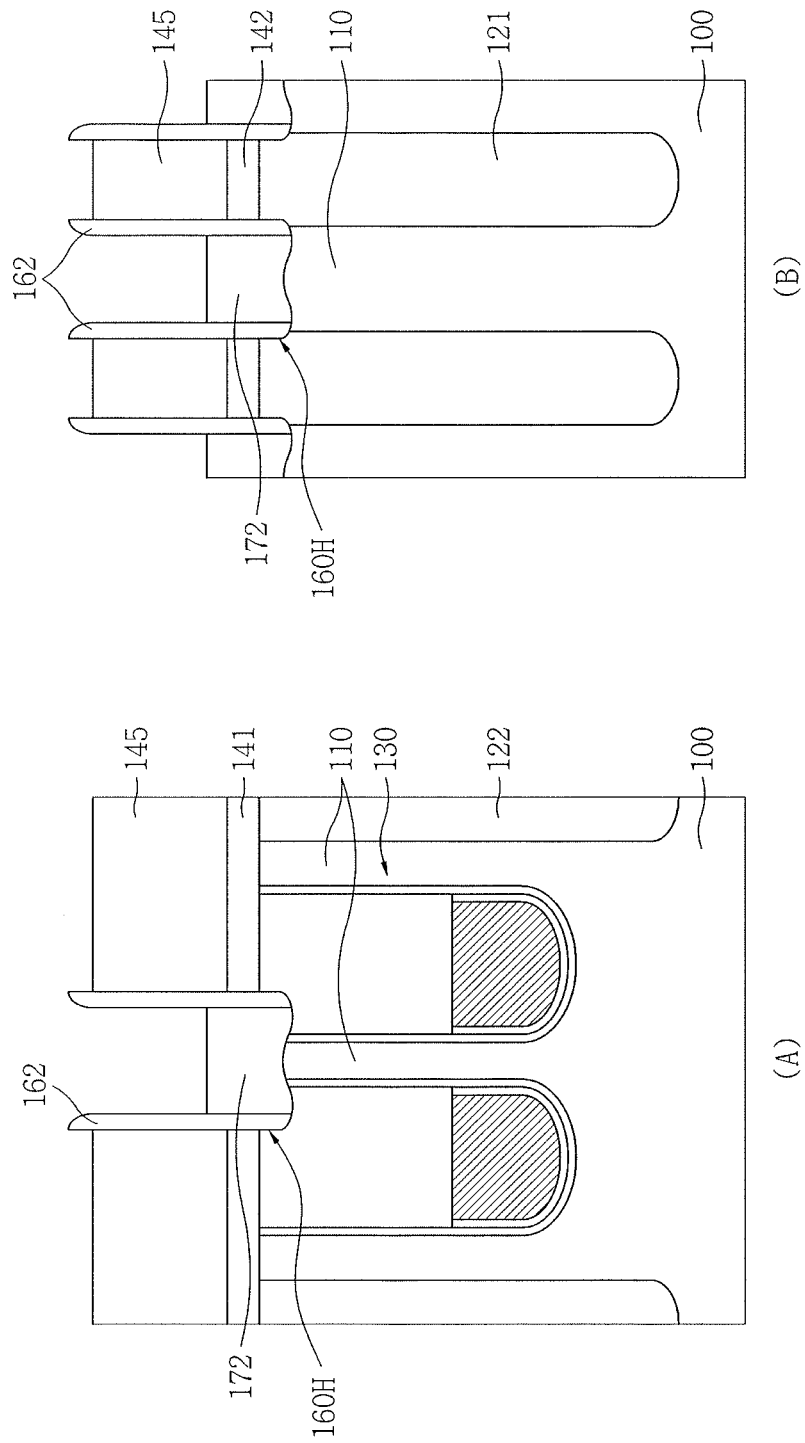

Referring to FIGS. 4E and 9D and referring back to FIGS. 3A, 5F, 5G, and the descriptions thereof, the method of fabricating the semiconductor device according to the embodiment of the inventive concept may include forming the lower DC plug 172 (operation S525).

Figure 9E:
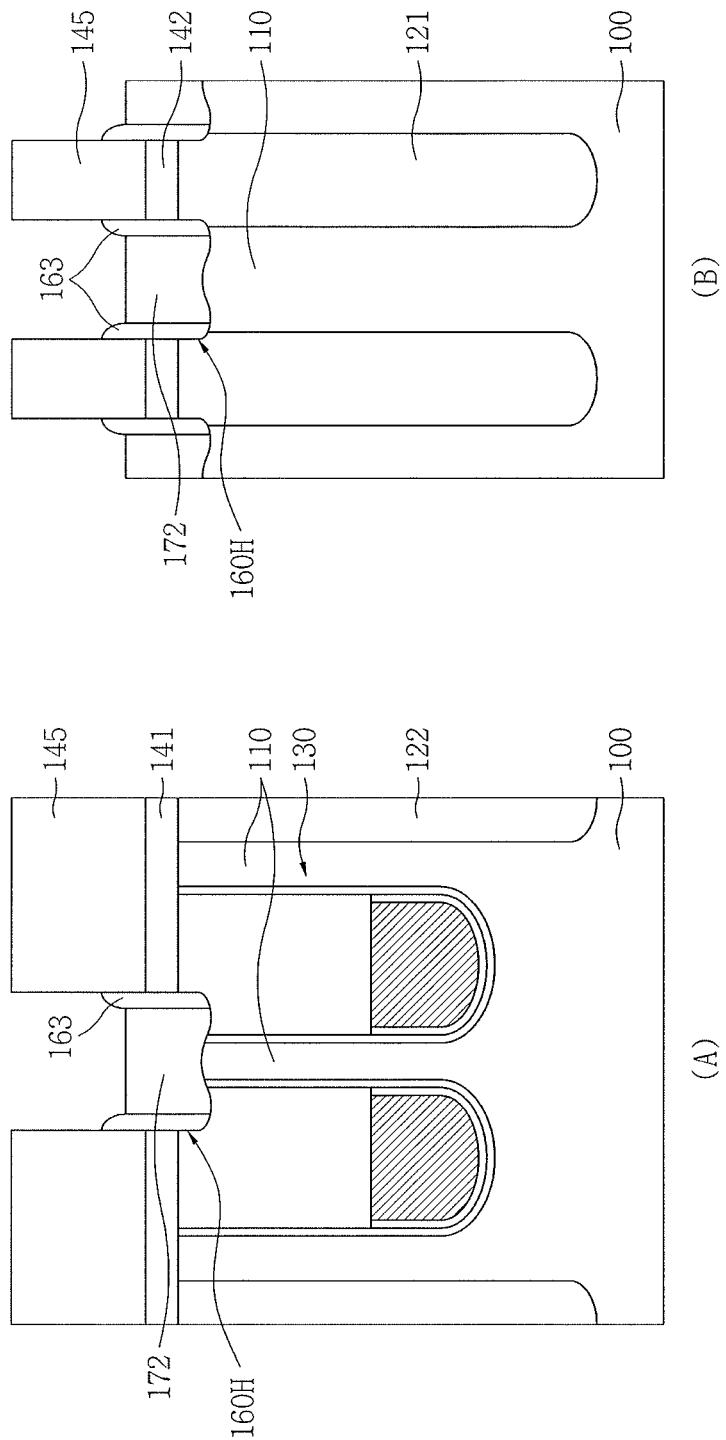

Referring to FIGS. 4E and 9E and referring back to FIGS. 3A, 5H, and the descriptions thereof, the method of fabricating the semiconductor device according to the embodiment of the inventive concept may include forming the lower DC spacers 163 (operation S530).

Figure 9F:
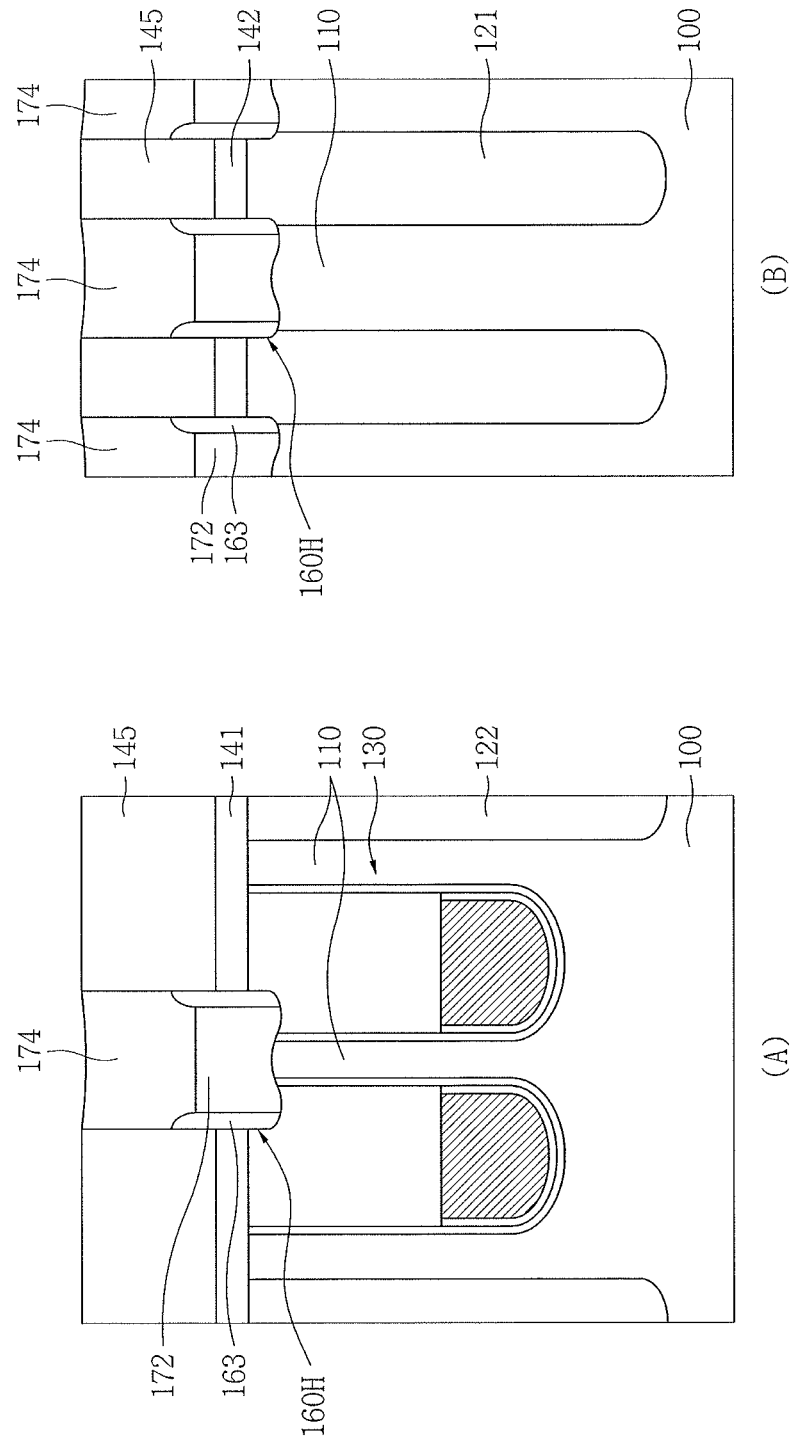

Referring to FIGS. 4E and 9F and referring back to FIGS. 3A, 5I, 5J, and the descriptions thereof, the method of fabricating the semiconductor device according to the embodiment of the inventive concept may include forming the upper DC plug 174 (operation 535).

Figure 9G:
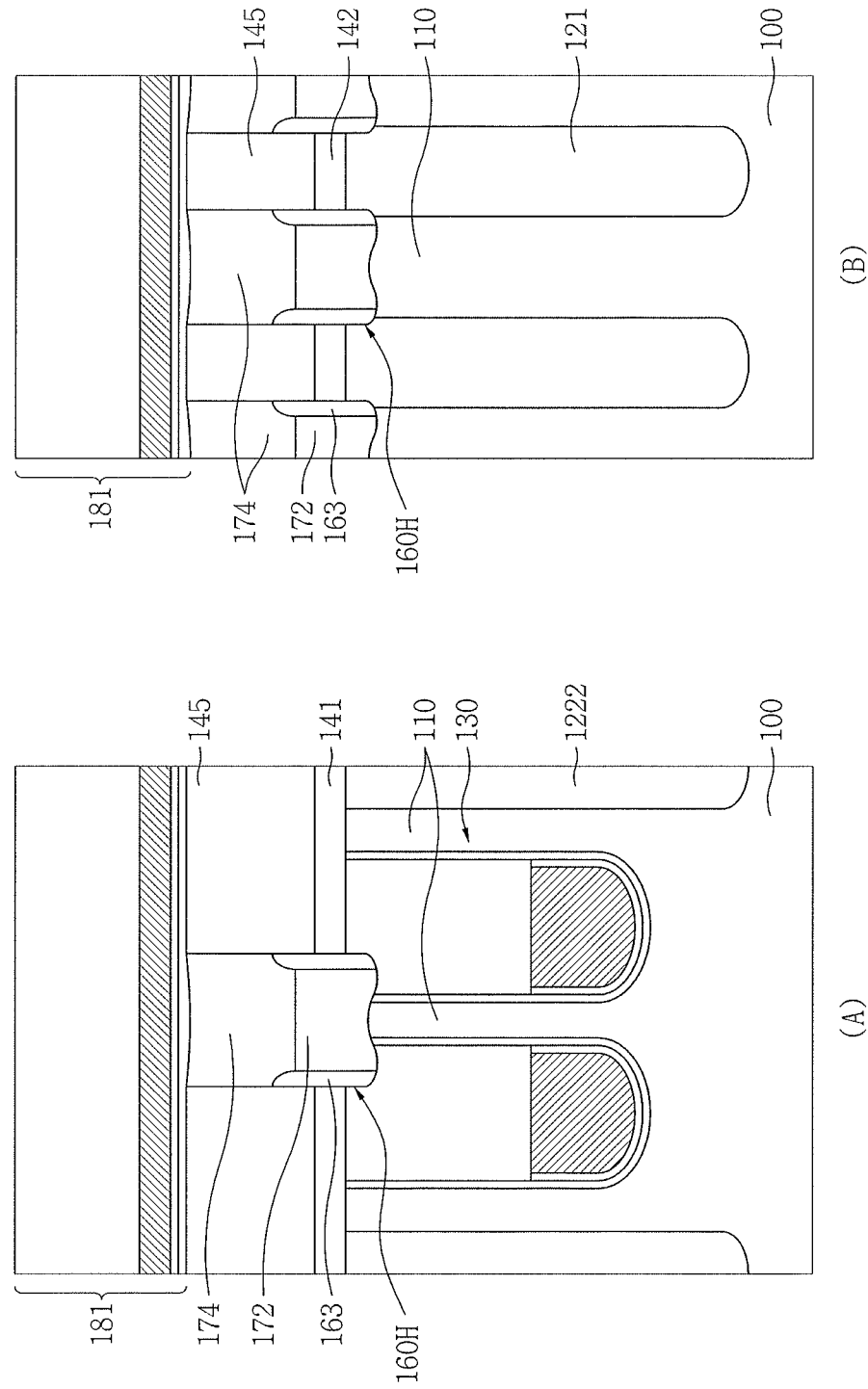

Referring to FIGS. 4E and 9G and referring back to FIGS. 3A, 5K, and the descriptions thereof, the method of fabricating the semiconductor device according to the embodiment of the inventive concept may include forming the bit line material layers 181 (operation S540).

Figure 9H:
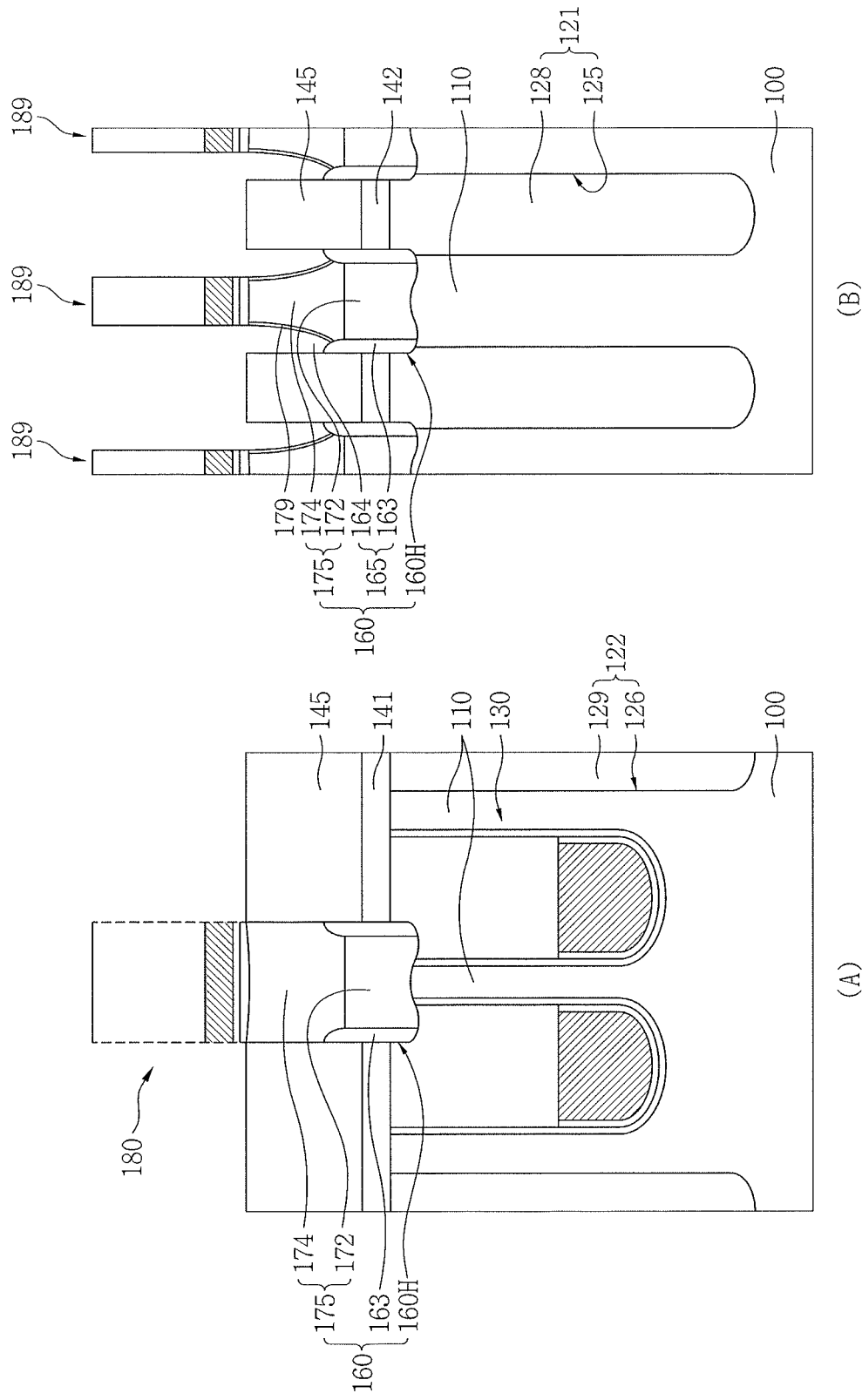

Referring to FIGS. 4E and 9H and referring back to FIGS. 3A, 5L, 5M, and the descriptions thereof, the method of fabricating the semiconductor device according to the embodiment of the inventive concept may include forming the preliminary bit line patterns 189 (operation S545), and forming a surface insulating layer 179 on exposed surfaces of the upper DC plug 174 (operation S550). When a native oxide layer is usable, operation S550 may be omitted.

Subsequently, referring back to FIGS. 3A, 4E, 5N, and the descriptions thereof, the method of fabricating the semiconductor device according to the embodiment of the inventive concept may include forming the bit line spacer material layer 187 (operation 555), and forming the bit line patterns 180 (operation S560).

Figure 10B:
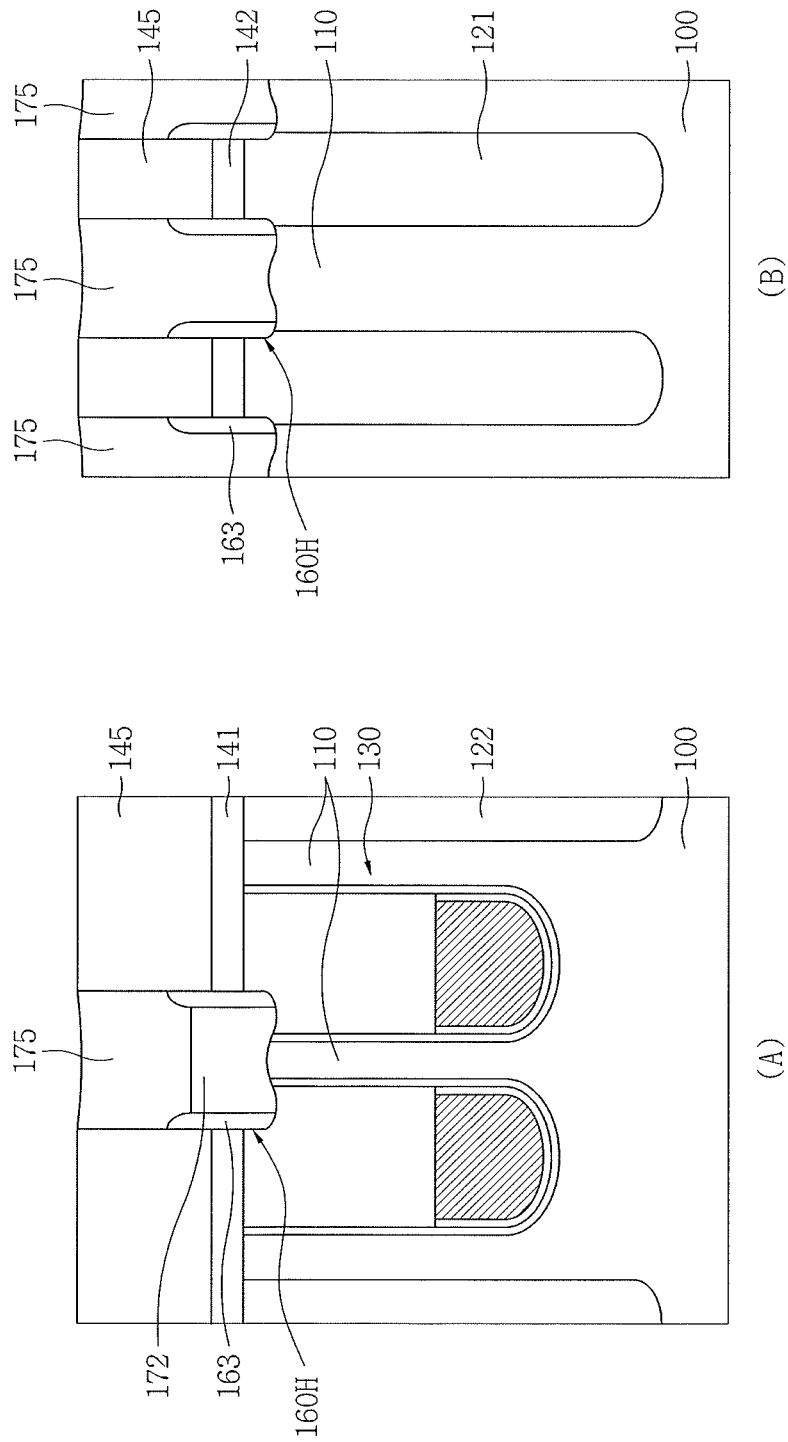

FIGS. 10A and 10B illustrate longitudinal sectional views illustrating a method of fabricating a semiconductor device according to an embodiment of the inventive concept.

Referring to FIGS. 4F and 10A and referring back to FIGS. 3B, 5A, 5B, 6A, 9A through 9C, and the descriptions thereof, the method of fabricating the semiconductor device according to the embodiment of the inventive concept may include forming the first and second field regions 121 and 122 defining the active regions 110 in the substrate 100 and forming the gate patterns 130 in the substrate 100 (operation S605), forming the landing pads 141 and fences 142 on the substrate 100 (operation S610), forming the interlayer insulating layer 145 having the DC holes 160H on the landing pads 141 and the fences 142 (operation S615), conformally forming the DC spacer material layer 161 on the top surface of the interlayer insulating layer 145 and inner walls and bottom surfaces of the DC holes 160H (operation S620), and forming the lower DC spacers 163 within the DC holes 160H by removing the upper portion of the DC spacer material layer 161 (operation S625).

Referring to FIGS. 4F and 10B and referring back to FIGS. 3B, 5J, 6B, 6C, and the descriptions thereof, the method of fabricating the semiconductor device according to the embodiment of the inventive concept may include forming the DC plug material layer 176 to completely fill the DC holes 160H (operation S630) and forming the DC plug 175 by removing the upper portion of the DC plug material layer 176 (operation S635).

Thereafter, referring to FIGS. 3B, 4F, 5K through 5O, and 9G through 9J, the method of fabricating the semiconductor device according to the embodiment of the inventive concept may include forming bit line material layers 181 (operation S640), forming the plurality of the preliminary bit line patterns 189 parallel to one another by patterning the bit line material layers 181 (operation S645), forming the surface insulating layer 179 on exposed side surfaces of the upper DC plug 174 (operation S650), forming the bit line spacer material layer 187 to enclose the preliminary bit line patterns 189 (operation S655), and forming the bit line patterns 180 (operation S660).

Figure 11B:
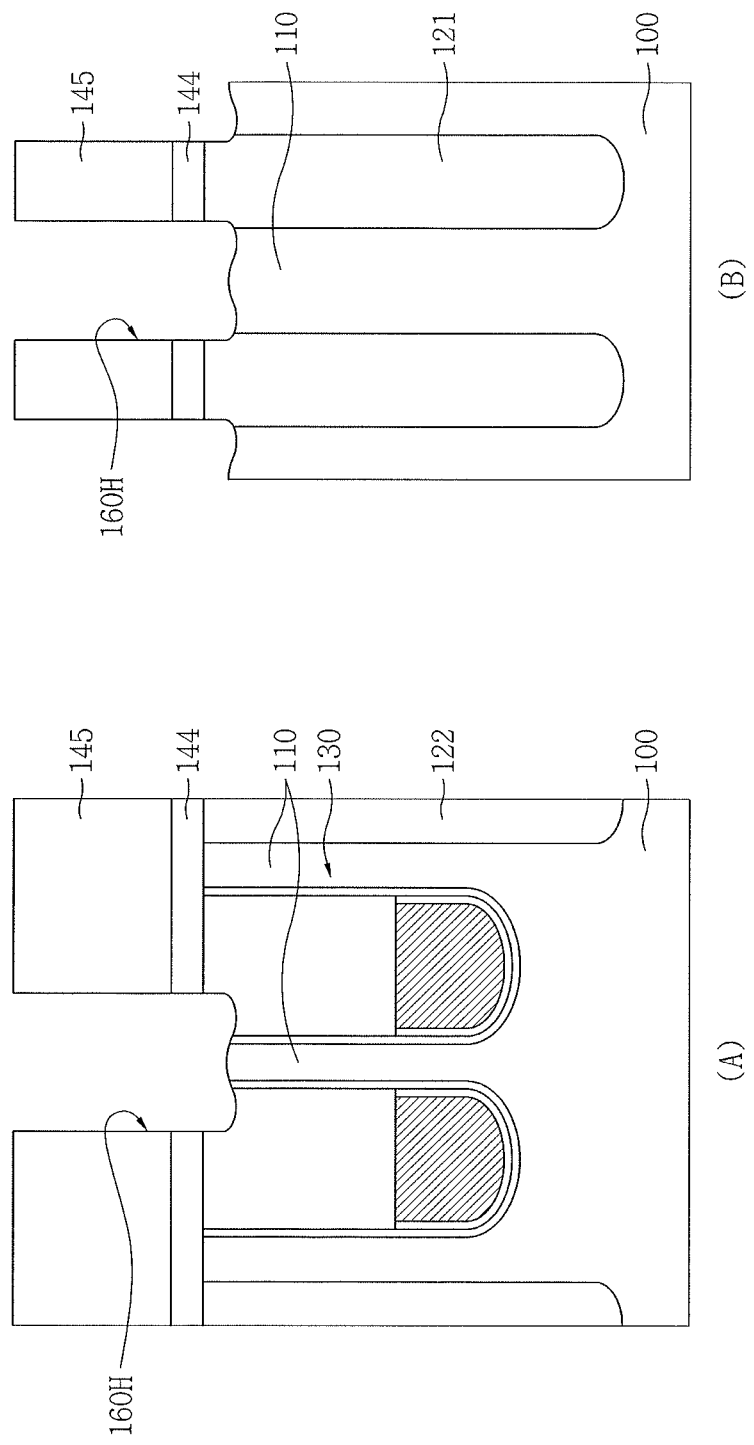

FIGS. 11A and 11B illustrate longitudinal sectional views illustrating a semiconductor device according to an embodiment of the inventive concept.

Referring to FIGS. 4A and 11A and referring back to FIGS. 3C, 7A, 9A, and the descriptions thereof, the method of fabricating the semiconductor device according to the embodiment of the inventive concept may include forming the field regions 120 defining the active regions 110 in the substrate 100 and forming the gate patterns 130 in the substrate 100 (operation S705), and forming the base insulating layer 144 on the substrate 100 (operation S710).

Figure 4G:
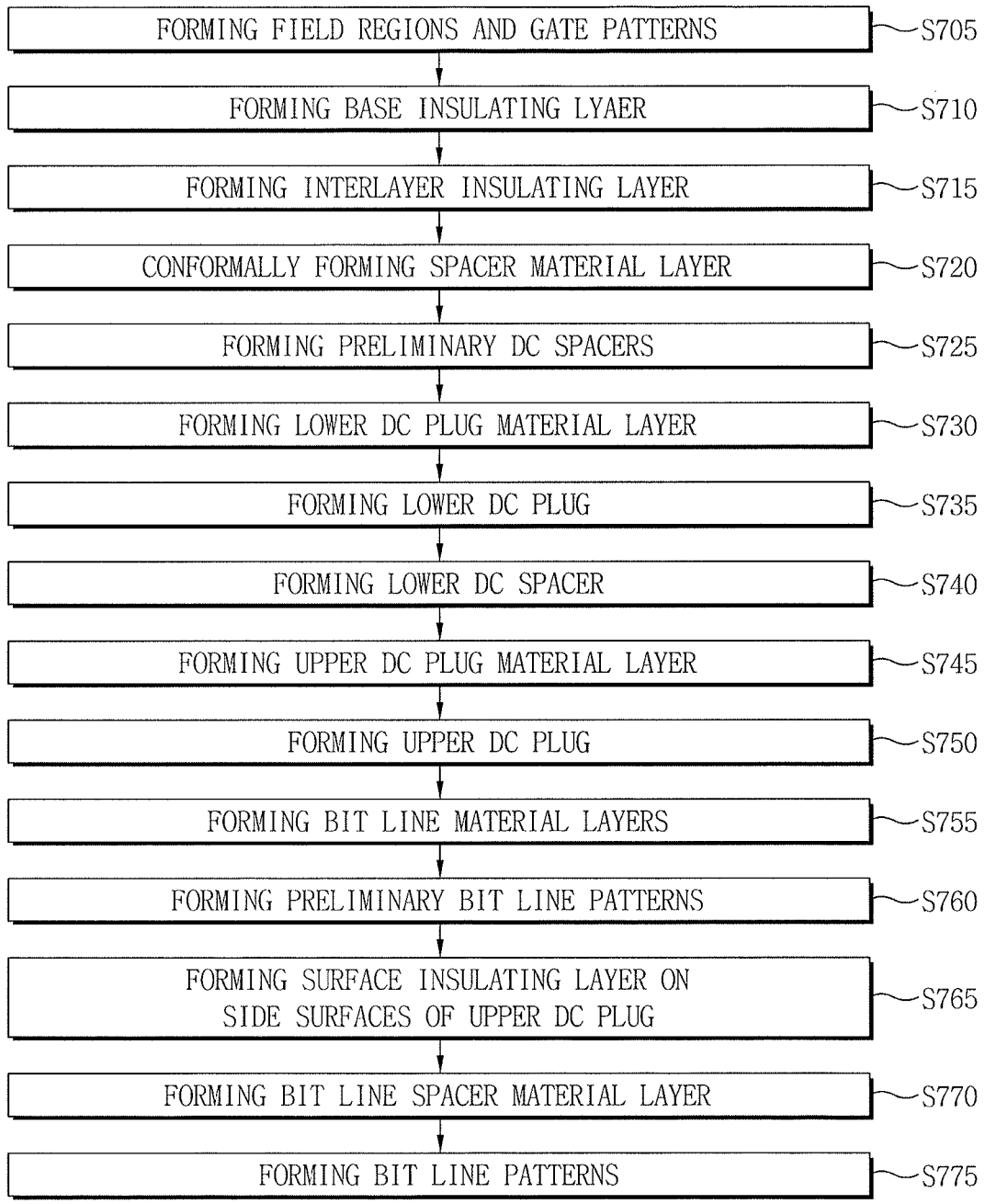

Referring to FIGS. 4G and 11B and referring back to FIGS. 3C, 7B, 9B, and the descriptions thereof, the method of fabricating the semiconductor device according to the embodiment of the inventive concept may include forming the interlayer insulating layer 145 having the DC holes 160H on the base insulating layer 144 (operation S715).

Afterwards, referring to FIGS. 3C, 4G, 7C, and FIGS. 9C through 9J, the method of fabricating the semiconductor device according to the embodiment of the inventive concept may include conformally forming the DC spacer material layer 161 on the top surface of the interlayer insulating layer 145 and inner walls and bottom surfaces of the DC holes 160H (operation S720), forming the preliminary DC spacers 162 on the inner walls of the DC holes 160H (operation S725), forming the lower DC plug material layer 171 to completely fill the DC holes 160H (operation S730), forming the lower DC plug 172 by removing an upper portion of the lower DC plug material layer 171 (operation S735), forming the lower DC spacers 163 by removing upper portions of the preliminary DC spacers 162 (operation S740), forming the upper DC plug material layer 173 to completely fill the DC holes 160H and directly contact the lower DC plug 172 (operation S745), forming the upper DC plug 174 by removing an upper portion of the upper DC plug material layer 173 (operation S750), forming the bit line material layers 181 (operation S755), forming the plurality of preliminary bit line patterns 189 parallel to one another by patterning the bit line material layers 181 (operation S760), forming the surface insulating layer 179 on exposed side surfaces of the upper DC plug 174 (operation S765), forming the bit line spacer material layer 187 to enclose the preliminary bit line patterns 189 (operation S770), and forming the bit line patterns 180 (operation S775).

Figure 12:
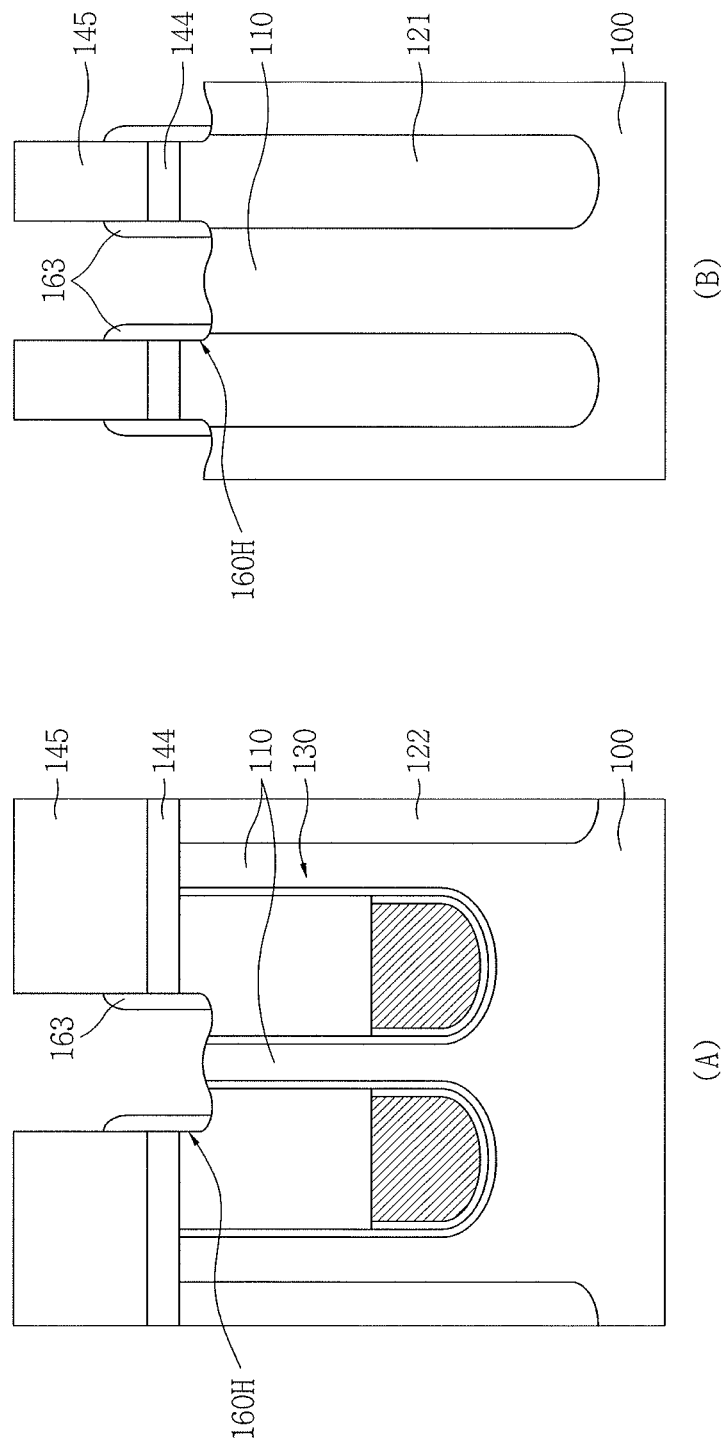

FIG. 12 illustrates a longitudinal sectional view of a method of fabricating a semiconductor device according to an embodiment of the inventive concept.

Figure 4H:
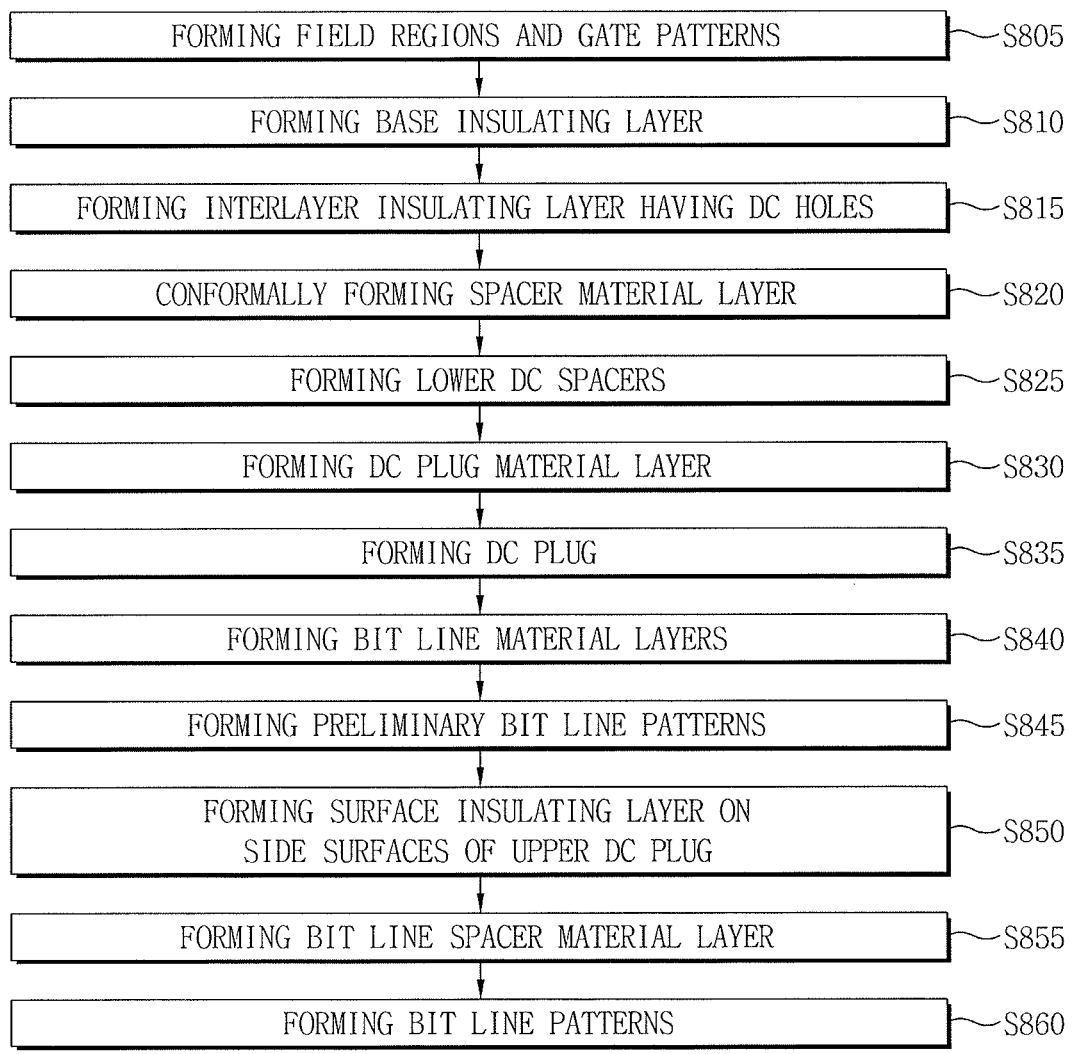

Referring to FIGS. 4H and 12 and referring back to FIGS. 3D, 9A through 9C, 10A, 11A, 11B, and the descriptions thereof, the method of fabricating the semiconductor device according to the embodiment of the inventive concept may include forming the field regions 120 defining the active regions 110 in the substrate 100 and forming the gate patterns 130 in the substrate 100 (operation S805), forming the base insulating layer 144 on the substrate 100 (operation S810), forming the interlayer insulating layer 145 having the DC holes 160H on the base insulating layer 144 (operation S815), conformally forming the DC spacer material layer 161 on the top surface of the interlayer insulating layer 145 and inner walls and bottom surfaces of the DC holes 160H (operation S820), and forming the lower DC spacers 163 on the inner walls of the DC holes 160H (operation S825).

Subsequently, referring back to FIGS. 3D, 4H, 9F through 9J, 10B, and 11A, the method of fabricating the semiconductor device according to the embodiment of the inventive concept may include forming the DC plug material layer to completely fill the DC holes 160H (operation S830), forming the DC plug by removing the upper portion of the DC plug material layer (operation S835), forming bit line material layers 181 (operation S840), forming the plurality of preliminary bit line patterns 189 parallel to one another by patterning the bit line material layers 181 (operation S845), forming the surface insulating layer 179 on exposed side surfaces of the upper DC plug 174 (operation S850), forming the bit line spacer material layer 187 to enclose the preliminary bit line patterns 189 (operation S855), and forming the bit line patterns 180 (operation S860).

Figure 13:
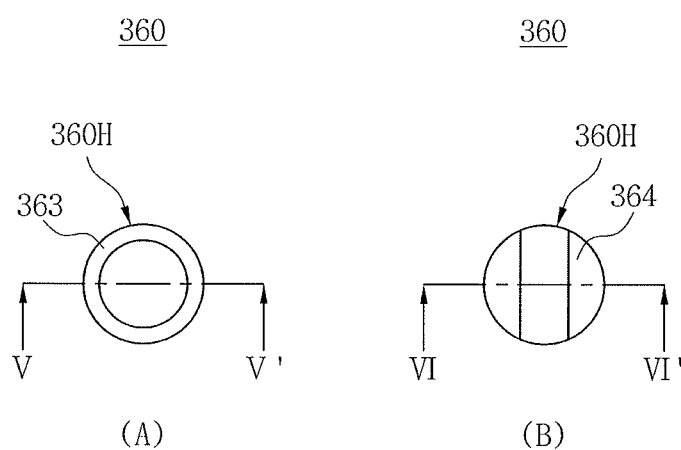
FIG. 13 illustrates a conceptual layout of a contact structure 30 according to an embodiment of the inventive concept, wherein (A) of FIG. 13 is a conceptual layout of a lower contact spacer, and (B) of FIG. 13 is a conceptual layout of an upper contact spacer.

FIG. 13 illustrates a conceptual top layout of a contact structure according to an embodiment of the inventive concept. (A) of FIG. 13 is a conceptual layout of a lower contact spacer, and (B) of FIG. 13 is a conceptual layout of an upper contact spacer. Referring to FIG. 13, a contact structure 360 according to the embodiment of the inventive concept may include a lower contact spacer 363 wholly formed on the inner wall of the contact hole 360H, i.e., so the lower contact spacer 363 is directly on the inner wall of the contact hole 360H and completely surrounds the entire perimeter of the contact hole 360H. An upper contact spacer 364 may be partially formed on the inner wall of the contact hole 360H, i.e., so the upper contact spacer 364 contacts directly only portions of the inner wall of the contact hole 360H to only partially surround the perimeter of the contact hole 360H. It is noted that reference numerals 360, 360H, 363, and 364 in FIG. 13 correspond to reference numerals 160, 160H, 163, and 164, respectively, in FIGS. 1A-3D discussed previously.

Figure 14A:
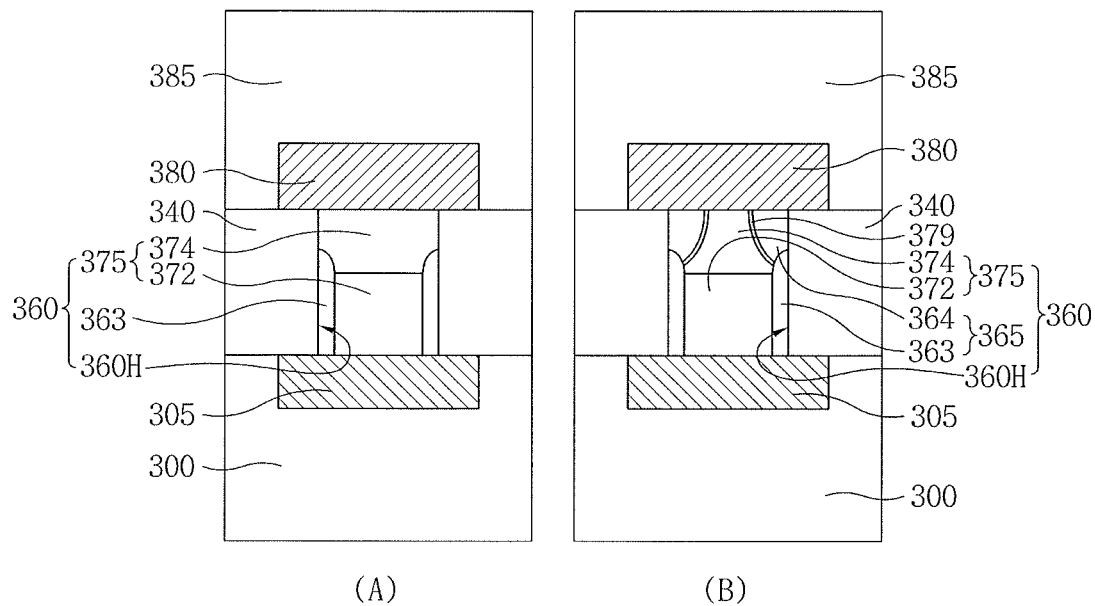
FIGS. 14A and 14B illustrate conceptual longitudinal sectional views of contact structures according to embodiments of the inventive concept, which are taken along directions V-V' and VI-VI' of FIG. 13.
Figure 14B:
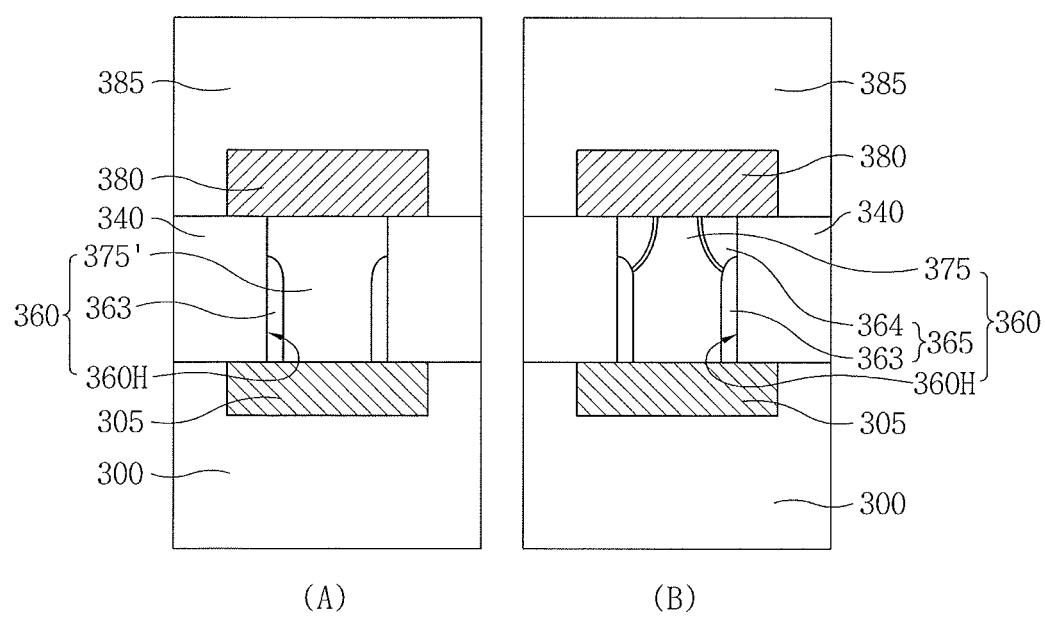

FIGS. 14A and 14B illustrate conceptual longitudinal sectional views of contact structures according to embodiments of the inventive concept, which are taken along directions V-V' and VI-VI' of FIG. 13.

Referring to FIG. 14A, a contact structure 360 according to an embodiment of the inventive concept may include the lower contact spacers 363, upper contact spacers 364, a lower contact plug 372, and an upper contact plug 374, which may be formed within the contact hole 360H. The lower contact spacers 363 may be formed to wholly enclose a lower inner wall of the contact hole 360H. The upper contact spacers 364 may be formed on only a portion of an upper inner wall of the contact hole 360H, as discussed previously with reference to FIG. 13. The lower contact plug 372 may be formed on the lower contact spacers 363 to fill the contact hole 360H. A top surface of the lower contact plug 372 may be at a lower level than top ends of the lower contact spacers 363. The upper contact plug 374 may completely fill the contact hole 360H. The upper contact plug 374 may be in direct contact with the top surface of the lower contact plug 372, the top ends of the lower contact spacers 363, the upper contact spacers 364, and the upper inner wall of the contact hole 360H. A portion of a side surface of the upper contact plug 374 may taper. For example, the upper contact plug 374 may have an upper portion with a relatively small width and a lower portion with a relatively large width. The upper contact plug 374 may have a relatively large horizontal width in a sectional view taken in the first direction, and a relatively small horizontal width in a sectional view taken in the second direction. The lower and upper contact spacers 363 and 364 may include an insulating material, e.g., silicon nitride. The lower and upper contact plugs 372 and 374 may include, e.g., a conductive material, such as doped silicon or a metal.

The contact structure 360 may be enclosed with an interlayer insulating layer 340. The interlayer insulating layer 340 may include an insulating material, e.g., silicon oxide or silicon nitride. A lower conductive material 305 may be formed under and in direct contact with the lower contact plug 372. The lower conductive material 305 may include a doped silicon substrate, such as source and drain regions, or a conductive interconnection formed of, e.g., a metal. The lower conductive material 305 may be formed in an under layer 300. The under layer 300 may include a silicon substrate or an insulating material, such as silicon oxide or silicon nitride. An upper conductive material 380 may be formed on and in direct contact with the upper contact plug 374. The upper conductive material 380 may include doped silicon or a metal. The upper conductive material 380 may be covered with a passivation layer 385. The passivation layer 385 may include an insulating material, such as silicon oxide or silicon nitride.

Referring to FIG. 14B, a contact structure according to an embodiment of the inventive concept may include the lower contact spacers 363, upper contact spacers 364, and a contact plug 375', which may be formed within the contact hole 360H. The contact plug 375' may wholly include the same material, e.g., the contact plug 375' may include a materially uniform and continuous body completely filling the entire contact hole 360H.

Figure 15A:
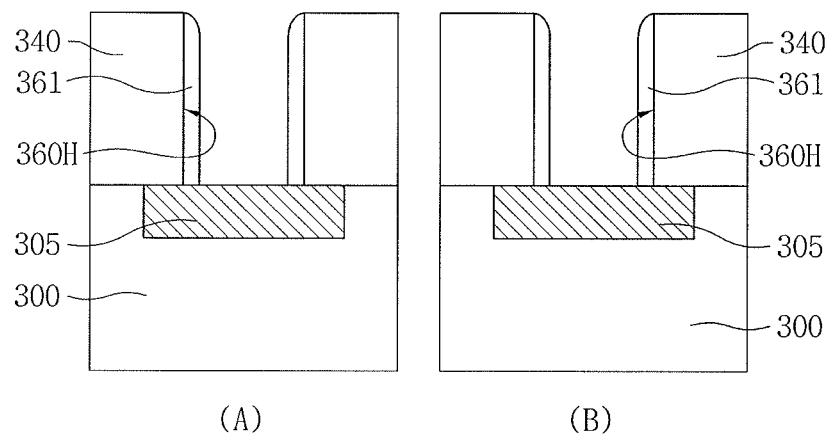
FIGS. 15A through 15J illustrate longitudinal sectional views of a method of forming a contact structure according to an embodiment of the inventive concept, which are taken along directions V-V' and VI-VI' of FIG. 13.

FIGS. 15A through 15J illustrate longitudinal sectional views of a method of forming a contact structure according to an embodiment of the inventive concept, which are taken along directions V-V' and VI-VI' of FIG. 13. Referring to FIG. 15A, the method of forming the contact structure according to the embodiment of the inventive concept may include forming a lower conductive material 305 in an under layer 300, forming an interlayer insulating layer 340 having the contact hole 360H to expose a portion of a top surface of the lower conductive material 305, and forming preliminary lower contact spacers 361 on inner walls of the contact hole 360H. The under layer 300 may include a silicon substrate or an insulating layer. For instance, the under layer 300 may include a semiconductor wafer or an insulating material, such as silicon oxide or silicon nitride. The lower conductive material 305 may have conductivity. For example, the lower conductive material 305 may include source/drain regions formed in a silicon substrate, doped silicon, a metal silicide, or a metal. The interlayer insulating layer 340 and the preliminary lower contact spacers 361 may include an insulating material, such as silicon oxide or silicon nitride. The interlayer insulating layer 340 and the preliminary lower contact spacers 361 may include different insulating materials.

Figure 15B:
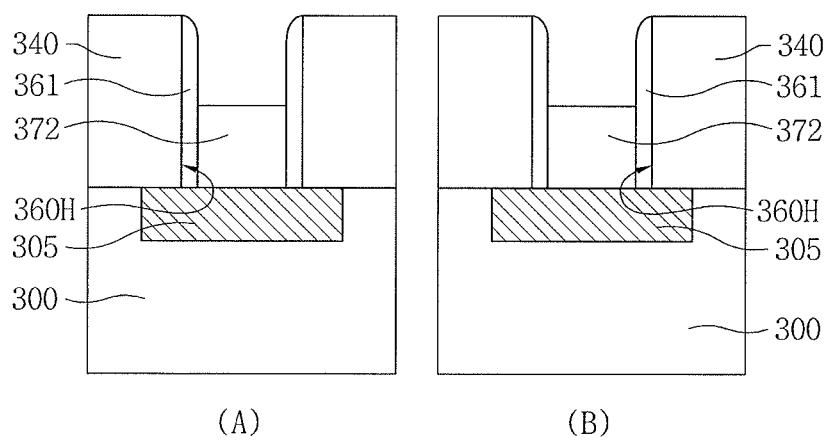

Referring to FIG. 15B, the method of forming the contact structure according to the embodiment of the inventive concept may include forming the lower contact plug 372. The lower contact plug 372 may fill a portion of the contact hole 360H.

Figure 15C:
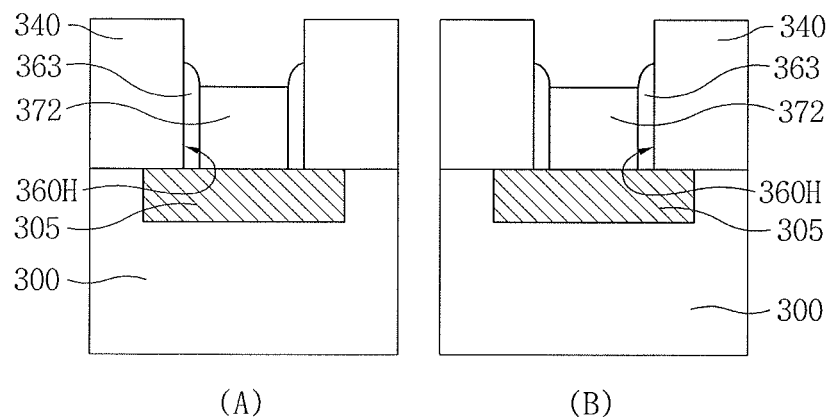

Referring to FIG. 15C, the method of forming the contact structure according to the embodiment of the inventive concept may include forming the lower contact spacers 363 by partially removing upper portions of the preliminary lower contact spacers 361. Top ends of the lower contact spacers 363 may be at a higher level than a top surface of the lower contact plug 372.

Figure 15D:
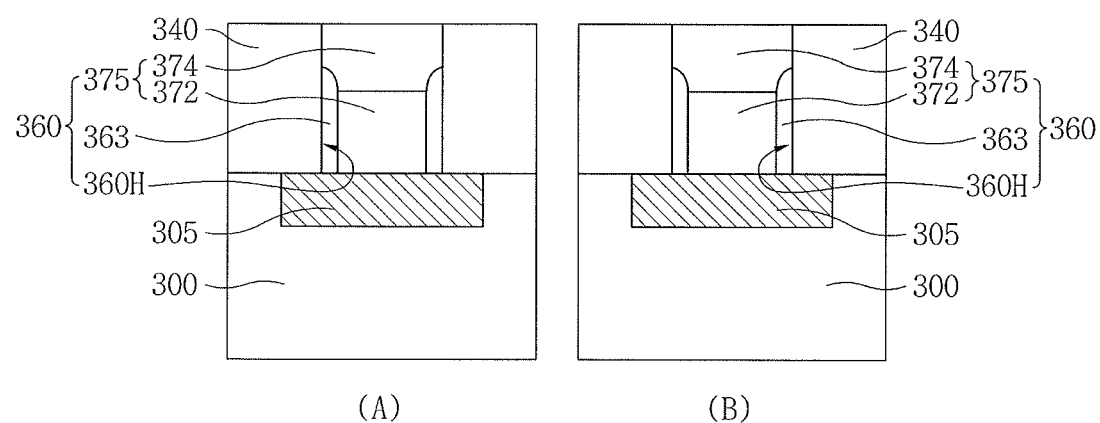

Referring to FIG. 15D, the method of forming the contact structure according to the embodiment of the inventive concept may include forming an upper contact plug 374 to completely fill the contact hole 360H. During this process, a contact plug including the lower contact plug 372 and the upper contact plug 374 may be formed.

Figure 15E:
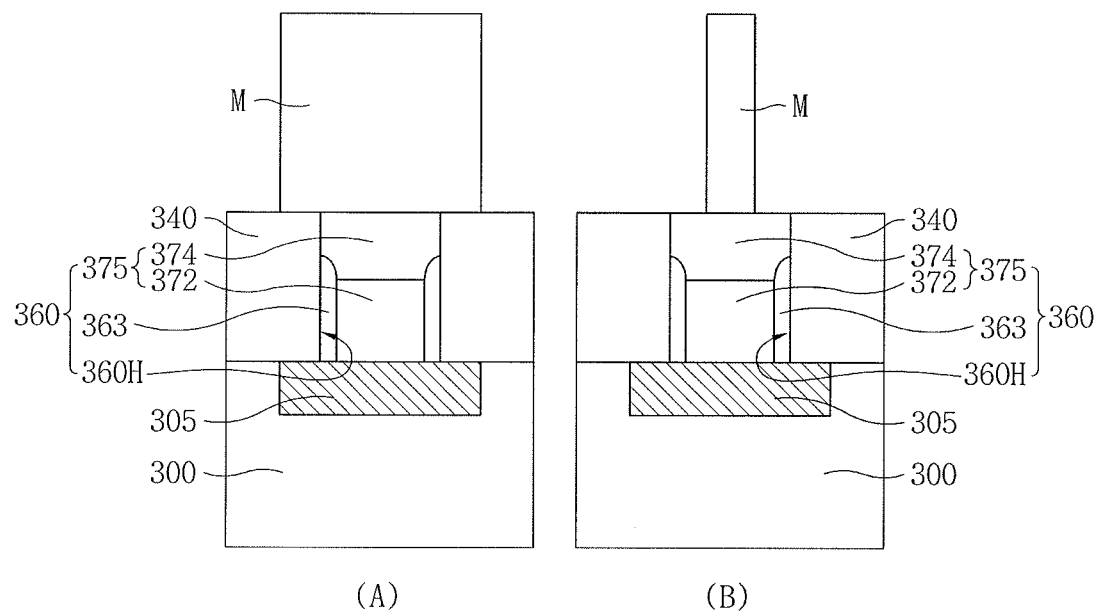

Referring to FIG. 15E, the method of forming the contact structure according to the embodiment of the inventive concept may include forming a mask pattern M on the upper contact plug 374. The mask pattern M may include silicon nitride or photoresist. The mask pattern M may expose a portion of a top surface of the upper contact plug 374.

Figure 15F:
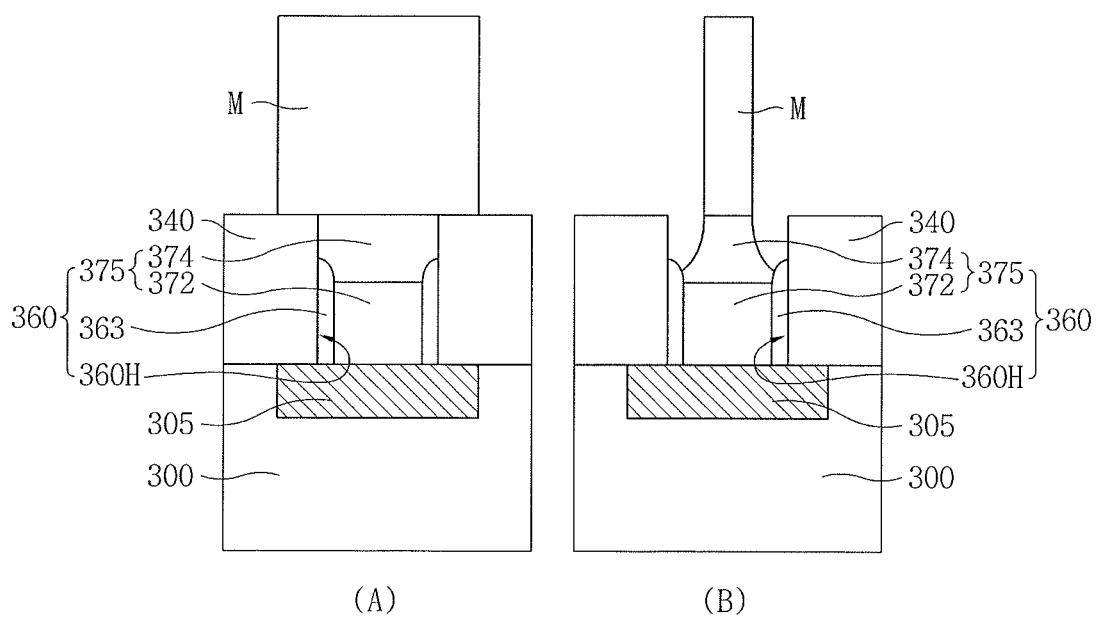

Referring to FIG. 15F, the method of forming the contact structure according to the embodiment of the inventive concept may include removing a portion of the upper contact plug 374 using the mask pattern M as an etch mask. During this process, an upper inner wall of the contact hole 360H and portions of top ends of the lower contact spacers 363 may be exposed. Subsequently the mask pattern M may be removed, and the surface of the upper contact plug 374 may be exposed.

Figure 15G:
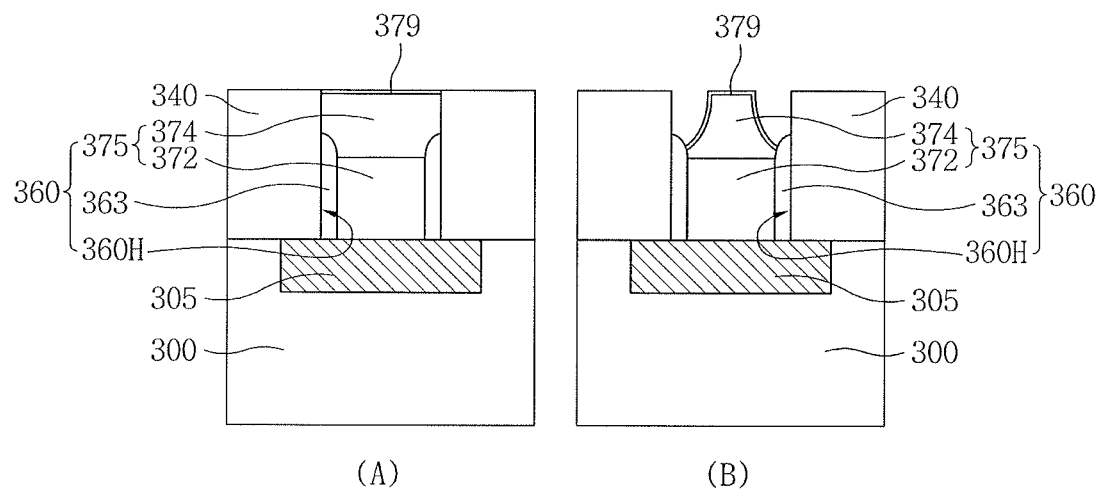

Referring to FIG. 15G, the method of forming the contact structure according to the embodiment of the inventive concept may include forming a surface oxide layer 379 on the exposed surface of the upper contact plug 374.

Figure 15H:
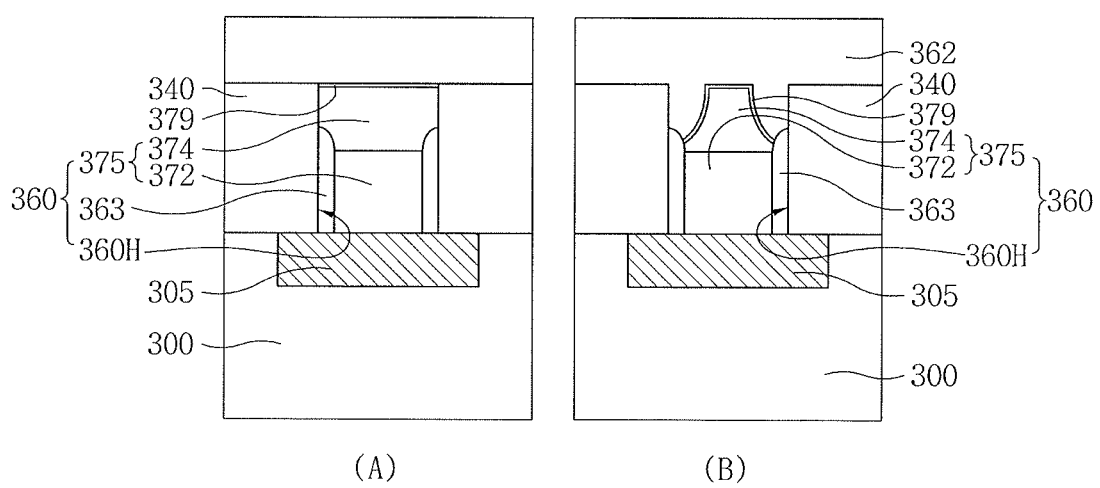

Referring to FIG. 15H, the method of forming the contact structure according to the embodiment of the inventive concept may include forming an upper contact spacer material layer 362. The upper contact spacer material layer 362 may completely fill the contact hole 360H.

Figure 15I:
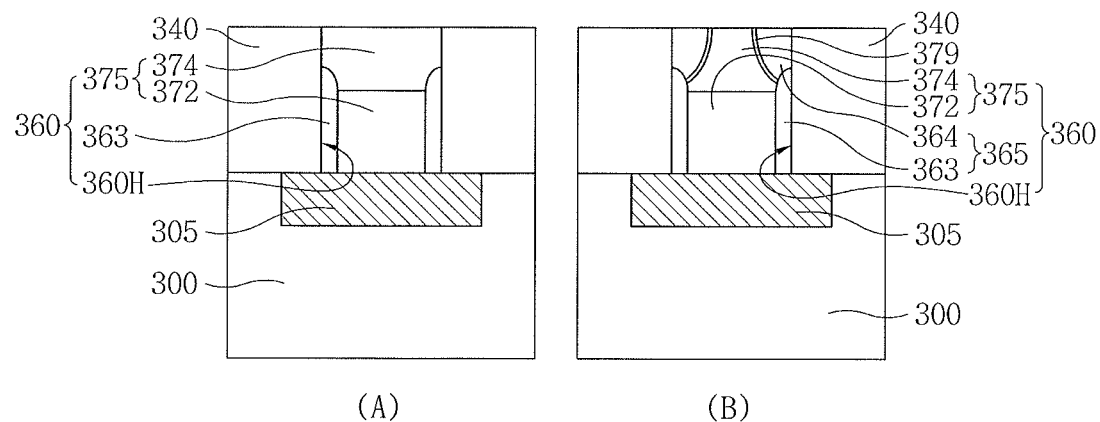

Referring to FIG. 15I, the method of forming the contact structure according to the embodiment of the inventive concept may include forming upper contact spacers 364. The formation of the upper contact spacers 364 may include etching back the upper contact spacer material layer 362. During this process, the surface oxide layer 379 may be removed from the top surface of the upper contact plug 374 to expose the top surface of the upper contact plug 374.

Figure 15J:
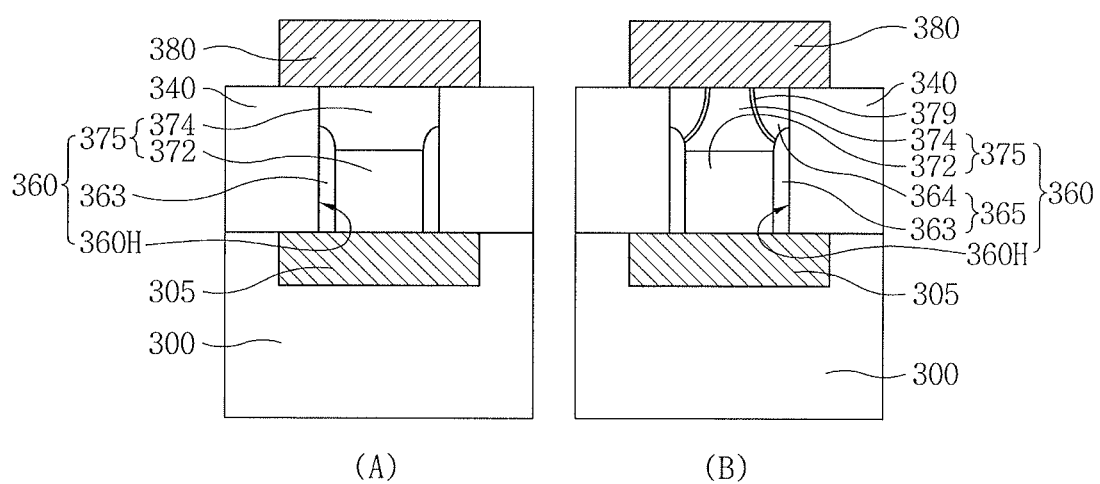

Referring to FIG. 15J, the method of forming the contact structure according to the embodiment of the inventive concept may include forming an upper conductive material 380 on the upper contact plug 374. The upper conductive material 380 may be formed in a pad or line shape. FIG. 15J exemplarily illustrates that the upper conductive material 380 has a pad shape. The upper conductive material 380 may include doped silicon, a metal silicide, or a metal.

Afterwards, referring back to FIG. 14A, the method of forming the contact structure according to the embodiment of the inventive concept may include forming a passivation layer 385 to cover the interlayer insulating layer 340 and the upper conductive material 380. The passivation layer 385 may include an insulating material, such as silicon oxide.

Figure 16A:
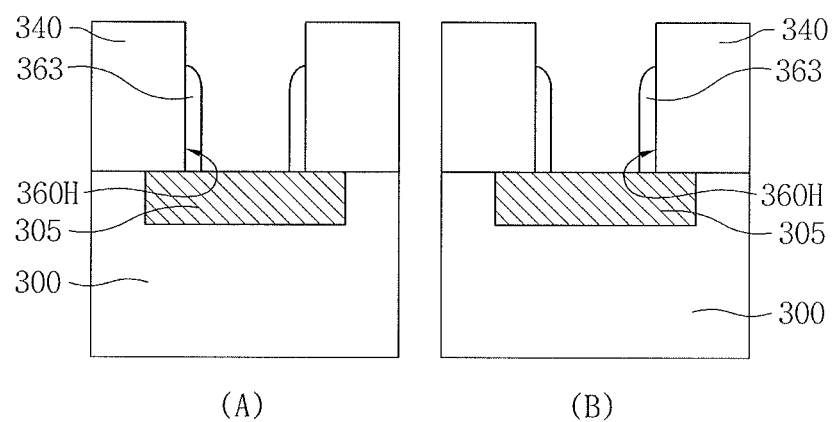
FIGS. 16A and 16B illustrate longitudinal sectional views of a method of forming a contact structure according to an embodiment of the inventive concept, which are taken along directions V-V' and VI-VI' of FIG. 13.
Figure 16B:
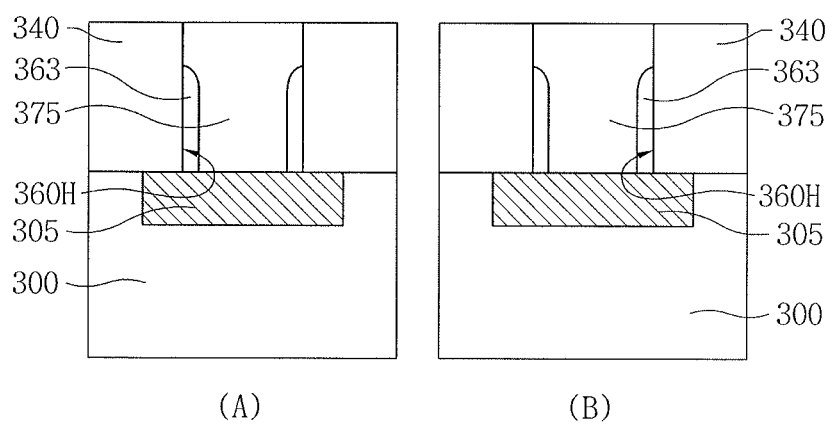

FIGS. 16A and 16B illustrate longitudinal sectional views illustrating a method of forming a contact structure according to an embodiment of the inventive concept, which are taken along directions V-V' and VI-VI' of FIG. 13. Referring to FIG. 16A and referring back to FIGS. 14B and 15A, the method of forming the contact structure according to the embodiment of the inventive concept may include forming a lower conductive material 305 in an under layer 300, forming an interlayer insulating layer 340 having a contact hole 360H to expose a portion of a top surface of the lower conductive material 305, and forming lower contact spacers 363 on lower inner walls of the contact hole 360H.

Referring to FIG. 16B, the method of forming the contact structure according to the embodiment of the inventive concept may include forming a contact plug to fill the contact hole 360H.

Thereafter, referring back to FIGS. 14B and 15A through 15J, a mask pattern may be formed on the contact structure 360, and a portion of the contact structure 360 may be removed using the mask pattern as an etch mask to expose upper inner walls of the contact hole 360H and portions of top surfaces of the lower contact spacers 363. The mask pattern may be removed to expose the surface of the contact structure 360, a surface oxide layer 379 may be formed on the exposed surface of the contact structure 360, and an upper contact spacer material layer 362 may be formed to completely fill the contact hole 360H. The upper contact spacer material layer 362 may be etched back, thereby forming upper contact spacers 364 to expose a top surface of the upper contact plug 374. An upper conductive material 380 may be formed on the upper contact plug 374, and a passivation layer 385 may be formed to cover the interlayer insulating layer 374 and the upper conductive material 380.

In the contact structure according to the embodiments of the inventive concept, the contact plug may be in direct contact with the inner walls of the contact hole 360H from a sectional view taken in the first direction. For example, the upper contact spacers 364 may not be seen. Accordingly, an upper portion of the contact plug may have a greater horizontal width than a lower portion thereof.

In the contact structure according to the embodiments of the inventive concept, the contact structure may not be in direct contact with the contact hole 360H from a sectional view taken in a second direction. For example, the lower contact spacers 363 and/or the upper contact spacers 364 may be interposed between the contact plug and the inner walls of the contact hole 360H. A portion of a side surface of the contact plug may taper in a forward (+) direction. For example, the contact plug may have a narrow upper portion and a wide middle portion. Inner side surfaces of the upper contact spacers 364 may taper in a reverse (−) direction. For example, the upper contact spacers 364 may have a lower portion with a small horizontal thickness and an upper portion with a large horizontal thickness.

A top end of a contact spacer 365 according to an embodiment of the inventive concept may be disposed at a relatively low level in a first direction and disposed at a relatively high level in a second direction.

In the contact structure according to the embodiment of the inventive concept, a top end of the lower contact spacer 363 may be disposed at a highest level in the first direction, and a top end of the upper contact spacer 364 may be disposed at a highest level in the second direction.

Figure 17:
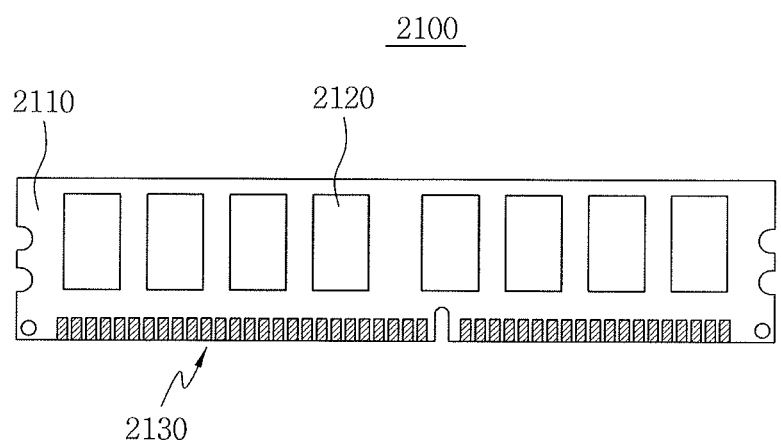
FIGS. 17 and 18 illustrate conceptual diagrams of modules including at least one semiconductor device according to an embodiment of the inventive concept.

FIG. 17 illustrates a conceptual diagram of a memory module 2100 including at least one of semiconductor devices 10 and 20 according to various embodiments of the inventive concept. Referring to FIG. 17, the memory module 2100 may include a memory module substrate 2110 and a plurality of memory devices 2120 and a plurality of terminals 2130 disposed on the memory module substrate 2110. The memory module substrate 2110 may include a printed circuit board (PCB) or a wafer. Each of the memory devices 2120 may be one of the semiconductor devices 10 and 20 according to various embodiments of the inventive concept, or a semiconductor package including one of the semiconductor devices 10 and 20. The plurality of terminals 2130 may include a conductive metal. Each of the terminals 2130 may be electrically connected to the corresponding one of the memory devices 2120. Since the memory devices 2120 of the memory module 2100 cause a low leakage current and have excellent on/off current characteristics, module performance may be improved.

Figure 18:
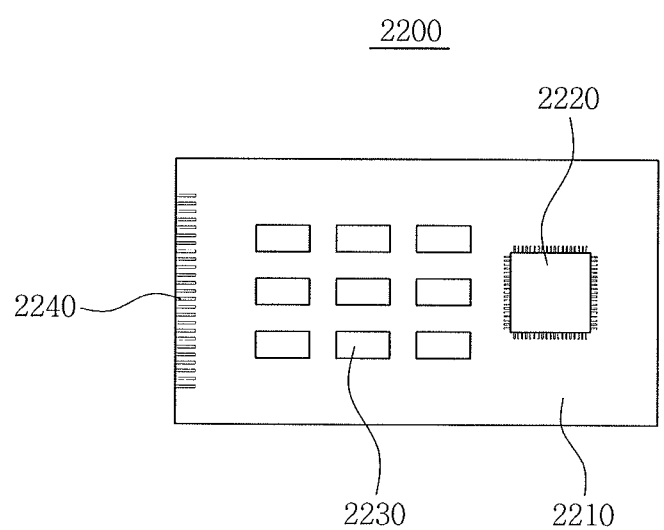

FIG. 18 illustrates a conceptual diagram of a semiconductor module 2200 including at least one of semiconductor devices 10 and 20 according to various embodiments of the inventive concept. Referring to FIG. 18, a semiconductor module 2200 according to an embodiment of the inventive concept may include one semiconductor device 2230 of the semiconductor devices 10 and 20 according to various embodiments of the inventive concept, which may be mounted on a semiconductor module substrate 2210. The semiconductor module 2200 may further include a microprocessor (MP) 2220 mounted on the semiconductor module substrate 2210. Input/output (I/O) terminals 2240 may be disposed on at least one side of the module substrate 2210.

Figure 19:
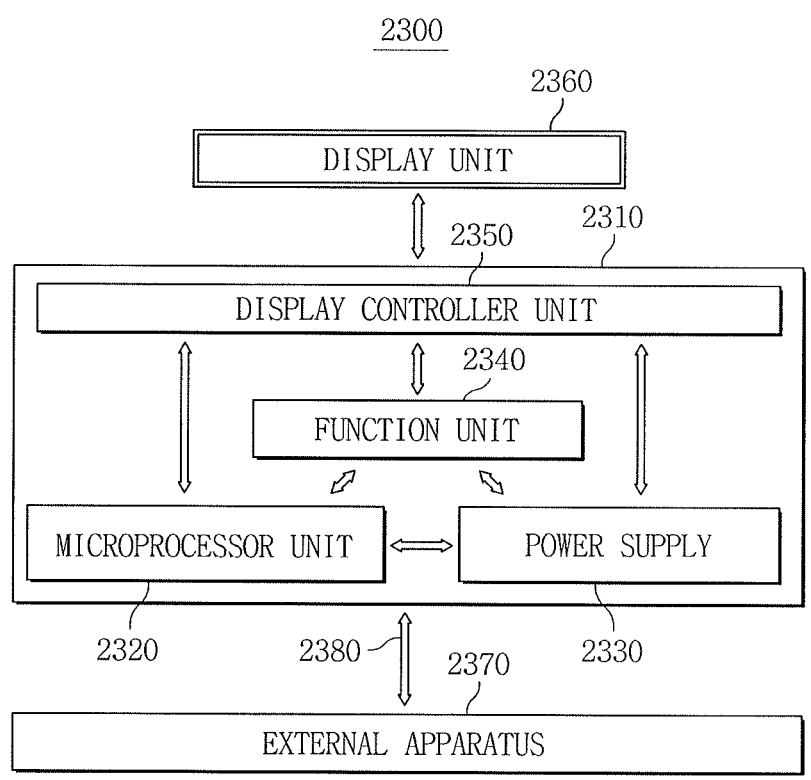
FIGS. 19 and 20 illustrate conceptual block diagrams of electronic systems including at least one semiconductor device according to an embodiment of the inventive concept.

FIG. 19 illustrates a conceptual block diagram of an electronic system 2300 including at least one of semiconductor devices 10 and 20 according to various embodiments of the inventive concept. Referring to FIG. 19, the semiconductor devices 10 and 20 according to various embodiments of the inventive concept may be applied to the electronic system 2300. The electronic system 2300 may include a body 2310. The body 2310 may include an MP unit 2320, a power unit 2330, a function unit 2340, and/or a display controller unit 2350. The body 2310 may be a system board or mother board having a PCB. The MP unit 2320, the power unit 2330, the function unit 2340, and the display controller unit 2350 may be mounted on the body 2310. A display unit 2360 may be disposed on a top surface of the body 2310 or outside the body 2310. For example, the display unit 2360 may be disposed on a surface of the body 2310 and display an image processed by the display controller unit 2350. The power unit 2330 may receive a predetermined voltage from an external power source, divide the predetermined voltage into various voltage levels, and transmit the divided voltages to the MP unit 2320, the function unit 2340, and the display controller unit 2350. The MP unit 2320 may receive a voltage from the power unit 2330 and control the function unit 2340 and the display unit 2360. The function unit 2340 may implement various functions of the electronic system 2300. For instance, when the electronic system 2300 is a mobile electronic product, such as a portable phone, the function unit 2340 may include several elements capable of wireless communication functions, such as output of an image to the display unit 2360 or output of a voice to a speaker, by dialing or communication with an external apparatus 2370. When the function unit 2340 includes a camera, the function unit 2340 may serve as an image processor. In another embodiment, when the electronic system 2300 is connected to a memory card to increase the capacity of the electronic system 2300, the function unit 2340 may be a memory card controller. The function unit 2340 may exchange signals with the external apparatus 2370 through a wired or wireless communication unit 2380. In addition, when the electronic system 2300 needs a universal serial bus (USB) to expand functions thereof, the function unit 2340 may serve as an interface controller. Semiconductor devices described in various embodiments of the inventive concept may be included in at least one of the MP unit 2320 and the function unit 2340.

Figure 20:
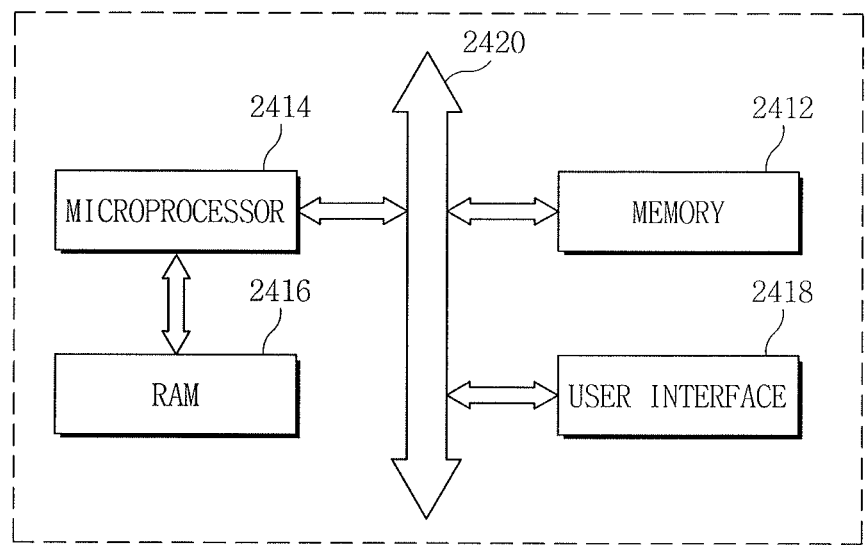

FIG. 20 illustrates a schematic block diagram of another electronic system 2400 including at least one of semiconductor devices 10 and 20 according to various embodiments of the inventive concept. Referring to FIG. 20, the electronic system 2400 may include at least one of the semiconductor devices 10 and 20 according to various embodiments of the inventive concept. The electronic system 2400 may be used to fabricate a mobile device or computer. For example, the electronic system 2400 may include a memory system 2412, an MP 2414, a random access memory (RAM) 2416, and a user interface 2418 configured to communicate data using a bus 2420. The MP 2414 may program and control the electronic system 2400. The RAM 2416 may be used as an operation memory of the MP 2414. For instance, the MP 2414 or the RAM 2416 may include at least one of electrode connection structures according to embodiments of the inventive concept. The MP 2414, the RAM 2416, and/or other elements may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include a controller and a memory.

Figure 21:
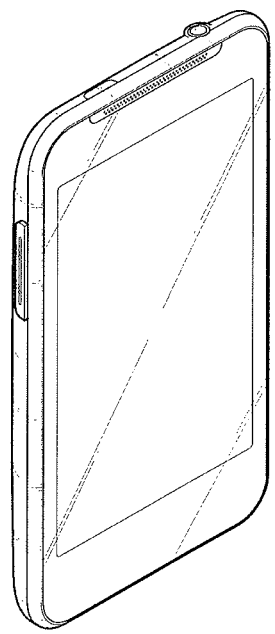
FIG. 21 illustrates a schematic diagram of a mobile wireless phone including at least one semiconductor device according to an embodiment of the inventive concept.

FIG. 21 illustrates a schematic diagram of a mobile wireless phone 2500 including at least one of semiconductor devices 10 and 20 according to various embodiments of the inventive concept. The mobile wireless phone 2500 may be interpreted as a tablet personal computer (PC). Furthermore, at least one of the semiconductor devices 10 and 20 according to various embodiments of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

According to example embodiments, the upper spacer surrounding the upper portion of the contact plug may be only partially formed, i.e., the upper spacer may have a reduced size and the upper portion of the contact plug may have an increased width, so resistance of the DC plug may be reduced and the DC plug may be capped with an insulating material and electrically insulated from an adjacent storage contact plug. That is, since a DC structure according to various embodiments of the inventive concept has a wide upper portion, resistance of the DC structure can be reduced. Contact resistance between the DC structure according to the various embodiments of the inventive concept and a bit line pattern can be reduced. Furthermore, the DC structure according to various embodiments of the inventive concept can be stably and electrically insulated from other adjacent contact plugs.

In contrast, a conventional spacer formed on a side surface of a DC plug to prevent occurrence of an electric short between the DC plug and an adjacent pad pattern or buried contact (BC) plug, e.g., in 6F2 DRAM technology, may cover the entire surface of the DC plug. As such, the conventional spacer may reduce a sectional area, e.g., width, of the DC plug and increase resistance of the DC plug.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an interlayer insulating layer on a substrate; and
   a direct contact (DC) structure vertically penetrating the interlayer insulating layer and contacting the substrate, the DC structure including:
   a DC hole recessing a top surface of the substrate,
   an insulating DC spacer on an inner wall of the DC hole, and
   a conductive DC plug on the DC spacer and filling the DC hole, the DC plug including a lower DC plug and an upper DC plug on the lower DC plug, the lower DC plug having a smaller horizontal width than that of the upper DC plug.

2. The device as claimed in claim 1, wherein the lower DC plug has a same horizontal width as the upper DC plug in a first direction, and the lower DC plug has a smaller horizontal width than the upper DC plug in a second direction different from the first direction.

3. The device as claimed in claim 1, wherein the upper DC plug has a lower portion wider than an upper portion.

4. The device as claimed in claim 3, wherein the lower and upper portions of the upper DC plug have a same horizontal width in a first direction.

5. The device as claimed in claim 1, wherein a side surface of the upper DC plug tapers in a forward direction.

6. The device as claimed in claim 1, wherein the DC spacer includes:
   a lower DC spacer on a lower inner wall of the DC hole; and
   an upper DC spacer on an upper inner wall of the DC hole, the upper DC spacer having a smaller lower horizontal thickness than an upper horizontal thickness.

7. The device as claimed in claim 1, wherein an inner side surface of an upper portion of the DC spacer tapers in a reverse direction.

8. The device as claimed in claim 1, wherein the DC plug is confined within the DC hole.

9. The device as claimed in claim 1, further comprising:
   an active region and a field region in the substrate, the field region defining the active region; and
   two gate patterns in the substrate across the active region and the field region, the DC plug being in contact with the active region between the two gate patterns.

10. The device as claimed in claim 9, further comprising a conductive landing pad and an insulating fence interposed between the substrate and the interlayer insulating layer, the landing pad being on the active region, and the fence being on the field region.

11. The device as claimed in claim 10, further comprising a storage contact plug configured to contact the landing pad, the storage contact plug being in direct contact with the DC spacer.

12. The device as claimed in claim 11, wherein a top surface of the landing pad in contact with the storage contact plug is recessed.

13. The device as claimed in claim 1, further comprising a bit line pattern on the DC structure, the bit line pattern including:
   a bit line barrier layer directly contacting the upper DC plug,
   a bit line electrode on the bit line barrier layer, and
   a bit line capping layer on the bit line electrode, one side surface of the bit line barrier layer and one side surface of the bit line electrode being vertically aligned with one side surface of an uppermost portion of the upper DC plug.

14. The device as claimed in claim 13, wherein the bit line pattern further comprises a bit line spacer configured to surround side surfaces of the bit line barrier layer, the bit line electrode, and the bit line capping layer, the device further comprising a dent in the direction of the DC hole at a position where the bit line spacer meets the DC spacer.

15. A semiconductor device, comprising:
   an active region and a field region in a substrate, the field region defining the active region;
   two gate patterns in the substrate across the active region and the field region;
   an interlayer insulating layer on the substrate; and
   a direct contact (DC) structure vertically penetrating the interlayer insulating layer and contacting the active region between the gate patterns, the DC structure including:
   a DC hole configured to recess top surfaces of the active region and the field region disposed in the substrate, an upper portion of the field region exposed by a lower inner wall of the DC hole,
   a DC spacer formed on the inner wall of the DC hole and configured to contact an upper portion of the field region exposed by the inner wall of the DC hole; and
   a conductive DC plug confined within the DC hole and formed on the DC spacer, the DC plug having a lower horizontal width smaller than an upper horizontal width.

16. A semiconductor device, comprising:
   an interlayer insulating layer on a substrate; and
   a direct contact (DC) structure vertically penetrating the interlayer insulating layer and contacting the substrate, the DC structure including:
   a DC hole recessing a top surface of the substrate,
   an insulating DC spacer only on a first portion of an inner wall of the DC hole, and
   a conductive DC plug filling the DC hole, the insulating DC spacer being between the conductive DC plug and the first portion of the inner wall, and the conductive DC plug directly contacting a second portion of the inner wall different from the first portion of the inner wall.

17. The device as claimed in claim 16, wherein a lower portion of the conductive DC plug has a smaller horizontal width than an upper portion of the conductive DC plug.

18. The device as claimed in claim 17, wherein the insulating DC spacer separates the entire lower portion of the conductive DC plug from the inner wall of the DC hole, and separates only a portion of the upper portion of the conductive DC plug from the inner wall of the DC hole.

19. The device as claimed in claim 17, wherein the lower portion of the conductive DC plug has a same horizontal width as the upper portion of the conductive DC plug in a first direction, and the lower portion of the conductive DC plug has a smaller horizontal width than the upper portion of the conductive DC plug in a second direction different from the first direction.

20. The device as claimed in claim 16, wherein the insulating DC spacer surrounds the entire perimeter of a lower portion of the DC hole, and only a portion of the perimeter of an upper portion of the DC hole.

* * * * *